United States Patent
Harer et al.

(10) Patent No.: US 7,130,783 B1
(45) Date of Patent: Oct. 31, 2006

(54) SIMULATION-BASED FUNCTIONAL VERIFICATION OF MICROCIRCUIT DESIGNS

(75) Inventors: Kevin M. Harer, Beaverton, OR (US); Pei-Hsin Ho, Portland, OR (US); Robert F Damiano, Lake Oswego, OR (US)

(73) Assignee: Synopsys, Inc., Mountain View, CA (US)

( * ) Notice: Subject to any disclaimer, the term of this patent is extended or adjusted under 35 U.S.C. 154(b) by 627 days.

(21) Appl. No.: 09/760,063

(22) Filed: Jan. 12, 2001

(51) Int. Cl.
  G06F 9/44 (2006.01)
  G06F 17/50 (2006.01)
  G06F 11/22 (2006.01)

(52) U.S. Cl. .................. 703/13; 717/104; 717/106; 716/4

(58) Field of Classification Search .............. 703/13, 703/14; 716/5, 4; 717/106, 104
See application file for complete search history.

(56) References Cited

U.S. PATENT DOCUMENTS

| | | | | |
|---|---|---|---|---|
| 4,698,587 | A * | 10/1987 | Burns et al. ............... | 324/765 |
| 5,600,579 | A * | 2/1997 | Steinmetz, Jr. ............ | 703/13 |
| 5,680,322 | A * | 10/1997 | Shinoda .................... | 714/18 |
| 5,983,182 | A * | 11/1999 | Moore ....................... | 704/270 |
| 6,102,959 | A * | 8/2000 | Hardin et al. .............. | 703/2 |
| 6,829,753 | B1 * | 12/2004 | Lee et al. ................... | 716/5 |

OTHER PUBLICATIONS

Ho-P.H. et al. "Smart Simulation using Collaborative Formal and Simulation Engines". IEEE (Nov. 9, 2000). CAD conference.p. 120-126.*

Harer-K. Design and Maintenance Specification for CTG Reachability & Control Subsystem. Version 1.0 (Feb. 14, 2000). p. 1-50.*

Bertacco-V. et al. "Cycle-based Symbolic Simulation of Gate-level Synchronous Circuits" ACM (1999) p. 1-6.*

Harer-K., "Design and Maiintenance Specification for CTG Reachability & Control Subsystems" version 1.0 Feb. 14, 2000 p. 1-50.*

Devadas, S., et al., "Design Verification and Reachability Analysis Using Algebraic Manipulation," Proc. of IEEE Inter. Conference on Computer Design: VLSI in Computers & Processors, Cambridge, MA, Oct. 14-16, 1991, pp. 250-258.*

Hopcroft, J., and Pansiot, J.-J., "On the Reachability Problem for 5-Dimensional Vector Addition Systems," Theoretical Computer Science, No. 8, 1979, pp. 135-159.*

(Continued)

*Primary Examiner*—Paul L. Rodriguez
*Assistant Examiner*—Tom Stevens
(74) *Attorney, Agent, or Firm*—Jonathan T. Kaplan

(57) ABSTRACT

System, methods, and apparatus for verifying microcircuit designs by interleaving between random and formal simulation techniques to identify input traces useful for driving designs under test into sequences of device states. In a method aspect the invention provides process for beginning random simulation of a sequence of states of a microcircuit design by inputting a sequence of random input vectors to a design under test model in order to obtain a sequence of random simulation states; monitoring a simulation coverage progress metric to determine a preference for switching from random simulation to formal methods of simulating states in the design under test; beginning formal simulation of states in the design under test and monitoring a formal coverage progress metric to determine a preference for resuming random simulation of states of said microcircuit design; and resuming random simulation. Preferably the process of interleaving simulation methods continues until an input vector suitable for driving the design under test model into each of a set of previously-identified goal states has been obtained.

36 Claims, 10 Drawing Sheets

OTHER PUBLICATIONS

Cho, H., et al., "A Structural Approach to State Space Decomposition for Approximate Reachability Analysis", IEEE International Conference on Computer Design: VLSI in Computers and Processors, Cambridge, MA, Oct. 10-12, 1994, pp. 236-239.*

M. Kantrowitz and L. Noack. I'm Done Simulating; Now what? Verification Coverage Analysis and Correctness Checking of the DECchip 21164 Alpha microprocessor. Proceedings of 33rd DAC, 1996. pp. 325-330.

* cited by examiner

330 ── If (phase is MODE_INIT_SYM)
    331 ── If (search found 0 goals)
        332 ⎰ If (satCycMax>0)
                   set phase to MODE_SAT
            ⎱ Else
                   Set phase to MODE_SYMSIM
            ⎧ Endif
            ⎪ Set non-init-phase VCS stop conditions \
            ⎪        & freshness using $configStopPointHV
        333 ⎨ push hv_vcs_stopped on VCS cmd stack
            ⎪ set VCS engine state to "running"
            ⎩ tell VCS to run
    335 ── Else
            ⎧ Push hv_vcs_replay_done on VCS cmd stack
        336 ⎨ Tell VCS to bias weights
            ⎩ Tell VCS to replay a trace
        338 ⎰ Set VCS engine state to "running"
            ⎱ Tell VCS to run (do the replay)
    Endif
340 ──Elseif (phase is MODE_INIT_SAT)
    341 ── If (search found 0 goals)
            ⎧ If (symsimCycMax>0)
            ⎪     set phase MODE_INIT_SYM
        342 ⎨ Else
            ⎩     set phase MODE_SAT
            ⎧ Endif
        343 ⎨ If (phase is MODE_INIT_SYM)
            ⎪     Call hv_run_formal
            ⎩ Else
            ⎧ Set non-init-phase VCS stop conditions \
            ⎪        & freshness using $configStopPointHV
        344 ⎨ push hv_vcs_replay_stopped on VCS cmd stack
            ⎪ set VCS engine state to "running"
            ⎩ tell VCS to run
    345 ── Else
            ⎧ Push hv_vcs_replay_done on VCS cmd stack
        346 ⎨ Tell VCS to bias weights
            ⎩ Tell VCS to replay a trace
        348 ⎰ Set VCS engine state to "running"
            ⎱ Tell VCS to run (do the replay)
    Endif

Fig. 7A

350 ——— Elseif (phase is MODE_SAT, MODE_SYMSIM_SAT, MODE_SYMSIM)
    If (search found 0 goals)
        352 ⎰ If (phase is MODE_SAT)
            ⎱    If (symsimCycMax>0)
                  set phase MODE_SYMSIM_SAT
              Endif
        353 ⎰ Elseif (phase is MODE_SYMSIM_SAT)
            ⎱    If (lastFormalEng was SAT)
                  Set phase to MODE_SYMSIM
            Endif
    355 ——— If (#consecMisses > formalMissThresh)
        Push hv_vcs_stopped on VCS stack
        Set #consecMisses to 0
    356 ——— Tell VCS to reset
    357 ———Elseif (lastFormalEng was SYMSIM)
        Push hv_vcs_replay_done on VCS stack
        Tell VCS not to bias weights
    358 ——— Tell VCS to replay a trace
    359 ——— Else
        Push hv_vcs_stopped on VCS stack
    Endif
Else
    If (#consecHits > formalClearThresh)
    360 ——————— Tell VCS to clear bias weights
    Endif
    If (back2back enabled)
        Push hv_vcs_replay_done_on VCS stack \
            (with BACK2BACK action)
    Else
        Push hv_vcs_replay_done_on VCS stack \
            (with RUN action)
    Endif
    Tell VCS to bias weights
    364 ——— Tell VCS to replay
    Endif
365 ——— Set VCS engine state to "running"
    Tell VCS to run
Endif

Fig. 7B

SIMULATION-BASED FUNCTIONAL VERIFICATION OF MICROCIRCUIT DESIGNS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyrights whatsoever.

BACKGROUND OF THE INVENTION

The invention relates to systems and methods for verifying the design of digital microcircuits. Such digital microcircuits are now commonplace, and are used in a wide variety of applications, from desktop computers to television controls and common appliances to controllers for machinery, sophisticated weapons systems, and supercomputers. The digital microcircuit design to be tested shall be referred to as the design under test (DUT).

More particularly, the present invention relates to systems and methods applied to a high-level DUT model with the purpose of generating test data that, when applied to a simulation of the DUT, achieves high levels of DUT coverage and therefore has a high likelihood of finding any errors in the DUT.

One known approach has been the use of random input generators to provide input sequences to randomly "drive" the DUT model through the "state space" of possible input and internal register combinations, in the hope of feeding the model a sufficient variety of input combinations to make it possible to identify any errors in the design of DUT. Such methods provide for relatively deep penetration of the space of possible states, but do not provide acceptably broad coverage. This difficulty is aggravated by the observed tendency of even sophisticated random input generators to provide identical or very similar input sequences, or otherwise produce identical or similar DUT register states, on a repeated basis.

Other attempts have involved the use of exhaustive formal search methods. Such methods provide potentially complete coverage of the state space, but for even moderately complex DUTs the state space is so large that time and resource limits preclude the exclusive use of such methods from being effective.

The effect of prior art analysis methods are shown schematically in FIG. 1a. State space 20, which represents in two-dimensional form the space of possible input and register states of the DUT, comprises a plurality of goal states 11 and a start state 10, which typically represents the reset state for the DUT. Trace 15 represents the path through the state space followed by the DUT model in being driven by randomly-generated inputs. Trace 15 wanders relatively deeply through the state space, but without breadth and without apparent direction, and loops back over itself or near to itself at points 23. Trace 15 has intersected two goal states 13 and missed many others. Step traces 31 represent state sequences simulated in the DUT by means of formal methods. Traces 31 have covered a relatively broad but shallow region of the state space, and have located both goal states 13 located within the coverage region.

In speaking of circuit verification by computer simulation, it is useful to define several terms. A goal or coverage state is any state which is desired to be reached under test conditions to provide adequate coverage of the DUT. Typically there exist a number of tasks a circuit is designed to do, and a number of things that are recognized as undesirable for the circuit to do—that is, there exist a number of circuit states which it is desirable or undesirable for the circuit to assume. Usually a set or record of such desirable and undesirable states is maintained and used as a basis for coverage measurement and for analysis of the quality of testing. While most generally a goal state completely defines the complete register contents of the DUT, a goal state definition may specify only a subset of the register bits, and therefore specifies a boolean hyper-cube of specific states.

A formal simulation method is any method used to systematically—as opposed to randomly—simulate different states of a DUT. In particular, formal simulation methods include formal reachability methods. Formal reachability methods, in the context of this application, include any exhaustive or other mathematical techniques for finding input assignments for causing a state machine, or a state machine model, to transition from a starting state to some other state. Examples of formal simulation methods include symbolic simulation and SAT bounded model checking techniques, as disclosed herein.

BRIEF SUMMARY OF THE INVENTION

The invention provides system, methods, and apparatus for verifying microcircuit designs by interleaving between random and formal simulation techniques to identify input traces useful for driving DUT models through a set of goal states.

In one aspect the invention provides a method of determining an input sequence for verifying a design for a microcircuit. The method comprises beginning random simulation of a sequence of states of a microcircuit design by inputting a sequence of random input vectors to a DUT model in order to obtain a sequence of random simulation states; monitoring a simulation coverage progress metric to determine a preference for switching from random simulation to formal methods of simulating states in the DUT; beginning formal simulation of states in the DUT model and monitoring a formal coverage progress metric to determine a preference for resuming random simulation of states of said microcircuit design; and resuming random simulation.

Preferably the DUT model used by the formal and random simulation methods are the same, or at least highly compatible, in order to save modeling and computation time.

In preferred methods according to the invention the process of switching from random to formal analysis methods and back again, or "interleaving", is continued until inputs usable for driving the DUT model into each of a set of previously-defined goal states have been identified.

Preferred formal methods for use with the invention comprise symbolic simulation and satisfiability techniques. These methods are used both singly and in combination in practicing the invention. One of the particular improvements offered by the invention is to start formal analysis from a DUT model state identified by random simulation, instead of a reset or other arbitrary state. This promotes "deep" coverage of the state space.

The interleaving process is one of the most advantageous aspects of the invention. By switching back and forth between formal and random simulation methods, and particularly from states identified through random simulation, both broad and deep coverage of the DUT state space may be obtained and an improved confidence in coverage of the DUT gained.

The effect of the interleaving process of the invention in improving coverage of the DUT state space is illustrated schematically in FIGS. 1b and 1c. State space 20 represents in two-dimensional form the space of possible input and register states of the DUT, and comprises a plurality of goal states 11 and a start state 10 which typically represents the reset state for the DUT. Trace 15 represents the path through the state space followed by the DUT model in being driven by randomly-generated inputs. Trace 15 wanders relatively deeply from initial state 10 through the state space, but without breadth and without apparent direction, and loops back over itself or near to itself at points 23. In the case shown in FIG. 1b trace 15 has intersected two goal states 13, but after striking goal state 17 has failed to locate any others. After simulating from goal state 17 to point or state 19 random simulation is stopped and formal simulation begun from last-reached state 19. Steps 31 represent state sequences simulated in the DUT by means of formal simulation. Eventually the formal method intersects goal state 18 and random simulation is resumed. Second random trace 15' identifies additional goal states 22 before proceeding fruitlessly to trace end 19', at which point formal simulation is resumed, eventually to identify goal state 18'. The interleaving process is preferably repeated, and provides both breadth and depth in searching state space 20 for goal states. An alternative interleaving process is shown in FIG. 1c. In FIG. 1c random simulation is resumed from last-reached goal states 17 and 17' instead of from ends 19 and 19' of traces 15 and 15'.

Additional aspects of the invention comprise optional starting (or re-starting) of the random simulation process, during the interleaving process, through the use of a trace generated by formal simulation; and starting of formal simulation from a state generated by random simulation.

Optionally the invention further comprises using formal methods to prove one or more goals states of the DUT to be unreachable, in order to maximize efficiency and avoid the use of CPU and memory resources in searching for input vectors to states which cannot be reached. Generally this is accomplished by passing information generated by the unreachability engines to formal reachability engines.

In other aspects the invention provides such methods as performed by data processing systems, data processing systems for performing such methods, and computer program products comprising computer usable media having computer readable code embodied therein for causing computers to perform such methods.

It is important to note that except insofar as a particular order of steps of any method or process described herein is inherent, or it is otherwise stated expressly that any given combination of steps must be completed in a given order, no order to the steps of any method or process described herein is implied or required.

BRIEF DESCRIPTION OF THE DRAWINGS

The invention is illustrated in the figures of the accompanying drawings which are meant to be exemplary and not limiting.

FIG. 7 is a pseudocode representation of a process for controlling interleaving between analysis methods according to the invention.

BRIEF DESCRIPTION OF THE PRINTED APPENDICES

The accompanying printed appendices, which are incorporated as a part of this specification, illustrate several aspects and embodiments of the invention, and together with the description serve to explain the principles of the invention.

Appendix 1 (50 pp.) is entitled "Design and Maintenance Specification for CTG Reachability & Control Subsystems" and describes a preferred embodiment of a data processing system adapted to perform verification simulation processes according to the invention.

Appendix 3 (7 pp.) is entitled "Smart Simulation Using Collaborative Formal and Simulation Engines," by Pei-Hsin Ho et al. and describes a method of performing unreachability analyses.

DETAILED DESCRIPTION OF THE PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

Figure 2A:
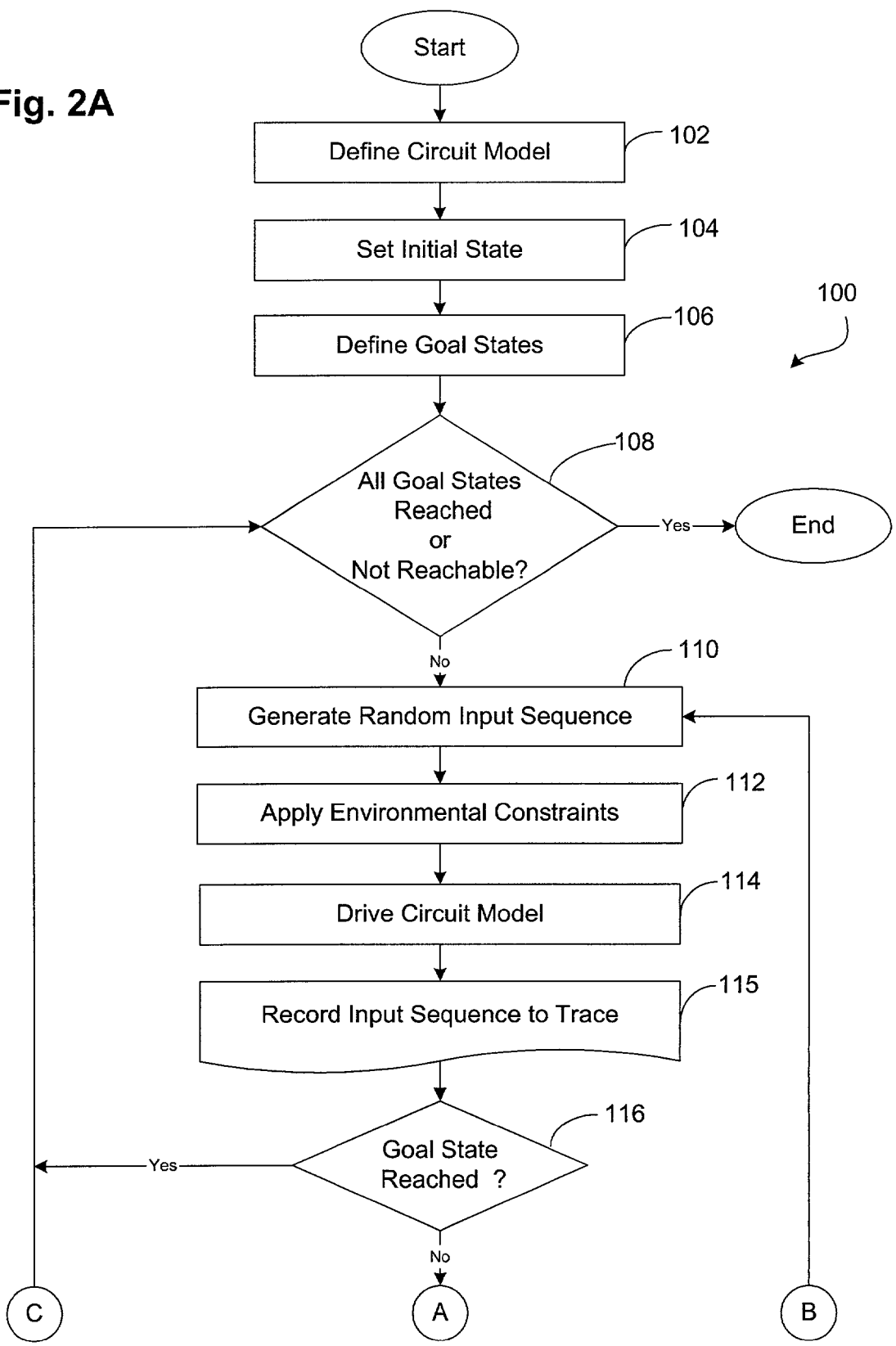
FIG. 2 is a schematic representation of a preferred process for simulation-based functional verification of microcircuit designs according to the invention.
Figure 2B:
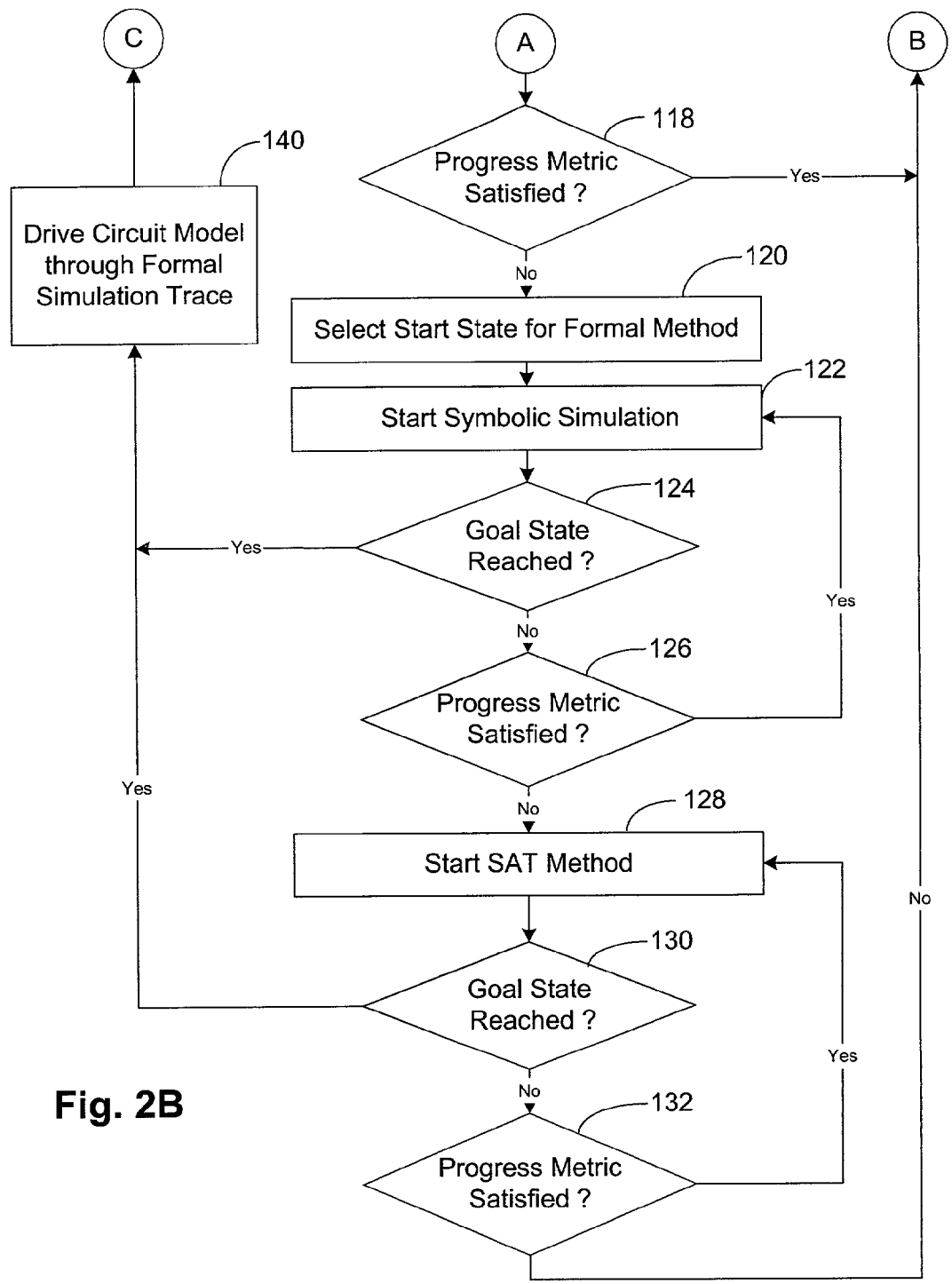

FIG. 2 illustrates a preferred process 100 for verification of a microcircuit design according to the invention. At 102 a model of the circuit (the DUT model) is defined, and at 104 an initial state is applied to the model so that the circuit is "driven" into a model of the design in a selected initial state. It is useful in many instances to model the inputs for this initial state so that their application to the DUT model results in the model being driven into a design reset state for the circuit, so that the model is completely defined in a valid, useful starting state. However, many other suitable starting states are also possible and suitable, depending upon the particular analysis tools to be used. A set of one or more goal states for the design is defined at 106. It is also useful in many circumstances, such as will be plain to those of ordinary skill in the art, that in many cases the use of separate but parallel DUT models for one or more of the various formal search processes will be preferable and more efficient.

Depending upon the requirements of a particular analysis or test situation, it may be advantageous to generate either a single DUT model for use in all simulation processes, or a plurality of such models, for example one for each distinct random and formal simulation method. The factors involved in deciding how many DUT models to make, and of what type, are matters well within the ability of the designer or analyst skilled in the art.

At 108 a process of checking to see whether all goal states have been reached (or, in cases in which unreachability analyses are used, have been either reached or identified as unreachable) is started. On the initial pass no goal states have either been reached or proved not reachable, and random analysis is started. An initial step in this process is the generation at 110 of a random input sequence for the design model. In many cases this input sequence takes the form of a vector.

At 112 the random input sequence is mapped to a form which can be considered valid within the operating environment expected to be experienced by the DUT. In general, when a circuit is designed it is anticipated that the circuit will operate in an environment in which certain things can be expected to happen, while certain other things will be expected not to happen. For example, a microprocessor might be expected to comply with a known bus protocol, or to receive or to not receive certain types of input from top level programs, etc. It is generally advantageous to acknowledge this and increase the efficiency of the analysis by ensuring that only valid inputs are applied to the design model.

At 114 the input sequence generated at 110 is applied to the simulated circuit model and the state of the model under such input is determined. This is referred to as "driving" the circuit model. At 115 the input sequence used to drive the model is recorded in the vector trace set. This input set or vector trace generally comprises all inputs required to reproduce the goal state simulation in the DUT model, and ultimately all goal states reached by the simulation verification process. In many cases is it convenient and efficient to record each state into which the circuit model is driven, regardless of whether the state is a goal state or not. This is one certain way of ensuring that each state reached by the circuit model during simulation may be recreated during later DUT testing. In other circumstances it may be advantageous to record input traces only when goal states have been reached.

At 116 the state result obtained by driving the circuit model with the random input sequence is checked against the set of goal states defined at 106. If the state is a goal state, then the fact that that state has been reached is recorded and the record of goal states is checked at 108 to determine whether all goal states have been reached. If all goal states have been reached, the trace capable of driving the circuit model into each of the goal states is ready for further use, most typically for verification of the DUT. If all goal states have not been reached, then the random simulation process resumes at 110.

If the state reached by driving the design model at 114 with the random input sequence generated at 110 is not a goal state, a simulation coverage progress metric is evaluated at 118 to determine whether sufficient progress towards identifying coverage states is being made. If the simulation coverage progress metric is not satisfied, random simulation is stopped and formal analysis is initiated. If the simulation coverage progress metric has been satisfied, then random simulation is resumed from 110.

A great many simulation coverage progress metrics are suitable for use with the processes disclosed herein. A simple but highly effective class of simulation coverage progress metrics comprises simple monitoring of loop counters. For example, one preferred method for determining when to switch to formal methods is to count the number of times the random simulation process has been applied without identifying inputs for a goal state, and to switch to formal simulation methods when the process has failed a certain number of times. This is readily accomplished by setting a counter to an initial value on starting the random analysis process, resetting the counter each time a goal state is reached, and incrementing or decrementing the counter each time the path from 110 and 118 is covered without identifying a goal state. When a predetermined number of random simulation attempts to drive the model into a goal state have failed, random analysis is stopped and formal analysis is initiated. This serves to prevent the inefficient use of resources such as CPU time and memory.

A second highly useful class of simulation coverage progress metrics includes those based on the relative distinctiveness, or "freshness," of the state or set of states most recently induced in the DUT model. For example, one of the most useful variations in this class is that in which a percentage of times that the random input process has induced a given complete or partial state in the circuit model is monitored, and in which when (or if) such percentage exceeds a predetermined value random simulation is halted and analysis is shifted to formal methods. This can be particularly useful given the observed tendency of many random input generation algorithms to provide repetitive or substantially repetitive output over a series of generation cycles. One of the most beneficial manners in which to implement this type of simulation coverage progress metric is to monitor only selected state variables within the circuit model (that is, a "cube", or group of states).

It is also beneficial in some circumstances to avoid the rote application of simulation coverage progress metrics, by temporarily suppressing or ignoring them, or by using them in combination to create hybrid metrics. For example, it is sometimes useful to suppress loop counters or other counting means for determining coverage progress and to allow the random process to continue for additional time if a relatively "fresh" state has been induced in the circuit model. This helps to assure a suitable minimum level of exploration once fresh states have been reached.

When a simulation coverage progress metric has not been satisfied, random simulation is stopped and formal methods are initiated. Typically the last state reached by simulation is used as a start state for formal methods, although other states (such as the last goal state reached) may be used. Thus the process continues at 120 with selection of a start state for use in initiating formal analysis. This start state is made available for use in formal analysis.

Many formal analysis methods suitable for use with the invention are known. Two formal analysis methods that are particularly suitable for use with the invention are those known as (a) symbolic simulation and (b) satisfiability ("SAT") techniques, particularly SAT techniques used in conjunction with bounded model checking (BMC) techniques. As used separately, both symbolic simulation and SAT techniques are well known. Each has its own advantages and disadvantages. Preferably both methods are used, so that their strengths can be exploited to the greatest possible degree.

Symbolic simulation techniques suitable for use with the processes disclosed herein are described in "Symbolic-Simulation—Techniques and Applications," by R. E. Bryant, in Proceedings of DAC, pp. 517–521, 1990; "Test Pattern Generation for Sequential MOS Circuits by Symbolic Fault Simulation", by K. Cho and R. E. Bryant, in Proceeings of DAC, pp. 418–423, 1989; and "Cycle-based Symbolic Simulation of Gate-Level Synchronous Circuits" by V. Bertacco, M. Damiani and S. Quer, in Proceedings of DAC, pp 391–396, 1999, each of which is herein incorporated by reference. SAT techniques suitable for use with the processes disclosed herein are described in "Symbolic Model Checking Using SAT Proceedures" by A. Biere, A. Cimatti, E. Clarke, M. Fujita, and Y. Zhu, in Proceedings of DAC, 1999; and "Verifying Safety Properties of a PowerPC Microprocessor Using Symbolic Model Checking without BDDs", by A. Biere, E. Clarke, R. Raimi, and Y. Zhu, in Proceedings of CAV, 1999, each of which is herein incorporated by reference.

FIG. 2 illustrates the case in which symbolic simulation is selected as the initial formal method. Optionally, satisfiability or other techniques may be used as the initial formal method. Symbolic simulation is initiated at 122. Symbolic simulation drives each primary input of the design model with a new symbolic variable at each simulation step, each simulation step corresponding to a selected number of modeled clock cycles, the number of cycles selected being dependent upon the design being modeled and the manner in which it has been modeled. A symbolic formula is generated for each signal or state variable, according to the logic in the signal's or state variable's fanin. Signal and state variable values are recorded as Binary Decision Diagrams (BDDs).

Given a starting state, as selected at 120, symbolic simulation steps through simulated time to reach in "i" number of steps any new coverage states within "i" steps of the starting state. After each step the state variables are checked at 124 to determine whether a new goal state has been reached by substituting the coverage signals in a BDD representation of an unreached goal state with the coverage signals generated by the symbolic simulation process. If the state is a goal state, then the fact that that state has been reached is recorded and the set of inputs for the model required to produce the goal state result (i.e., the "trace" which produces that result) is used at 140 to drive the design model into the goal state. This input set is also preferably recorded in the vector trace set. The record of goal states is then checked at 108 to determine whether all goal states have been reached. If they have, a set of traces capable of driving the circuit model into each of the goal states is recorded for further use, most typically as the design under test is refined. If all goal states have not been reached, the random simulation process is resumed at 110.

If the state reached by driving the design model at 122 with symbolic simulation is not a goal state, the current status of the analysis is evaluated at 126 to determine whether any one of a set of one or more formal coverage progress metrics has not been satisfied. If the formal coverage progress metric has not been satisfied, symbolic simulation is stopped and SAT bounded model checking is initiated at 128. If the formal coverage progress metric has been satisfied, the symbolic simulation process is repeated from 122.

Preferred formal coverage progress metrics for use with symbolic simulation include limits selected by the circuit designer on CPU or other calculation time and/or available memory or recording resources. Again, the major disadvantage to using systematic formal methods to test the entire design is that the evaluation of even a modest modern design requires the use of large amounts of time and resources, and therefore makes the sole use of such methods expensive, and generally inconvenient. For most designers time and analysis resources such as computer time and memory are limited. Typically, then, formal methods are used only to locate, if possible, a new coverage state from which to resume random analysis, within explicit CPU and memory limit constraints.

SAT analysis is initiated at 128. Given a particular starting state, SAT is used to search for new goal states within a given number of analysis steps. SAT uses Boolean representations of portions or preferably all of the circuit model, each representation being modeled as a function f(x), and searches for assignments for state variables x, f(a), such that f(a)=1, f(a)=1 being defined so as to correspond to a goal state. When a goal state has been reached, then the fact that that state has been reached is recorded and the set of inputs for the model required to produce the goal state result (i.e., the "trace" which produces that result) is used at 140 to drive the design model into the goal state. This input set is also preferably recorded in the vector trace set. The record of goal states is then checked at 108 to determine whether all goal states 130 have been reached. If they have, a set of traces capable of driving the circuit model into each of the goal states is recorded for further use, most typically as the design under test is refined. If all goal states have not been reached, the random simulation process is resumed at 110.

If the state reached by driving the design model at 128 through a single step of SAT simulation is not a goal state, the current status of the analysis is evaluated at 132 to determine whether any one of a set of one or more formal coverage progress metrics has been satisfied. If any one or more of the formal coverage progress metrics has not been satisfied, SAT simulation is stopped and random simulation is resumed at 110. If the formal coverage progress metric has been satisfied, the SAT simulation process is repeated from 128.

Preferred formal coverage progress metrics for use with SAT analysis include limits selected by the circuit designer on CPU or other calculation time and/or available memory or recording resources. Such limits are suggested by, for example, test schedules and the nature of available computational resources. Again, the major disadvantage to using SAT methods to test the entire design is that the evaluation of even a modest modern design requires the use of large amounts of time and resources, and therefore makes the use of such methods expensive and generally inconvenient. For most designers, time and analysis resources such as computer time and memory are limited. Typically, then, they are used only to locate a new coverage state from which to resume random analysis, within explicit CPU and memory limit constraints.

In general random simulation may be seen as an effective tool for simulating through long traces, that is, through relatively large numbers of time steps; but is weak at developing or investigating the existence of possible states within any definite specified numbers of time steps, at which formal methods excel. Of the formal methods, symbolic simulation is most effective with designs having fewer input variables, and is capable of searching effectively for goal states over medium-length traces. SAT methods are most effective at exhaustively searching through short traces.

Process 100 proceeds through the steps described, interleaving between random and formal simulation techniques and back again, until it is determined at 108 that each of the goal states defined at 106 has been reached, at which point a set of input traces suitable for driving the design model into each of the goal states has been recorded. This trace record is used in further evaluating the DUT, particularly where design revisions are ongoing and it is desired to ensure that subsequently revised designs function as intended.

Figure 3:
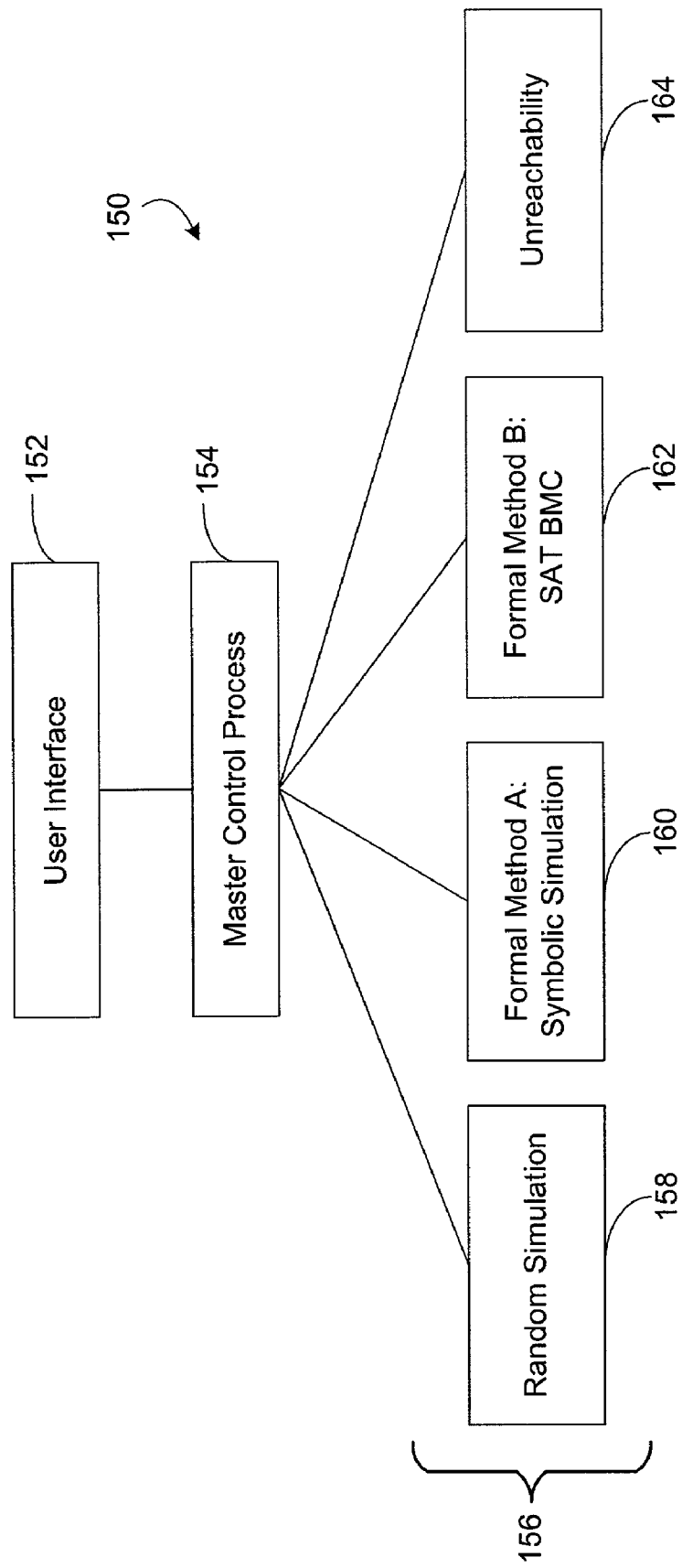
FIG. 3 is schematic diagram of a program structure for implementing on a computer system a simulation-based functional verification process according to the invention.

FIG. 3 is a schematic diagram of a program structure for implementing on a computer system a verification simulation process according to the invention, as for example the process shown schematically in FIG. 2. System 150 comprises user interface 152, master control process 154, and slave processes 156, which comprise random simulation module 158, symbolic simulation module 160, SAT BMC module 162, and unreachability module 164. User interface 152, master control process 154, and slave processes 156 comprise either separate, stand-alone programs or modules forming a single program, depending upon the needs and convenience of the circuit designer and analyst for the particular problem at hand. A particular advantage offered by implementing the user interface, master process, and slave processes as separate programs or program modules for the various analysis components is that the concurrent operation of separate program functions is facilitated. For example, as described herein it is often advantageous to provide an unreachability module to quickly determine a large number of unreachable states, the identities of which may be used to increase the efficiency of the random and formal simulation modules. It has been found to be advantageous to execute the unreachability module simultaneously with the simulation modules. This can be accomplished, for example, through time-sharing or parallel processing techniques.

User interface 152 is provided in any one of a wide variety of forms, but is typically a general purpose operating system, adapted for interactive use (although batch processing is also useful for some applications). In general, user interface 152 facilitates employment by the user of whatever decision making and control processes are required for completion of the analysis at hand, and is responsible for presentation to the user of data received from or through the master control process. Input from and output to the interface can be graphics or text-based, depending upon the needs and convenience of the user. An example of an operating system suitable for adaptation for use with computer-implemented processes according to the invention is UNIX.

Master control process 154 coordinates and controls the operations of slave processes which perform the bulk of the verification simulation. In addition, heuristics adapted to assist the user in selecting various random and formal simulation processes during the analysis are incorporated within or made available to the master control process. Preferably the master process facilitates the concurrent or sequential operation of the slave processes, so as to maximize the efficiency of the simulation effort. Preferred master processes also continually monitor input and output messages and commands from slave and user interface modules.

Slave processes 156 represent various reachability and optionally unreachability modules (sometimes called engines), each preferably run as a separate process. Each of the slave processes uses specialized algorithms to search for sequences of inputs which drive the DUT from one state to another in a search for goal states (or, in the case of unreachability engines, to prove various goal states unreachable), and each is adapted to receive input commands from the master process and to report progress and various control flag conditions to the master control process. A suitable means for transfer of input commands and for reporting of output to and from the slave processes is through an operating system such as UNIX. Slave processes 156 comprise random simulation module 158, symbolic simulation module 160, SAT simulation module 162, and unreachability module 164.

Random simulation module 158 comprises a biased, constrained, random input generator adapted to drive the circuit model through its state space in an attempt to identify input patterns which reach goal states. It has the ability to generate start states for searches performed by formal search modules, to apply to the DUT model sequences of inputs which are generated by the formal engines, and to save the entire vector trace set for later use in validating the DUT. A number of random simulation programs suitable for use as random simulation module 158 are available commercially, for example the VCS Verilog simulator, available commercially from Synopsys, Inc., of Mountain View, Calif.

It is characteristic of the invention and of the embodiments thereof described herein that they are well suited for integration with and use of a number of pre-programmed analysis programs and modules available commercially from a number of companies and sources. For example, ModelSim of Mentor Graphics, Verilog-XL and NC Verilog of Cadence, and Scirocco of Synopsis are well suited for use in the analysis processes and systems decribed herein.

Symbolic simulation module 160 uses symbolic techniques as discussed herein to attempt to reach goals from a given starting state. If a goal is identified, the engine saves a sequence of inputs which are replayed by the random simulation module to prove that the state has been reached.

SAT module 162 uses bounded model checking concepts, together with classic satisfiability techniques, to reach goals from any given starting state. If successful, the engine saves a sequence of inputs which are replayed by the random simulation module to prove that the state has been reached.

Unreachability module 164 uses any of various formal techniques to prove that certain goal states are not reachable from a given start state. The start state which is most often of greatest interest is the reset state of the DUT. States shown to be unreachable are then optionally communicated to the random and formal simulation modules to reduce the size and complexity of the search problem. A preferred method for unreachability analysis employs symbolic fixed point computation techniques, in which the unreachability engine computes an approximate fixed point for reachable states, then inverts the fixed point as a proof of unreachable states.

The fixed point computation is typically overreached. Stated another way, fixed point symbolic image computation computes the set of states that can be reached in one clock cycle from a given starting state, iterating systematically through clock cycle steps until no new states are added. Analytic techniques suitable for use in unreachability analyses according to this aspect of the invention are described in "Formal Verification of Pipeline Control Using Control Token Nets and Abstraction Interpretation," by Pei-Hsin Ho, Adrian J. Isles, and Timothy Kam, in ICCAD 1998, pp. 529–536, ICCAD, 1998. This document is herein incorporated in full, by this reference. An alternative method for unreachability analysis, in addition to that shown in the foregoing incorporated reference, is described in Appendix 3.

After the unreachability analysis is completed the master control process is provided a set of states proved unreachable and these states are removed from the list of outstanding goal states sought by reachability engines.

Figure 4:
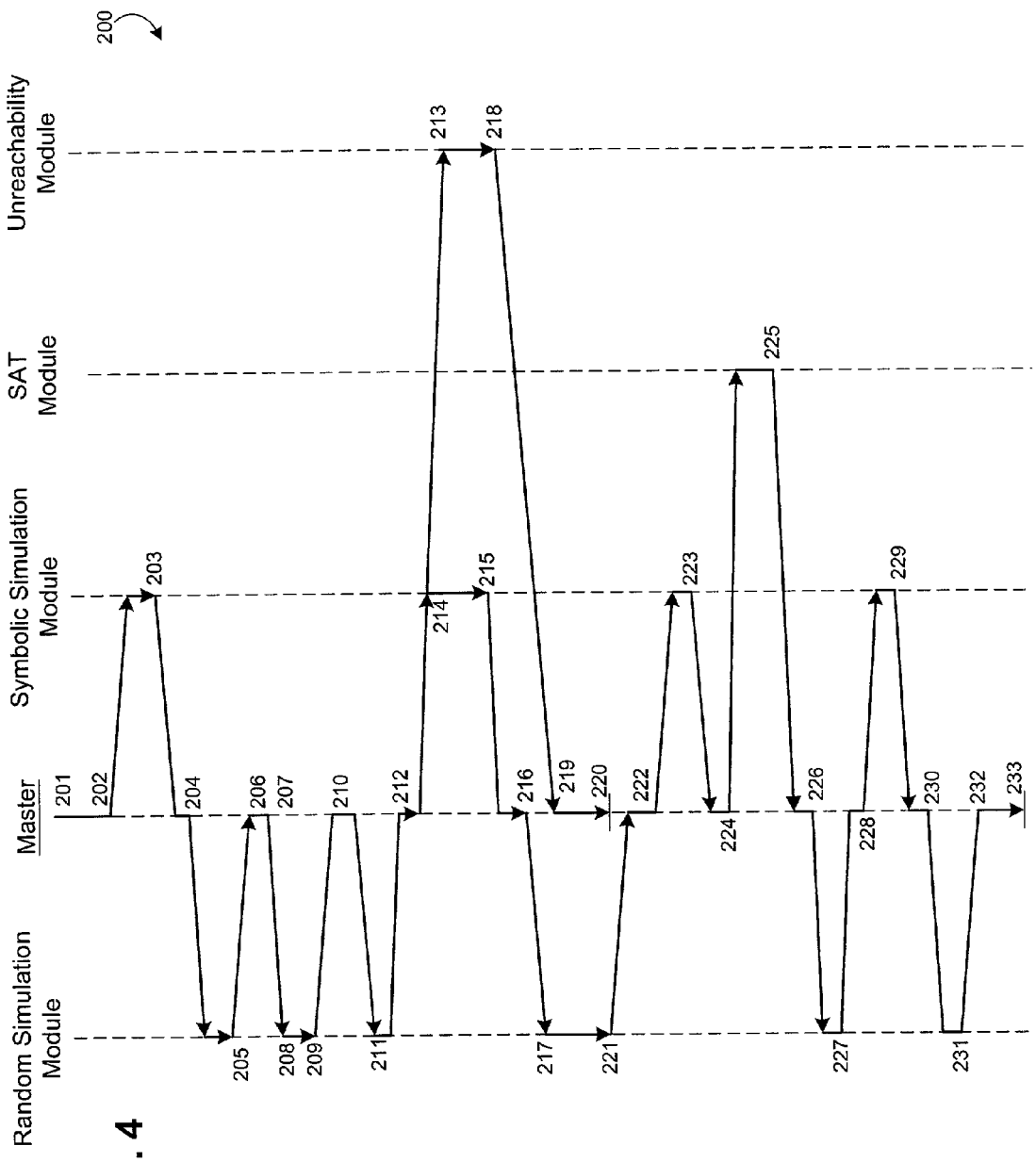
FIG. 4 is a schematic representation of control flow of a preferred process according to the invention as executed by a suitable data processing system.

FIG. 4 illustrates a representative control flow of a preferred process according to the invention as executed by a suitable digital computer system, such as the system depicted schematically in FIG. 3. To clarify discussion, process 200 is illustrated without showing user interaction processes such as those which might be received via user interface 152 in FIG. 3 to structure or control the simulation process.

Figure 1A:
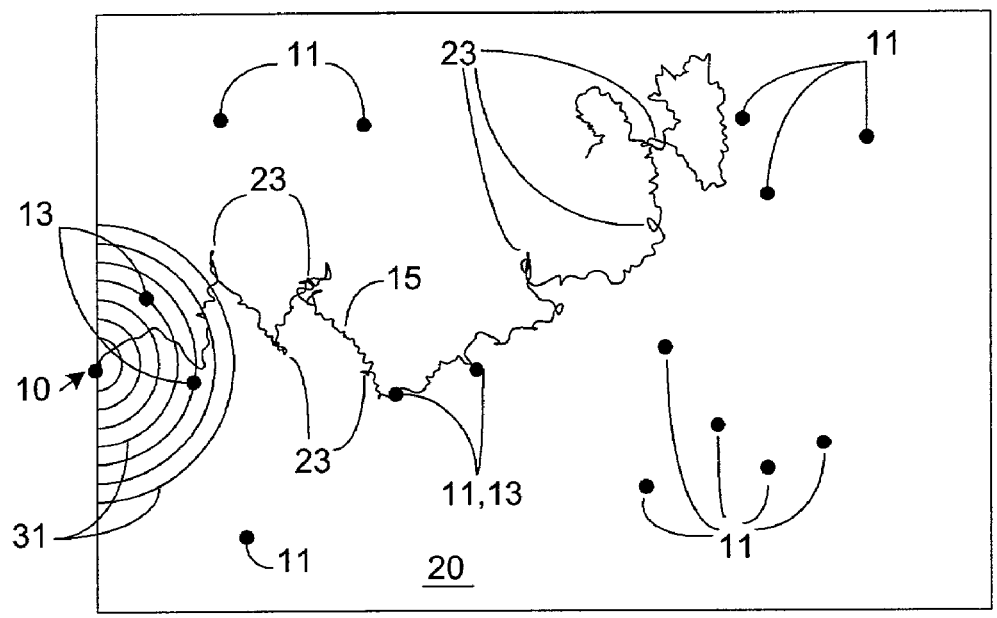
FIG. 1a is a schematic diagram of prior art simulation techniques.
Figure 1B:
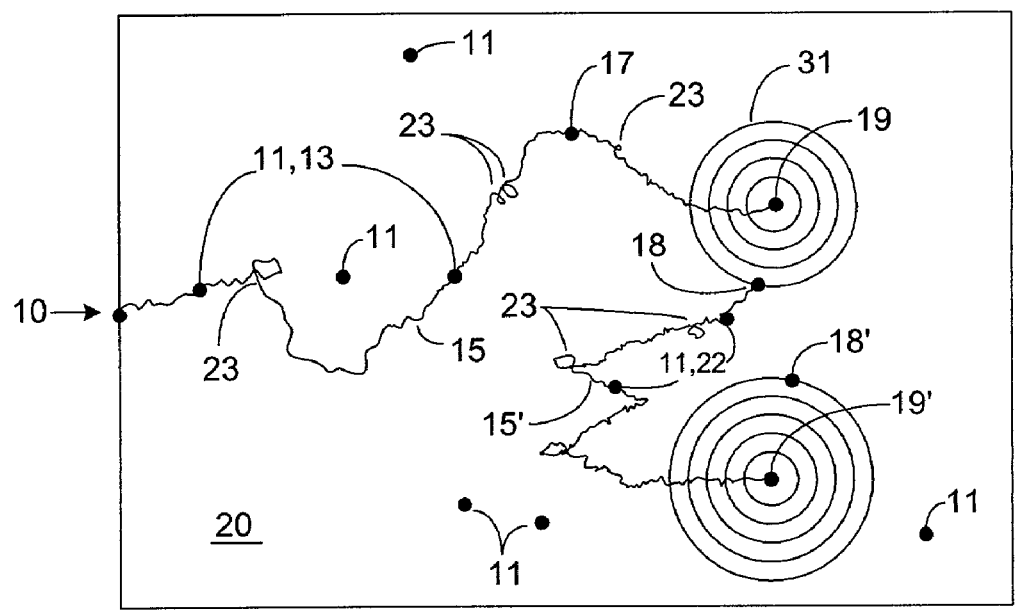
FIG. 1b is a schematic diagram of a preferred interleaved simulation techniques according to the invention.
Figure 1C:
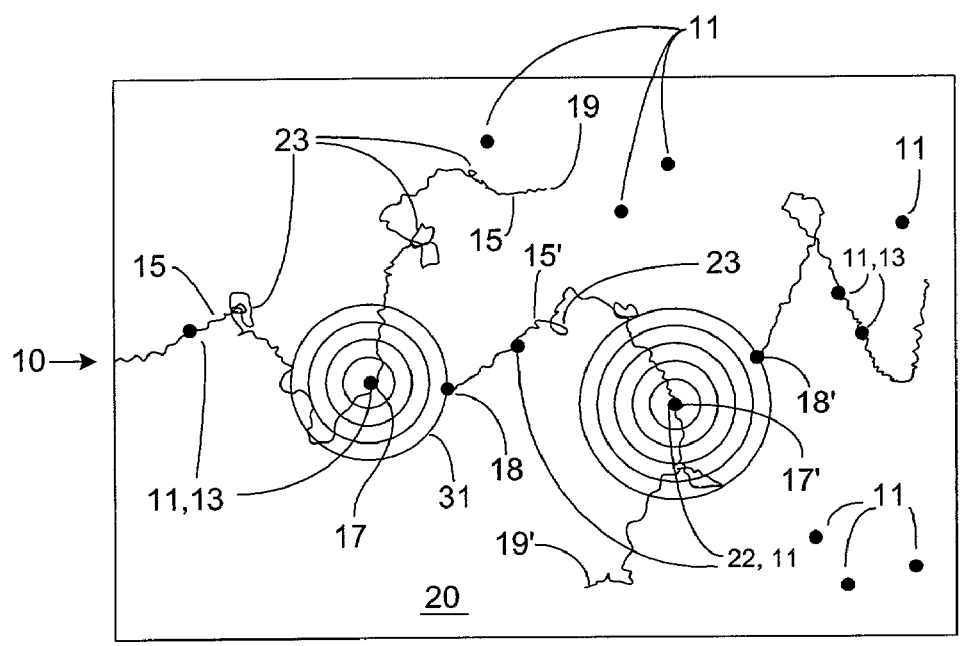
FIG. 1c is a schematic diagram of alternative preferred interleaved simulation techniques according to the invention.

The process illustrated in FIG. 4 is generally similar to that illustrated in FIG. 1, except that an optional unreachability algorithm is used to improve the efficiency of the process and to broaden coverage of the DUT state space by proving a large number of potential states unreachable. This information, passed to and used by the formal analysis module, increases the efficiency of the formal search.

Process 200 of FIG. 4 begins at 201 with invocation of the master control process by a user, via the user interface. The master control process first loads the DUT model and a set of goal states.

At 202 the master control process provides instructions to initialize the symbolic 110 simulation module. At 203 the symbolic simulation module reports readiness to the master control program and stops pending receipt of further instructions.

At 204 the master process starts the random simulation module. The random simulation engine is initialized and loads goal states, performs a reset sequence to drive the DUT model into the reset state, and then performs a number of random input simulation cycles. As described above the random analysis simulator monitors the reaching of goal states until at 205 a simulation coverage progress metric is no longer satisfied and control is shifted back to the master control process. The current DUT model state, the last goal state reached, or another suitable starting state for initiation of symbolic simulation is written as output by the random simulator for input to the symbolic simulation engine.

At 206 the master control process, on the basis of various heuristics and optionally under interactive control via the user interface, decides how to continue the verification process. It having been observed that it is often beneficial to begin verification with a number of random searches from the reset state, it is decided, at 207 in the example shown, to return to random simulation, and the master control process issues suitable commands.

At 208 the random simulation process resumes. As before, random simulation continues until, at 209, a simulation coverage progress metric is no longer satisfied and control is shifted back to the master control process. Again the current DUT model state, the last goal state reached, or another suitable starting state for symbolic simulation is written as output by the random simulator for input to a formal methods engine.

At 210 the master control process determines heuristically to commence use of formal methods instead of returning to random simulation, and selects in particular symbolic simulation. At 211 random simulation module 158 is instructed to drive the DUT into the reset state; upon reporting of completion of the reset function by the random simulation module at 212 the symbolic simulation module 160 and the unreachability module 164 are instructed by the master control process to load the start state saved at 211 and begin analysis.

At 213 the unreachability module starts. The unreachability module loads the goal state set, then performs a fixed point computation from the start state provided by the random simulation module, in this example the reset state, which is in many cases the most efficient state from which to begin. After the fixed point for the beginning of analysis has been computed, those goals outside the fixed point are proved unreachable. As unreachable states are identified they are written to disk for later use in saving wasted effort by other slave modules. Preferably the unreachability module runs in parallel (as for example by means of parallel processing or time sharing techniques) with the random simulation and formal methods or other reachability processes, in order to provide unreachability data as early as possible and thereby to minimize wasted effort by the other analysis modules.

At 214, concurrently with starting of the unreachability module, a formal search is initiated using the symbolic simulation engine, beginning from the start state identified at 211, in this example again the reset state. At 215 the symbolic simulation module finds a goal state and saves a trace thereto, for use by the random simulation module in driving the DUT model to the state identified, and control is returned to the master control process at 216.

At 216 the master control process instructs the random simulation module to play the trace generated by the symbolic simulation module at 215 and to resume random simulation from that state. At 217 the random simulation engine replays the trace and resumes random searching for and recording of goal states.

At 218, while the random simulation module is searching for and recording identified goal states, the unreachability module completes its analysis and writes to a memory (readable by the other slave processes) a set of unreachable states for future use in maximizing the efficiency of formal methods. At 219–220 the results of the unreachability analysis are used to adjust the list of coverage goals and the global simulation coverage progress metric used to determine when all reachable goal states have been identified, to prevent searching for unreachable goals. When the list has been adjusted, the master control process stops pending further results from the random simulation module. The relative location on the chart of points 218–220, at which the unreachability process ends and results are reported to the master process, for use by the reachability engines, is not fixed. One or more cycles of random simulation and/or either or both formal engines may occur before unreachability results are completed and reported.

At 221 a simulation coverage progress metric is no longer satisfied by the random simulation module and control is returned to the master control process. The current DUT model state, last goal state reached, or other suitable starting state for symbolic simulation is written as output by the random simulator for input to the symbolic simulation engine.

At 222 the master control process instructs the symbolic simulation module to resume, from the state provided at 221 by the random simulation module. Symbolic simulation continues unsuccessfully—that is, without identifying any goal states—until a coverage progress metric is no longer satisfied, and at 223 the master control process is notified.

At 224 the master control process heuristically determines to continue formal searching through the SAT module, and instructs the SAT module to begin from the state provided at 221 by the random simulation module. The SAT simulation process continues until at 225 a goal is reached. A trace for driving the DUT model to the newly-identified goal state is recorded and control is returned to the master process, which at 226 restarts the random simulator, instructing it to replay the trace and resume.

The process of interleaving formal and random simulation methods, for example as depicted between 221 and 226, continues with another random simulation cycle stopping at 227, another symbolic simulation cycle at 228–229, and a repetition of the cycle at 230–231 until at 232 a determination is reached that all goal states have either been reached or are not reachable, upon which a set of traces for driving the DUT to each reachable state is written and at 233 control is returned to the master control process, which informs the user and stops the analysis.

It is important to note that the particular order of random and formal simulation techniques used in the interleaving process is highly flexible and dependent upon the design or analysis task at hand. The interleaving order described above, while useful for many circuit analysis applications, and often times preferred is for purposes of this disclosure exemplary only.

EXAMPLE

A data processing system is configured to perform a verification simulation process according to the above. The system comprises distinct program modules as shown in FIG. 3, including a user interface 152; a master control process 154; and random simulation, symbolic simulation, satisfiability, and unreachability slave processes 158, 160, 162, and 164 respectively. The system and its operation are described in the Design and Maintenance Specification for CTG Reachability & Control Subsystems attached hereto as Appendix 1.

The user interface is interactive and comprises the UNIX operating system, including standard UNIX commands such as "fork' and 'exec'. Commands are issued to the master control process via a UNIX pipe which feeds inputs to the master control process as standard input. The user interface may operate the system in either graphical or textual mode.

Master control process 154 is written in the C programming language, and uses a Task Control Language ("TCL") command interpreter for accepting commands from the user interface process. The master control process is design independent, so that a single master control process may be used in the analysis or verification of a number of different design models.

The Programming Language Interface ("PLI"), which comprises a set of standard techniques and function calls provided by IEEE standard Verilog simulators, is used for several purposes, including the monitoring of goal coverage status; allowing access by the master control process to the state of the DUT model, for downloading to the formal simulation modules; reporting covered goal states; determining and monitoring simulation progress coverage metrics; and tracking the freshness of DUT model states.

Flow control for the simulation process is embodied in TCL procedures. TCL is interpreted by the hybrid verification (sometimes herein "hv") program, which is run in all slave processes (except the random simulation process 158), and in the master control process. This TCL code interacts with the slave processes and the user interface to coordinate all slaves into a coherent simulation verification system. Each slave receives commands from the master control process via the slave's standard input. The slave communicates to the master control process by writing properly formatted text strings to the slave's standard output, or, alternatively, by writing large amounts of data (for example, B.D.D.s generated by the symbolic simulator module) into data files formatted for a specific task.

The random simulation module, sometimes referred to as the "VCS" module, comprises the DUT model, the design environment model (together the design environment model and the DUT model make up the model under test, or the "MUT"), and an upper level control program called CoverBooster. The DUT model, the environment model, and the interface object between them are each specific to the design being verified; the CoverBooster control program is design independent. The DUT model is described in the Verilog HDL and is simulated on a Synopsys product called VCS. The environment model, which serves to generate valid random input vectors for the DUT, is modeled by the user in the VERA Hardware Verification Language (the "Vera language"), and comprises a reset function and a drive function.

A comprehensive explanation of the Verilog HDL language and its capabilities is presented in "IEEE Standard Hardware Description Language Based on the Verilog Hardware Description Language," IEEE Standard 1364–1995, Institute of Electrical and Electronic Engineers, October 1996, which is herein incorporated by reference.

The Vera language is a product of Synopsys, Inc., of Mountain View, Calif.

The CoverBooster program, a Synopsys product written in the Vera language, serves to control the random simulation process by linking with and controlling the DUT, and interfacing the VCS slave process with the rest of the simulation verification system. Under the control of CoverBooster, the drive function in the model environment generates a random input vector which is a valid input for the DUT model. During simulation, the DUT model is driven by these input vectors into different states in a search for goal states. In particular, CoverBooster drives the DUT model into the reset state, as directed by master control process 154; records input vectors applied to the DUT model; reads traces from the formal simulation modules in order to drive the DUT model into desired states; advances the DUT model clock; writes out completed trace sets for later use; and replays previously-generated and saved trace sets.

The symbolic simulation module, the satisfiability module, and the unreachability module 160, 162, and 164 are written in C, C++, pascal, fortran, or any other language suitable for accomplishing the purposes described herein. For convenience, they are preferably written in the same language of as many of the processes which control them as possible, particularly the hybrid verification program used to interpret TCL control procedures.

To generate a sequence of input vectors suitable for driving the DUT into each of a defined set of goal states, a user first defines a DUT model, a model environment, and a set of design goal states. The user then integrates the DUT and the model environment into a random simulation module. The user also defines the heuristics to be used by the master control process in guiding the verification process. For example, the user can designate the following heuristics:

start the simulation process, beginning with a number of cycles of random searching from the reset state, in order to identify as many goal states as possible as quickly as possible, and thereafter proceed to a satisfiability analysis from the reset state, the SAT analysis being allowed to proceed until all goal states are reached, and input vectors identified, or until CPU time or memory resource limits are exceeded;

thereafter symbolic simulation is run from the reset state and allowed to proceed until all goal states are reached and input vectors identified or until CPU time or memory resource limits are exceeded; and thereafter random simulation is resumed from the reset state, followed by formal simulation from the goal state most recently identified by random simulation, or the last state reached by random simulation, and a process of interleaving between random simulation, satisfiability techniques, and symbolic simulation is begun, and continued until input sequences for all goal states are identified.

It is generally preferred that heuristics be set such that demands on memory and CPU time are progressively increased as the simulation verification process continues. This has been found, in general, to result in the most rapid identification of goal state inputs possible in the initial stage of the analysis process, and to leave the more exhaustive stages, in which the rate at which goal states are reached tends to drop, to later.

Optionally, the user may specify, via the user interface, that an unreachability analysis be initiated and conducted simultaneously with the random and formal simulation processes.

Heuristics used to guide the simulation process are largely implemented in TCL code running in the master control process. This TCL code allows for many user-specified configuration settings, sometimes known as TCL "knobs", and tracks session progress and status by monitoring TCL "variables" which change as the session progresses. For example, the number of times random simulation is to be started from the reset state in the heuristic scenario described above is specified by the user via the user interface, by setting a variable "initRunsMax." Similarly, the number of simulation cycles to be allowed without reaching a goal state during any of the starts from reset is specified in variable 'initCycles'. The variable 'initCycles' specifies that random simulation module 158 stop when a given number of DUT clock cycles have been simulated without hitting a previously unreached goal. It has been determined that a suitable value for initRunsMax, for most reasonably complex DUT models, is 20. Similarly, a beneficial number of times random simulation is to be allowed to execute (that is, to drive the DUT model) without striking a goal state has been found to be about 10,000.

When the user wishes to conduct unreachability analyses, the TCL unreach knob is set to 'unreach_lmbm'. This causes the master control process to initiate unreachability analysis, preferably simultaneously with the beginning of formal simulation.

All TCL knobs and variables are organized as elements of a single global array variable named "ctgInfo." Preferably, when a TCL knob or global variable is added to the ctgInfo array, a documentation entry is also added to aid later designers or analysts in evaluating the simulation process used.

To begin analysis the user initializes the system by invoking the VCS slave module 158 via the master control process and the user interface, through use of the UNIX 'fork' command. The "hv-I-master" command is issued to open a pipe to read/write the standard input and output of the master control process and to define hv processes as master, not slave, processes. The TCL file "hvRecipe.tcl" is loaded, to define procedures needed to implement the various high-level master control methods; the master control process is told the values of user-specified session parameters, including heuristics used to guide the simulation process and the set of defined goal states; and by calling the "hvino_create_hnl_design" command the DUT model is loaded. The formal methods slave processes to be started at the completion of random simulation are selected by sending "hv_setup_formal" to the master control program. The selected slave processes are started, loaded with HNL and the set of defined goals, and configured as necessary.

The verification process is initiated with random simulation via the user interface, through use of the 'hv_start_vcs_session' TCL procedure. Goals are loaded into the VCS process by use of the PLI routine "$defineFsmHV" and the DUT is driven to the reset state. The master control process defines simulation coverage progress metrics and initiates random simulation from the reset state. The random simulation module initiates monitoring of the reaching of goal states through the use of PLI functions. The reaching of goal states is generally monitored by designating selected registers within the DUT model, comprising signals in the goal set, as having callback nodes. The changing of the state (i.e., the value) of any of these callback nodes causes a check to be made to determine whether a goal state has been reached. Preferably this check is made at a consistent point, at least once per cycle, in the DUT model time cycle, for example the "T/4" point in the DUT model time cycle shown in FIG. 6. If so, the random simulation module 158 is instructed to write the input vector which reached the goal state into the trace file. (Again, preferably all states generated in the DUT model are recorded in the trace set, to facilitate later re-recreations of goal states.) Thus the relatively inefficient method of continuously checking to determine whether a goal state has been reached is avoided. Instead, it is only when one of the goal set register variables has changed that the DUT model state is checked to determine whether a goal state has been reached.

A component of random simulation module 158 used in controlling the random simulation process 158 is the CoverBooster program. A portion of top-level control flow within the CoverBooster program is shown in pseudocode in FIG. 5. CoverBooster is configured to drive the random simulator under a variety of conditions, one or more of which typically arise during any given verification session, depending upon heuristics defined by the user and received from the master control process.

At 301 CoverBooster program 300 initializes the DUT model and reads program invocation arguments received from the master control program which determine the exact function to be performed by CoverBooster at this particular call. At 302 two DUT model clock cycles are allowed to pass prior to beginning simulation, in order to ensure that other, parallel processes have completed and that the system is ready.

One option enabled by CoverBooster is the driving of the DUT model into or through an entire set of predetermined states, as for example, a previously-defined set of goal states, given a suitable input vector. This ability is used, for example, in verifying the DUT after input vectors for each of the goal states has been identified. At 303 CoverBooster determines whether such a test case replay has been requested. If so, the trace vector is replayed at 304 and at 305 control is returned to the master control process.

Loop 306 provides control mechanisms for all actions needed for efficient coverage of goal states. The loop begins with statement 307. At 308 a read of control flags is performed. These control flags, set and monitored by the master control program, are used by the master control program for guiding the random analysis.

For example, if the random simulation module is only being requested to drive the DUT model to the reset state, the control flag read at 308 causes at 309 a call to the reset function and at 310 a resetting of the ResetFlag to inform the master control program that the reset has been completed.

Optional biasing considerations set by the user and/or by the environmental model are considered at 311, and appropriate action is taken. Biasing of input may be accomplished in at least two ways. The first is through the use of the "UserBiasDrive" function. A totally random input for any particular bit of an input vector would have a value of "1" in 50% of cases and a value of "0" in the remainder. The user may change this ratio, or bias the input, by using standard Vera language techniques within the "UserBiasDrive" function. In addition, CoverBooster provides a "dynamic" biasing mechanism. When a trace for driving the DUT model into goal state is provided from a formal engine, the "biasWeightsFlag" is set in the random simulator, prior to driving the DUT model through the trace. This causes CoverBooster to count, for each input signal, how many times the signal "1" or "0" is encountered as the trace is applied. These counts, or "weights", may then be used, through application of other standard Vera language techniques, to bias the inputs so that something other than a 50%—50% ratio of "1"s and "0"s results. These "dynamically biased" inputs are used in the first few (e.g., 1000) input patterns generated following the reaching of a goal state. Periodically these weights are cleared, as at 311, since their effectiveness decreases as the number of test cycles increases.

If analysis is returning to random simulation following location of a goal state by a formal engine, at 312 the trace provided by the formal engine is replayed to provide a resumption point for random analysis.

Quit and stop flags set for various control and heuristic reasons are considered at 313. For example, if the master process determines that simulation should be paused, or if PLI processes determine that a simulation progress coverage metric is no longer being satisfied, the "stopFlag" is set. At 313 CoverBooster checks the flag, and if the flag is set breaks out of loop 306 so that further direction or input from the master process can be awaited and appropriate action taken. Similarly, if the master process determines, as for example by interactive user request, that the test generation session is to be terminated, the "quitFlag" is set, and upon determining at 313 that the flag is set CoverBooster stops execution of loop 306 and the session is terminated.

At 314, if no stop or quit flags have been encountered, a biased, constrained random input sequence is generated and the DUT model is driven through a single clock cycle.

At 315 a choice is made between default user-specified biasing options, which are applied for the first 1000 (or other suitable number) of clock cycles following reaching of a goal state, or dynamic, automatically-generated biases, and the appropriate option is used for generating the input vector and driving the DUT model, either at 316 or 317 as appropriate. The drive message is passed to the DUT interface object, with appropriate parameters; the interface object uses the parameters to control mapping of a legal input vector for the DUT model. The legal input vector is applied to the DUT model, and the resultant state of the DUT model is determined. If one of the callback nodes has changed value, a determination is made as to whether the changing of the register state signifies the reaching of a goal state. If a goal state has been reached, at 318 the fact that a state has been reached is reported to the master control process.

Figure 6:
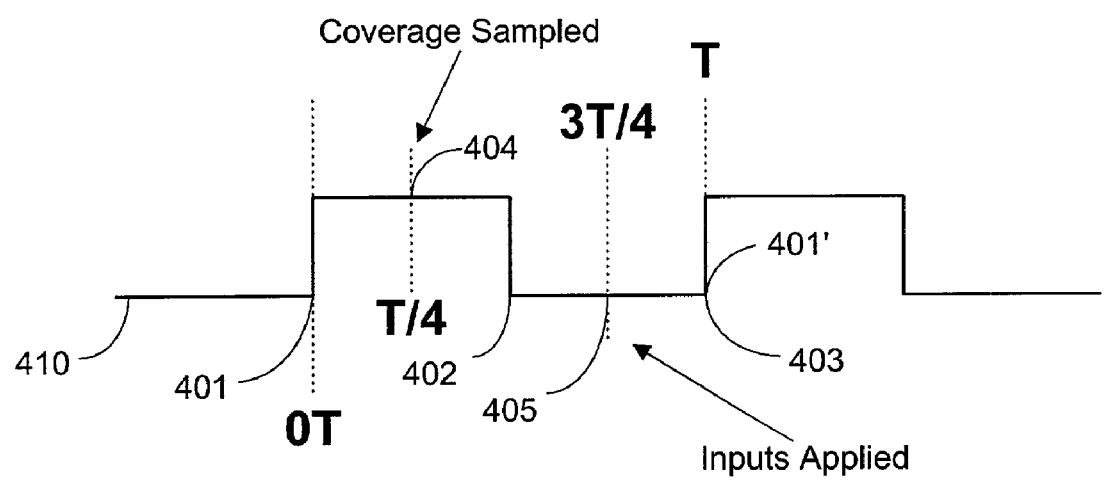
FIG. 6 is a schematic representation of a timing cycle in a simulation process according to the invention.

At 319–320 the clock is updated and timing is judged for the appropriate point in the clock cycle for starting the next simulation cycle. Timing of the application of inputs to the DUT model, as specified at lines 320, is shown in FIG. 6. Solid line 410 represents the pulsing of the clock circuit. A clock cycle begins at positive edge 401 of the clock pulse. At halfway point 402 of the cycle the clock pulse undergoes a negative edge. At point 403 the next clock cycle begins with positive edge 401'. To ensure suitable reading and proper driving, inputs are applied at 405, ¾ of the way through the cycle, and the DUT state is checked at point 404, ¼ of the way into the clock cycle.

Figure 5:
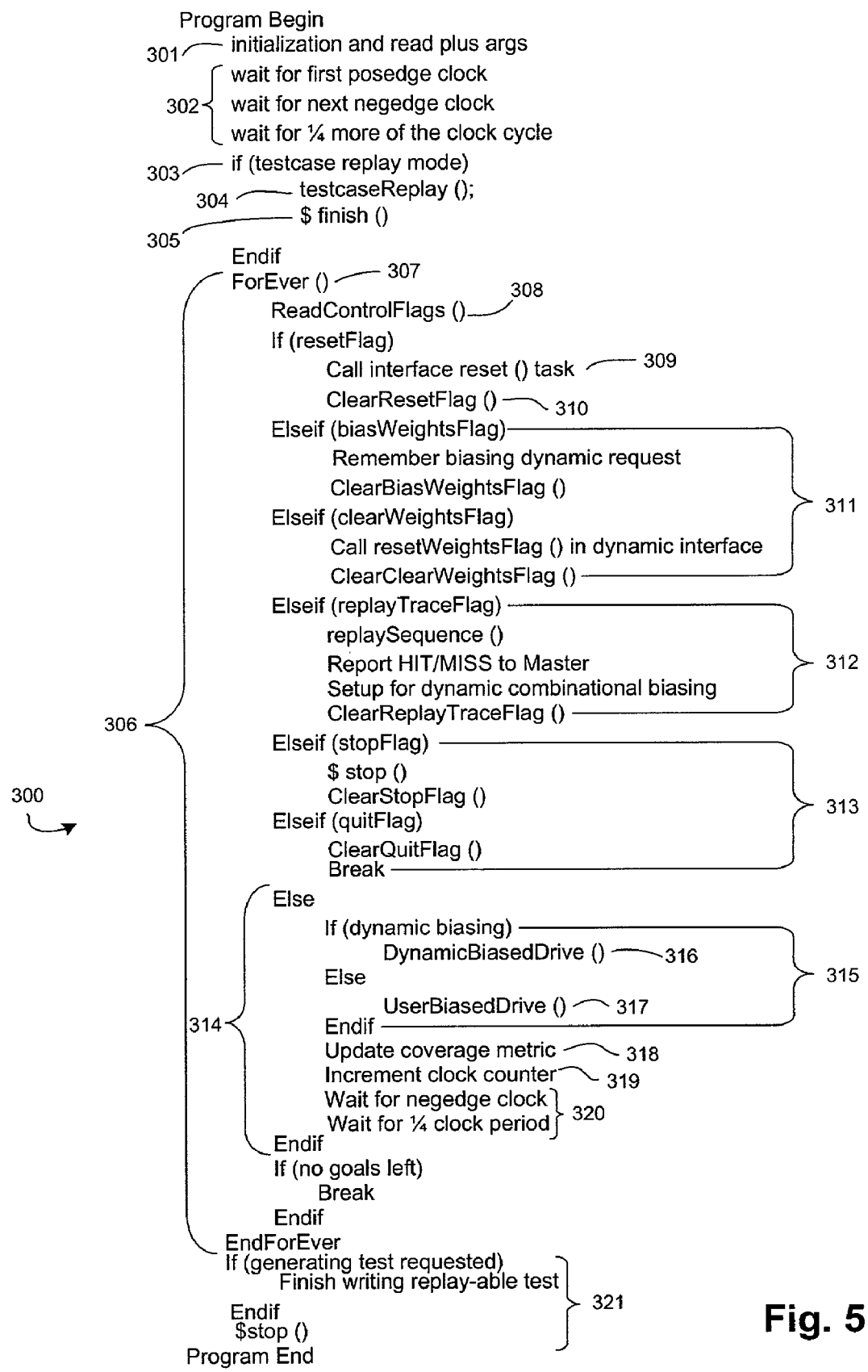
FIG. 5 is a pseudocode representation of a portion of a preferred embodiment of a computer-implemented random simulation process according to the invention.

Loop 306 of the CoverBooster program, as shown in FIG. 5, is executed until it is determined that all goal states have been reached or have been proved unreachable or the simulation coverage progress metric is no longer satisfied.

At the completion of the random simulation cycle control is returned to the master process. What happens next is specified by heuristics previously set by the user or by the master control process, in light of the state reached by the verification simulation process.

After random simulation has been started from the reset state initRunsMax times (that is, 20 times in this Example), the master control process proceeds to MODE_INIT_SAT. To this end the user interface has previously set the TCL knob "satCycMax'" to a value >0. MODE_INIT_SAT phase uses the SAT engine to search for goals, starting from the reset state. The resource limits "satCycMax" and "satCpuMax," previously set by the user interface or by master control process 154, are used as coverage progress metrics for stopping analysis. If a goal is reached prior to exhaustion of CPU or cycle resources, the trace is written to the trace vector and is played by the VCS module, as previously explained. Random simulation then proceeds until 'initCycles' system clock cycles have passed without hitting a new goal. Then VCS resets and waits for another formal search to be carried out. If SAT fails to reach a goal from the reset state, master control process 154 proceeds to the next phase, MODE_INIT_SYM.

Operation of the MODE_INIT_SYM phase is similar to MODE_INIT_SAT, except that the symbolic simulation search engine is used, with resource limits being defined by the 'symsimCpuMax' and 'symsimCycMax' TCL variables. If traces to no new goal states are identified, master control process 154 causes the DUT model to be driven again to the reset state and proceeds to the next phase, MODE_SAT.

In MODE_SAT, VCS simulates randomly for a determined number of cycles and stops; the last state reached is written to a file and is used as a starting point for satisfiability analysis. The satisfiability module 162 begins from this state. If the satisfiability module identifies a new goal state prior to exceeding memory or CPU limits, the trace is replayed by VCS and random simulation is resumed. If no new goal state is reached, master control process 154 proceeds to MODE_SYMSIM.

MODE_SYMSIM is similar to MODE_SAT, except that symbolic simulation is substituted for use of satisfiability techniques. Again, VCS simulates for a determined number of cycles and stops, starting from the last identified goal state; the last state reached by random simulation is then written to a file and is used as a starting point for symbolic simulation. Symbolic simulation module 160 is started; if a new goal state is reached prior to exhaustion of CPU or memory resources, the trace is replayed VCS and random simulation is resumed. Otherwise MODE_SYMSIM_SAT is initiated.

MODE_SYMSIM_SAT is similar to MODE_SAT and MODE_SYMSIM, except that after starting from the last state reached by random simulation, the verification process alternates between symbolic simulation and satisfiability techniques. When both symbolic simulation and satisfiability techniques have interleaved a given consecutive number of times (stored in variable 'formalMissThresh') without identifying a new goal state, the DUT model is driven into either the reset state or the last state reached by random simulation, MODE_SYMSIM is entered, and the process is repeated until all goal states have been identified or proved unreacheable.

When all goal states have either been reached or proved unreachable, MODE_DONE is set by the master control process. The PLI command $reportDutStateHV is called by master control process 154 to report the current DUT state to the trace vector file and any remaining unreported reached goals are reported using the PLI command $reportNewCoverDataHV. Control is returned to the user for further action, if desired.

It must be borne in mind that the heuristic framework presented in the Example is only an example, and that many heuristic approaches to the simulation verification process are possible and desirable, depending upon the particulars of the DUT and the test conditions. FIG. 7 is a pseudocode representation of a general process for controlling interleaving between analysis methods. In particular, FIG. 7 illustrates the interleaving process conducted in TCL by master control process 154 when one of the formal engines stops and random simulation is to be run, regardless of whether the stop is due to a new goal state being reached or whether one of the formal search coverage progress metrics has stopped being satisfied. This pseudocode is written so as to incorporate use of the Synopsys VCS Verilog simulator.

At 330, 340, and 350 it is determined which mode the simulation verification process has stopped in. If the formal verification simulation process has stopped in MODE_INIT_SYM, the determination is made at 331, 335 as to whether a goal state has been reached or simulation has stopped due to non-satisfaction of a coverage metric. If no new goal state has been identified, at 332 a determination is made, based on the previously-decided heuristics, which formal method is to be used after the next phase of random simulation that is about to be started has completed. At 333 the next phase of random simulation is started. Upon the termination of this random simulation phase due to non-satisfaction of coverage progress metrics, the next formal method chosen at 332 is initiated. If a new goal state has been identified, at 336 the trace which lead to identification of the new goal state is used to drive the DUT model into that goal state and at 338 random simulation selected is resumed.

If the formal verification simulation process has stopped in MODE_INIT_SAT, a similar process is used. The determination is made at 341, 345 as to whether a goal state has been reached or a formal method has stopped due to non-satisfaction of a coverage progress metric. If no new goal state has been identified, at 342 a determination is made, based on the previously-decided heuristics, which formal method is to be used after the next phase of random simulation that is about to be started has completed, and at 343 random simulation is resumed. Upon termination of random simulation due to non-satisfaction of coverage progress metrics, the chosen formal method is started. If a new goal state has been identified, at 346 the trace which lead to identification of the new goal state is used to drive the DUT model into that goal state and at 348 random simulation is resumed.

If the formal verification simulation process has stopped in MODE_SAT, MODE_SYMSIM_SAT, or MODE_SYMSIM, and the previous formal search method has identified no goal states, at 352, 353 a determination is made as to whether the last formal process was MODE_SAT or MODE_SYMSYM_SAT. If MODE_SAT, MODE_SYMSIM_SAT is designated as the next phase. If MODE_SYMSIM_SAT, MODE_SYMSIM is designated as the next phase. In either case at 355 a determination is made as to whether the predetermined number of interleaving cycles "formalMissThresh" has been reached; if so, at 356 the random simulation module is called to drive the DUT model to the reset state and at 365 random simulation is resumed. If 'formalMissThresh' has not been reached and the last formal engine used was symbolic simulation, at 358 VCS is used to replay the latest input trace and at 365 formal simulation is resumed from the latest identified goal state, using the formal method designated at 352, 353.

If the last formal search process used has found a goal state and 'formalHitThresh' has been reached, at 364, 365 bias weights are cleared after trace replays and VCS is called to resume random simulation from the last state reached.

While the invention has been described and illustrated in connection with preferred embodiments, many variations and modifications as will be evident to those skilled in this art may be made without departing from the spirit and scope of the invention, and the invention is thus not to be limited to the precise details of methodology or construction set forth above as such variations and modification are intended to be included within the scope of the invention.

Appendix 1

DESIGN AND MAINTENANCE SPECIFICATION FOR CTG REACHABILITY
& CONTROL SUBSYSTEMS

----

Kevin Harer

Design and Maintenance Specification

FOR

CTG

Reachability & Control Subsystems

*Revision 1.0*

*Date:02/14/00*

*AUTHOR(S):, Kevin Harer*

| | | |
|---|---|---|
| 1. | Introduction | 3 |
| 1.1. | Document Scope | 3 |
| 1.2. | Intended Audience | 3 |
| 1.3. | Document Organization | 3 |
| 2. | CTG Usage Overview | 3 |
| 3. | Architectural Overview | 5 |
| 3.1. | Master/Slave Infrastructure | 5 |
| 3.2. | TCL Control Mechanisms | 6 |
| 3.3. | UI Interfacing | 6 |
| 3.4. | Reachability Engines | 6 |
| 3.5. | Unreachability Engines | 7 |
| 3.6. | CTG Process Flow | 7 |
| 4. | Master Process Coordination Mechanisms | 9 |
| 4.1. | Process Hierarchy and Communication | 10 |
| 4.2. | Infrastructure Package (hvCtl) | 10 |
| 4.3. | TCL Coordination Package | 14 |
| 5. | Goal Creation and Usage | 35 |
| 5.1. | Introduction | 35 |
| 5.2. | HvGol Package TCL Commands | 35 |
| 5.3. | HvPli Services For VCS Usage | 36 |
| 5.4. | Usage Scenarios | 38 |
| 6. | UI Interface | 39 |
| 7. | VCS Interface | 39 |
| 7.1. | PLI Interfacing – hvPli | 39 |
| 7.2. | Verilog TestBench Top Module | 41 |
| 7.3. | Vera Interfacing - CoverBooster | 44 |
| 7.4. | Verilog Program Control – Usage Scenarios | 48 |

1. Introduction

1.1. Document Scope

This document serves as a design and maintenance document for the Reachability & Control Subsystem of the "Coverage-based Test Generation" product (CTG). This document describes various mechanisms, techniques, and policies which are used to coordinate formal and informal engines as a solution to our specific reachability problem. This includes interfaces to the engines and integration techniques for those engines.

This document does not describe in detail individual engines or underlying infrastructure of the formal analysis environment. The document does not describe detailed User Interface issues, mechanisms, methodologies, or flows. VERA environmental modeling and compilation is not discussed. Refer to appropriate documentation for those other technologies.

1.2. Intended Audience

The intended audience is technical engineering staff which are actively involved in CTG development. The document may be useful for non-technical persons who are familiar with CTG problems and issues.

1.3. Document Organization

The remainder of this document is organized in the following way. Section 2 provides an overview of the problem CTG addresses and the general approach from a users perspective. Section 3 provides an architectural overview of the CTG system implementation. Section 4 provides detailed descriptions of mechanisms used to coordinate, control, and/or integrates the various engines and UI into a cohesive system. Section 5 provides detailed descriptions of goal creation and maintenance in CTG. Section 6 provides detailed interfacing mechanisms for the UI process. Section 7 provides detailed descriptions of the interface with the explicit states simulator VCS, as well as detailed explanation of test generation and replay mechanisms and capabilities.

2. CTG Usage Overview

The basic problem that CTG attacks is the following. Given some Design Under Test (DUT), and some goal states of that design, classify all goals as either Unreachable or Reached. If a goal is classified Unreachable, it must be proven with respect to some start state and DUT environmental conditions. If a goal is Reached, then CTG must save a simulation test suitable to reach that goal in some later VCS stand-alone session. Any goal which is not classified as Reached or Unreachable is said to be Unknown; CTG attempts to minimize the number of these Unknown goals.

CTG uses a state coverage metric, hence goals are states, or sets of states, of the design These states are defined by a small number of "coverage variables". These coverage variables are on the order of dozens, while the total latches in the design are in the thousands. Each goal is a different combination of these coverage variables. As an example; given coverage variables $\{c_1, c_2\}$, CTG attempts to reach "states" $\{00\}, \{01\}, \{10\}, \{11\}$. Note that these "states" are technically "cubes", but we call them states.

The CTG objective then is to classify as many different combinations of these coverage variables as possible. This task is known as "Coverage Driven Test Generation".

The method CTG uses to "reach" (or cover) goals is to interleave classic explicit state simulation (e.g. VCS) with formal exhaustive searches using some explicit design states as starting points for the search. If a formal search is successful, then the explicit state simulator is used to build up a simulatable test which reaches the goal. This scenario is illustrated in Figure 1. In Figure 1, the enclosing box represents the entire state-space of the design. Explicit state simulation is represented by the zig-zag solid line as explicit states are visited on each successive clock cycle. Stars represent goals which are to be "reached", if possible.

At some time T1, CTG determines that simulation is not reaching new goals. A formal search is used to exhaustively search for a goal from some explicit state, S1, generated by the simulator. This formal search is represented by the concentric rings in Figure 1. When a formal search reaches a goal G1, the sequence of input assignments (termed a "trace") to reach from S1 to G1 are simulated and the goal is then "reached".

This interleaved process continues until all goals are classified or some user-specified resource limit is exceeded (typically time).

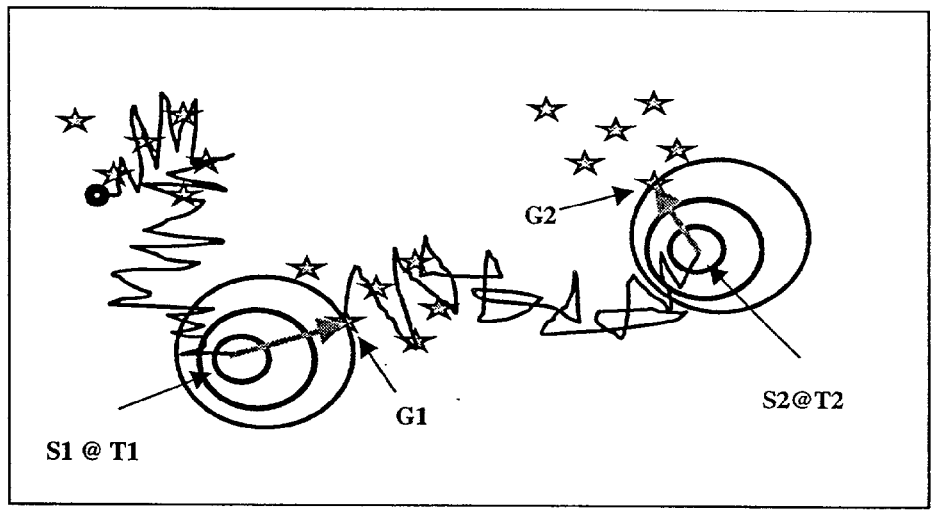

Figure 1. CTG Search Process

Some basic observations which lead to this interleaved engine usage are the following:

- Explicit state simulators are very efficient at reaching "deep" states in the design. Explicit state simulation only reaches a single state at each clock cycle.

- Formal search methods are exhaustive, which means that all reachable simulation states are reached at the same time. Formal reachability algorithms are feasible for short search radius, and commonly intractable for deep search radius.

- When a difficult goal is reached, there are often several other goals "close" to that goal in the state-space. This is termed "jackpot" behavior. The rationale for this is due to the nature of the goals that CTG attempts to reach. As described earlier, goals consist of a collection of coverage variables. These coverage variables are the union of smaller control Finite State Machines (FSM's) in the design. Some of these FSM's are relatively easy to transition to new states, others are relatively difficult. When a difficult FSM state is entered, the cross states determined by the easy FSM's are then easily reached; these are the jackpot goals.

3. Architectural Overview

This section provides a general description of large components of the CTG system which accomplish the usage described in the previous section.

3.1. Master/Slave Infrastructure

The overall CTG architecture may best be thought of as a Master/Slave where a Master process interacts and coordinates many concurrent Slave processes. These Slaves are used to "reach" various goals, prove them unreachable, and to interact with the user. Fig.

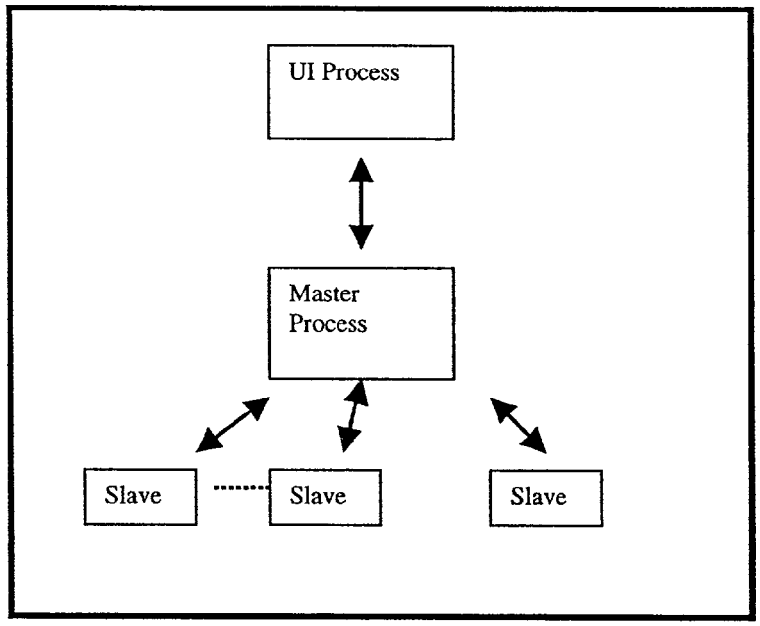

2 illustrates this architecture.

Figure 2. CTG Process Architecture

As illustrated in Figure 2, a "Master" process is used to coordinate more than 1Slave (or child) processes so that the User Interface process is isolated from all control/coordination problems. The Master process is also given the task of providing communication mechanisms between the Slaves and UI process. In addition, various system heuristics are embodied in the Master process to choose which Slave engine to use at different times in the CTG session.

It is important to note that the Master process is intended to be "live" at all times; the Master process does not "block" for long times while various analysis are carried out by any given Slave. An additional requirement is that the Master process allow Slaves to work concurrently.

The Master process continually polls the Slave and the UI processes for messages and/or commands to be processed. When a message is received from a Slave, it is decoded and either processed by the Master process itself, or passed to the UI. Commands from the UI are processed immediately by the Master process.

The Slave processes of Figure 2 represent various reachability and/or unreachability engines, each running in a separate unix process. Examples of these engines in the CTG system include: symbolic simulation, discrete event simulation (VCS), satisfiability solver, and an image computation engine. Depending on usage, it is possible for 2 or more of these engines to be used in parallel within a single CTG analysis session.

3.2. TCL Control Mechanisms

Control flow for the CTG product is embodied in TCL procedures which execute in the Master process. This TCL control code interacts with Slave processes and the UI process to coordinate all Slaves into a coherent CTG session.

Each Slave process receives commands from the Master process via stdin of the Slave process. The Slave communicates with the Master by writing properly formatted text strings to stdout, or by putting large amounts of data (e.g. BDDs) in data files formatted for the specific task at hand.

Two classes of messages are received by the Master process from Slave processes: formatted and unformatted. Unformatted messages are simply printed to stdout of the Master process. Formatted messages from the Slave are, by definition, intended to be processed by the TCL control program running in Master. The Master process transfers this information from the unix/C world to the TCL world by calling a TCL procedure; this procedure then further decodes the message for handling by the TCL control program. A message "catalog" is maintained such that all pre-defined (thereby formatted) Slave messages are known.

3.3. UI Interfacing

The UI process issues commands to stdin of the Master process, and receives formatted messages from stdout of the Master process. The UI process is responsible for all user presentation of data received from the Master process. This presentation may be either graphic or textual in nature, depending on user needs. A UI message catalog is maintained.

3.4. Reachability Engines

CTG uses a number of reachability engines, each running in its own unix Slave process. Each of these engines use specialized algorithms to search for sequences of inputs which lead from one state (a "start" state) to others ("goal" states). Examples of these reachability engines include:

- Explicit state engine. This is a classic event driven or cycle-based simulator. This engine uses biased, constrained, random simulation techniques to exercise the Design Under Test (DUT) in an attempt to reach goal states. In addition, this engine has the capability to:

- generate start states for searches performed by other, more "formal", engines,

- apply sequences of inputs which are generated by the formal engines,

- save the entire testcase for later re-use by the user

- Symbolic Simulation engine. This engine uses exhaustive (perhaps under-approximated) symbolic simulation methods to attempt to reach goals from specific starting states. If a goal is reached, the engine saves a sequence of inputs which are replayed by the explicit state engine to prove that the state has been reached.

- Satisfiability Solver engine. The SAT engine uses bounded model checking concepts, together with classic satisfiability techniques, to reach goals from a starting state. If successful, the engine saves a sequence of inputs which are replayed by the explicit state engine to prove that the state has been reached.

3.5. Unreachability Engines

Unreachability engines use various formal techniques to prove that certain goal states are not reachable from some start state. The start state of interest is typically the reset state of the DUT. These Unreachable states are then optionally communicated to the reachability engines to reduce the search problem. Current unreachability engines incude:

- Image Computation Engine. This engine computes an approximate fixed point for reachable states, then inverts the fixed point as a proof of unreachable states. The fixed point computation is typically over-approximated.

3.6. CTG Process Flow

An illustration of the interleaved and concurrent nature of the CTG system is illustrated in Figure 3.

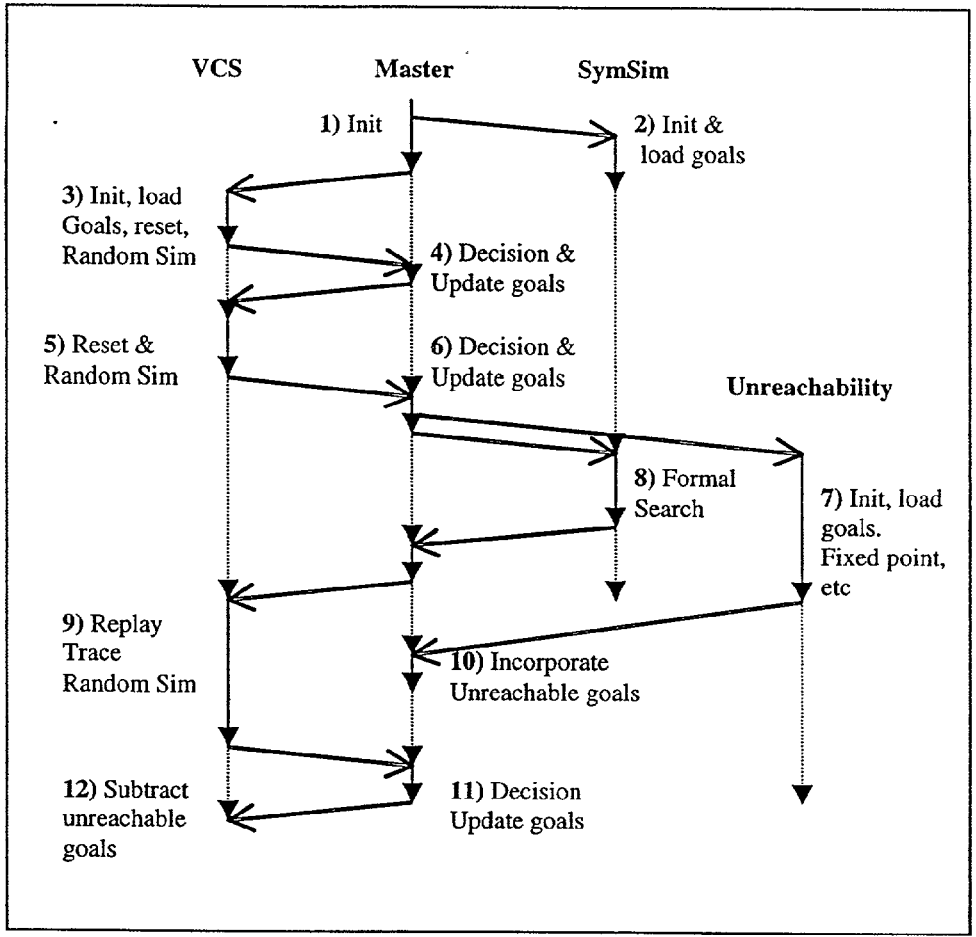

Figure 3. Interleaved CTG System Overview

The diagram of Figure 3 shows an abbreviated, simplified CTG session where VCS, Symbolic Simulation, and Unreachability analysis collaborate to classify goals. The vertical solid arrows indicate that the unix process is "working". The vertical dashed arrows represent that the unix process is waiting for input from some other process before continuing. The horizontal double-arrows indicate messages and/or data being passed between unix processes.

A description of some of the interesting transactions and tasks follows. Note that all UI interactions are omitted, as they are specific to another document.

1. The first thing that happens is that the Master process is invoked. After invocation, the Master process loads HNL, defines goals, and generally does initialization type things.

2. At some point, based on input from the user, the Master process starts and initializes formal reachability engines in separate unix Slave processes. In this example, only the Symbolic Simulation engine is used. The hv program which embodies this reachability engine loads HNL, defines goals, and builds the Symbolic Simulation Manager.

3. The Master process, again under UI direction, starts the VCS Slave process. VCS initializes, loads goals, performs a reset sequence, then runs a number of random simulation cycles. At this point, the CTG-resident code in VCS is keeping track of which goals are being "reached". At some point, CTG PLI code in VCS determines that "goals are not being reached". VCS stops and returns control to the Master process.

4. The Master process, based on various heuristics and user parameters, makes a decision on how to proceed. In this example, the decision is to perform a reset sequence then do more random simulation in VCS.

5. VCS performs a reset sequence to reset the DUT, then more random simulation occurs. After determining that no more goals are being reached, VCS stops simulating and returns control to the Master process.

6. The Master process decides to perform a formal search, using Symbolic Simulation, from the current design state. This design state is written from VCS and is used to 7) start unreachability analysis, and 8) start a formal search.

7. An Unreachability Slave is started. This is performed by the hv program, which loads HNL and goals, then performs a fixed point computation from the design state provided from VCS. After the fixed point is computed, those goals outside the fixed point are proven unreachable. These unreachable goals are written to disk for later processing by other Slave engines.

8. Simultaneously with unreachability analysis, a formal search is initiated using the Symbolic Simulation engine. This search starts from the design state captured by VCS. In this scenario, the search completes successfully, and the Symbolic Simulator writes out primary input stimulus (i.e. a "trace") which VCS can use to drive the design from the current state to the goal state.

9. VCS replays the trace and hits the new goals. Random simulation continues in an attempt to hit the previously described "jackpot" goals.

10. While VCS is performing random simulation (trace replay, etc), the unreachability engine completes and results are incorporated into the Master process. This unreachable goal data will be communicated to each of the reachability engines on an as-needed basis.

11. At some point, VCS determines that no more goals are being hit, and control is returned to the Master process.

12. The VCS process is sent a message which contains the number of unreachable goals. This count is used to adjust the coverage metric which tells VCS when all goals have been classified.

The CTG session continues interleaving VCS and Symbolic Simulation until all goals are reached. The remainder of this document explains the details about how these things are implemented.

4. Master Process Coordination Mechanisms

As illustrated in Fig. 2, the Master process is the central coordinator of a multi-process concurrent system which attempts to classify goals in some sort of efficient manner. TCL procedures are implemented to provide key coordination of the Slave engines, and to embody heuristics to attempt to provide an efficient coherent system to the UI. Important infrastructure services are provided in C code packages to provide flexibility to the TCL control programs. The hv program provides this Master process by invoking it the following way:

- hv –I –master

- Typically this invocation is performed by the UI process which 'fork's a unix process, then 'exec's the hv executable in it.

This section presents detailed descriptions of the mechanisms which accomplish the Master process capabilities.

4.1. Process Hierarchy and Communication

The process hierarchy of Figure 2 is the following. The Master process is started by the UI process. Slave processes are started by the Master process. These processes are started using standard unix 'fork' and 'exec' mechanisms.

When a child process is started, the parent process redirects standard-in and standard-out of the child process into unix pipes which are then read and written by the parent process. Thus communication from the parent to the child is accomplished as the child process reads from its stdin file descriptor. The Master and most Slave processes execute the hv program which processes stdin using the Synopsys cci TCL interpreter. The VCS Slave uses the VCS interactive interpreter to read from stdin. Thus all messages to child process must be as either TCL hv commands or VCS commands, depending on the child.

Messages from a child to a parent are communicated via writing to stdout of the child process. The parent process must periodically read from the earlier-mentioned pipe to retrieve and process these messages from the child.

In some cases, where large amounts of data are needed to be communicated between processes, it has proven useful for the data provider to write the data to a temporary file. The consumer is then sent a message saying what/where the data is. The consumer of the data opens the temporary file and processes the data.

4.2. Infrastructure Package (hvCtl)

The hvCtl package provides the key mechanisms to start Slave process, coordinate them, and relay messages to either the UI process or TCL procedures resident in the Master process. Services are provided to allow the TCL programs to communicate and track progress of the Slave processes. These services are accessed exclusively by TCL code which runs in the Master process. This section presents key concepts and commands which access the implementation of those concepts.

4.2.1. Channels

A "Channel" defines a communication path between the Master process and a Slave process. Each Channel has a unique ID which is assigned at the time the Slave process is started. This unique ID is then used to send commands to that Slave and to identify messages received from the Slave. Commands to manipulate and interact with a Channel are the following:

- hvctl_channel_open – This command opens a channel by starting a user-specified program in a separate unix process. The Master process then sends messages to the Slave via the hvctl_send_message command.

Messages/responses from the Slave will then be read from stdout of the child process. Upon success, this command assigns a unique ID for for TCL usage to identify the new Channel. Input arguments to the command allow specification of the program to start in the new process, the working directory the process is to run in, and up to 6 arguments to be used in invocation of the program which is started.

- hvctl_channel_close – This command closes a channel and cleans up data structures associated with it in the Master process. Input arguments are the Channel ID, and an optional command which terminates the program running in the Slave process.

- hvctl_channel_send_msg – This command sends a message to the program running in the Slave process. Input arguments are the Channel ID and a string which is sent to stdin of the child process. The message string must be a syntactically and semantically correct command for the program running in the Slave process. The message is presented to that program on stdin of the Slave process.

- hvctl_channel_stack_set – Due to the concurrent, non-blocking nature of the CTG system, a mechanism is needed to allow long-duration Slave commands to execute. The problem for the controlling TCL program then becomes "remembering" what is happening in a Slave process over a long period of time, and what needs to be done when that task is finished. The mechanism provided is termed a "Command Stack", which is described later in this document. This command associates a Command Stack with a specific Channel. Input arguments are the Channel ID and the name of the Command Stack to associate with it.

- hvctl_channel_stack_get – This command returns the name of a Command Stack associated with a specific Channel. If no Command Stack has been assigned, the string "<no_stack>" is returned.

- hvctl_channel_dump_info – This command is provided for debugging purposes and prints various information about an open Channel.

4.2.2. Engines

An Engine is a "bookkeeping" aid which exists in the Master process, and defines a mechanism which is resident in a Slave. For example, a "Symbolic Simulation Engine" object might exist in the Master process, and correspond to an entire Slave process which is used to perform Symbolic Simulation.

This corresponding Slave mechanism performs some sort of analysis or task which may or may not involve a number of individual commands/responses between Master and Slave. It is possible (and common) to have multiple Engines associated with a single Slave process at the same time. Examples of Engines are the Symbolic Simulator or SAT solver.

Note that the Engine concept is very general, and it has proven useful to have more abstract Engines such as the Goal Manager, the Design-Under-Test Manager, etc.

Engines may have state; for example, the Symbolic Simulation Engine might be in the "RUNNING" state, or the "IDLE" state. This state concept has proven useful to help the controlling TCL program deal with the non-blocking, concurrent nature of CTG.

- hvctl_engine_type_define – This command defines a new *type* of Engine. Typically all Engine types are defined at Master process startup.

- hvctl_engine_state_define – This command defines a legal state for the newly-defined Engine type. Valid Engine states are typically defined at Master process startup, when the new Engine type is also defined.

- hvctl_engine_start – This command creates an *instance* of an Engine type, associated with a specific Channel. The user specifies Engine type, Channel ID, and a name the Engine instance will be known by. The combination of type, Channel, name must be unique.

- hvctl_engine_state_set- This command assigns a state to an instance of an Engine. The state must be valid (defined with hvctl_engine_state_define) for the Engine type. If the specified state is invalid, an error occurs. The caller must specify a unique combination of Engine type, name, and Channel ID.

- hvctl_engine_state_get - This command returns the current state of a specific Engine. The caller must specify a unique combination of Engine type, name, and Channel ID.

- hvctl_engine_exists – This command returns a space-delimited list of names of current Engines which match caller specified parameters. For example, the caller can request "All Engines defined for Channel ID=4", or "All Engines of type Symbolic Simulator". If no Engines are found, the empty string "" is returned.

- hvctl_engine_stack_set – This command is analogous to the previous hvctl_channel_stack_set command. The caller specifies a Command Statck, and unique combination of Engine type, name, and Channel ID.

- hvctl_engine_stack_get – This command returns the name of the Command Stack associated with a specific Engine. The caller must specify a unique combination of Engine type, name, and Channel ID.

- hvctl_engine_type_dump – This is a debugging command which prints various information about a valid Engine type.

- hvctl_engine_dump_info – This is a debugging command which prints information about a current Engine instance.

4.2.3. Command Stacks

As mentioned earlier, the non-blocking nature of the Master process leads to an interesting problem when the Master asks the Slave process to execute a time-consuming task. The TCL control program cannot launch a long task, then simply block-and-wait for the task to finish before continuing to the next task in a sequence of tasks which need to be completed. The TCL program must not block; this non-blocking requirement allows for interactions with the UI or other Slaves. Yet somehow, the TCL program needs a convenient mechanism to help remember what to do when the time-consuming Slave task finishes. The Command Stack is the key mechanism provided to assist in this problem.

A Command Stack is a stack of commands which may be attached to either a Channel or an Engine. When a task is finished (detected via a message from the Slave), the next command is popped from the stack and is executed. Common usage by the TCL control program include the following:

- A new Command Stack is created and associated with each Channel when the Channel is opened.

- When a time-consuming task is started by a Slave, a TCL procedure, with necessary arguments, is pushed onto the Command Stack for that Channel. This pushed TCL procedure is to be executed when the time-consuming task is completed.

- Optionally, the state is set on the Engine which will signal completion of the time-consuming task.

- When the task-is-done message is received by the Master process, the command is popped from the Command Stack, and it is executed. Note that this Slave-to-Master message passing is explained later in this document.

The remainder of this section describes commands which directly manipulate Command Stacks.

- hvctl_command_stack_create – This command creates a new Command Stack. The caller may optionally assign a name to the Command Stack – if so, the name must be unique.

- hvctl_command_stack_free – This command destroys a previously-created Command Stack.

- hvctl_command_stack_push – This command pushes a syntactically legal TCL command string onto the command stack. This string is executed at some later point using the TCL "eval" mechanism.

- hvctl_command_stack_pop – This command pops the top command string off the Command Stack. If the stack is currently empty, the string "<empty>" is returned.

- hvctl_command_stack_dump – This debugging command prints information about a current Command Stack.

4.2.4. Message Poll Loop

As illustrated Figure 2, the Master process needs to continually check for messages from the UI process as well as each of the Slave process. This mechanism uses the unix "select" mechanism to accomplish this. "select" is a unix function which is given a set of open file descriptors to attempt to simultaneously read from. When data is read from one of the files, select returns with the file descriptor of the file with waiting data. The select function has the ability to also "time out" if no file may be read after a certain amount of time.

For the Master process, these files are either stdin of the Master process, or the open "pipe" (another unix-ism) for individual Slave processes. These pipes are created when a Slave process is started, and correspond to stdin and stdout of the Slave process.

When data is read from one of these files, the Master process first determines which file the data is read from. If the file is the output of a Slave process, the text is decoded to determine if the message is formatted in such a way as to be intended for the TCL mechanisms in the Master process. Formatted Slave messages are identified by prepending "HVINFO" and a message ID to the actual data. The message ID is associated with a specific engine and is expected to be understood by the TCL control program in the Master process.

Once the active file and message decoding has been performed, the Master process takes the following action:

- If the data is read from stdin, it is a TCL command from the UI process which needs to be executed. The Synopsys cci command interpreter is used to execute these commands.

- If the data is read from a Slave process, the message is either unformatted or formatted. Unformatted text is relayed to the UI by simply writing the text to stdout of the Master process. Formatted messages are communicated to the TCL control program in Master by calling a predefined TCL procedure. The TCL procedure is called "hv_child_msg_recv" and arguments include
- Channel ID for the Channel which sent the message, the message ID, and the actual text of the message.

4.3. TCL Coordination Package

The CTG control policies, mechanisms, and heuristics are all implemented in TCL procedures which are executed by the "hv" program running in the Master process. This TCL control code must issue commands to the Slave programs, interact with the UI process, track progress of the test-generation session, etc. This task is complicated, and key aspects are described in this section; it is beyond the scope of this document to explain all necessary details.

Note also that this TCL code is dynamic in nature (i.e. it changes often) as heuristics and algorithms change.

4.3.1. Messages and Message Handlers

As previously discussed, when the Master process reads a message from a Slave process, this message may need to be communicated to the TCL control program. This is done by a call to the TCL procedure "hv_child_msg_recv" which includes a unique message ID, the Channel ID the message is from, and the actual message itself.

Messages are defined on an Engine-specific basis, and are used to communicate some data and/or status from a Slave to the TCL control program in the Master process. These messages must obviously be unique, and coordination of message ID/content between the Slave implementation and Master TCL code must be coordinated by the developer of the engine (Slaves issue messages, Master receives & processes them). To help with this coordination, each Engine has a separate TCL procedure where all messages for that Engine are defined and handled. The hv_child_msg_recv procedure decodes message ID enough to decide which Engine-specific message handler to call, then that procedure is called with the message for further processing.

Message Ids are textual, and the collisions are avoided between engines by assigning a unique prefix to all messages for that engine. For example, all messages from the VCS engine are of the form "VCS_<MsgName>" where <MsgName> varies for each message from the VCS engine. These textual prefixes are documented for all known engines in the hvRecipe.tcl file.

(Developers note: At time of writing this document, message Ids are numeric, and the actual message format includes a data type field. This will soon be modified to reflect the format described in this document.)

To add a new Engine, the developer must perform the following tasks:

1. Create a file <Engine>Handler.tcl and put it in /vobs/propver/src/tcl. This file will implement the Engine-specific message handler TCL procedure hv_<Engine>_child_msg_recv. This file also contains the Engine type and valid states definitions. Allocate a textual message ID prefix for the new Engine, and document it in hvRecipe.tcl.

2. Modify the hv_child_msg_recv procedure in hvRecipe.tcl to recognize your new messages and call your new procedure when a message in the proper range is detected. Source the <Engine>Handler.tcl file where all the other message handlers are sourced, at the end of hvRecipe.tcl.

3. Document your new messages and handle them by implementing the hv_<Engine>_child_msg_recv procedure in the < Engine>Handler.tcl file. Stylistically, use one of the pre-existing *Handler.tcl files in the tcl directory as a template. By convention, this file does not "know" about other engines or high-level procedures. This message handler typically interprets messages, sends notice to the UI, sets engine state, then pops high-level commands off the command stack to continue the CTG session.

4. Instrument the corresponding Slave implementation of the Engine to generate messages in a semantically appropriate manner.

5. Modify the control program TCL code in hvRecipe.tcl to use the new Engine in an appropriate way. This code is discussed in the following section.

At the time of writing of this document, a certain number of Engines have been defined and integrated. Those engines and their usage are:

- Symbolic Simulation Engine. This Engine is implemented in the hv executable and performs Symbolic Simulation from some start state in an attempt to reach some pre-defined goals. If a goal is reached, a "trace" is written for VCS use which applies a sequence of input to drive the design from the start state to the goal state.

- VCS Simulation Engine. This Engine is implemented via PLI code attached to the VCS simulator. This Engine is responsible for observing which goals have been reached as simulation progresses, detecting points at which random simulation should stop, testcase generation and replay, and interfacing with the user-written environmental biasing and constraint code. In addition, this Engine is capable of conveying search start states to the formal reachability engines.

- SAT Engine. This Engine is similar to the Symbolic Simulation Engine except that satisfiability techniques are used to attempt to find a sequence of inputs from some start state to a goal state. This Engine is implemented in the hv executable.

- Image Computation Engine. This Engine uses symbolic state traversal techniques to prove that certain states are unreachable from specific start states. These provably unreachable states are then used to classify goals which are unreachable. This Engine is implemented in the hv executable.

- Goal Engine. It has proven useful to define a Goal Engine to manage goal creation, update, and coordination between the various Slave process and the Master process . This Engine is implemented in the hv executable.

- DUT Engine. A DUT Engine is used to manage the design load and pre-processing steps which lead up to reachability and/or unreachability analysis. This Engine is implemented in the hv executable.

4.3.2. Session Startup

Refer to a UI-related document for detailed description of user interactions with the CTG system (i.e. "how the User interacts with CTG"). In general, the user will first setup an analysis session by doing things like creating hnl, compiling the simulation model, defining goals, environmental modeling, etc. Following this, the user clicks on "Generate Testcase" and the following sequence of events take place:

- The UI starts the Master process by forking a child process and invoking "hv –I –master" in that process. The UI opens a pipe to read/write stdout/stdin of the Master process.

- The UI issues hv commands to setup the Master process. These commands must accomplish the following:

- The hvRecipe.tcl file needs to be sourced

- User-specified session parameters (i.e. TCL knobs) must be set. These parameters are discussed in a later section, but this step basically sets a number of pre-defined TCL variables.

- The HNL must be loaded into the Master process by calling the hvino_create_hnl_design command.

- The HvDsg must be created, and any necessary preprocessing must be accomplished. This is done using the hvdsg_create_hv_design command. Note that current HvDsg usage is that both a hierarchical and flat HvDsg are created in the Master process. All formal and analysis is performed using the flat design; the hierarchical design is used for interaction with the user. Commands are provided for mapping between flat and hierarchical worlds.

- The proper HvMch should be created using hvmch_create_machine.

- An appropriate cover (HvCic) should be created using hvcic_create_cover

- An SthMgr and OrdMgr must be created using hvsth_create_manager and hvord_create_manager

- The user-specified goals are created in the Master process.

- The UI process requests a Slave process to be started for SAT and/or Symbolic Simulation analysis. This is accomplished by a call to the "hv_setup_formal" TCL procedure. This procedure is defined in hvRecipe.tcl and described later in this document. A Slave process is started, hnl loaded, goals defined, and any algorithm-specific setup is performed (e.g. create the Symbolic Simulation Manager).

- The UI initiates actual test generation by launching VCS in its own Slave process. This is done by calling the TCL procedure: "hv_start_vcs_session". This procedure is defined in hvRecipe.tcl and described later in this document. A Slave process is started and the compiled simulation model (generated by VCS compilation earlier) is started. Goals are loaded in VCS and a reset is performed, then simulation pauses. The Master process then sets up simulation stop conditions (via calls to the CTG PLI code) and initiates a simulation run from the reset state.

- At this point, the CTG PLI code within the simulator is recording goals which are reached, as well as any information needed to later write out the final testcase.

From this point on, the CTG session progresses according to the "Phase Progression" described in the following section.

4.3.3. CTG Analysis "Phase" Progression

After the reachability session is initiated, the resultant actions are highly dependent on various heuristics, user-specified direction, and how "hard" the design and/or goalset is. In general, the session progresses through a number of phases or modes. These phases are designed to in general be progressive in CPU and Memory cost.

This section describes the phase progression. Search Engine usage in those phases are described as are exit conditions for the phase. Note that this progression is the heart of CTG and can be expected to change "A LOT" as CTG is exposed to more designs and the development team learns how to effectively use all the technology. This section is provided to give the reader a feel for how things worked at least once in the past.

A CTG reachability session transitions through the following phases in order. At any point, if all goals have been reached, then the testcase is written and the system stops. In the following discussion, certain user settings (i.e. "Knobs") are referenced; these knobs are cataloged and described elsewhere in this document. In the following discussion, knobs are italicized and in bold.

- MODE_INIT

This is the initial mode that CTG starts in. The VCS Engine is used to repeatedly reset the design followed by a number of biased random simulation cycles. The number of times to repeat this sequence is specified by *initRunsMax* and the number of simulation cycles to run is specified by *initCycles*. *initCycles* specifies that VCS will stop when this many system clock cycles are seen without hitting a previously unreached goal.

When this initial run-from-reset phase is finished, VCS performs a final reset then stops. The reset state is written to a file by VCS. If requested by the user by setting the *unreach* knob to "UNREACH_LMBM", an unreachability analysis is initiated.

If *satCycMax* is > 0, CTG progresses to MODE_INIT_SAT, else MODE_INIT_SYM.

- MODE_INIT_SAT

In this phase, CTG uses the SAT engine to search for goals from the reset state. SAT uses the resource limits *satCycMax* and *satCpuMax* to know how hard to search.

If a goal is reached, the trace is replayed in VCS followed by random simulation until initCycles system clock cycles are seen without hitting a new goal. Then VCS resets and waits for another formal search to be carried out.

If SAT fails to reach a goal from the reset state, then CTG progresses to the next phase. If *symsimCycMax* > 0, then MODE_INIT_SYM is entered. Otherwise CTG enters MODE_SAT.

- MODE_INIT_SYM

This phase is entirely the same as MODE_INIT_SAT, except the symbolic simulation search engine is used. Resource limits are defined by *symsimCpuMax* and *symsimCycMax* knobs. Upon a formal search miss, CTG switches to the next phase. If *satCycMax* > 0, then MODE_SAT is entered; otherwise MODE_SYMSIM is entered.

- MODE_SAT

In this mode VCS simulates to a deep state (as illustrated in Figure 1) and stops. This deep state is written to file and is used for a formal search using the SAT engine. SAT uses resource limits *satCycMax* and *satCpuMax* If SAT reaches a goal, the trace is replayed in VCS followed by more random simulation.

In each case, VCS stops to try a formal search after rsimCycles are seen without hitting a unreached goal, or when a "fresh" state is seen. The definition and detection of fresh states are described later in this document.

After *formalMissThresh* consecutive search misses, VCS is reset. If *symsimCycMax* > 0, then MODE_SYMSIM_SAT is entered, else CTG stays in this phase forever.

- MODE_SYMSIM_SAT

This phase is similar to MODE_SAT, in that formal searches are performed from deep states generated by VCS. VCS stops in the same manner as that described in MODE_SAT. The difference is that SAT and Symbolic Simulation searches are alternated. When formalMissThresh consecutive formal misses are seen, the design is reset and CTG enters MODE_SYMSIM.

Resource limits for the formal search engines are *satCycMax*, *satCpuMax*, *symsimCpuMax*, and *symsimCycMax*.

- MODE_SYMSIM

This phase is entirely like MODE_SAT, except that Symbolic Simulation is used instead of SAT.

- MODE_DONE

CTG enters this phase when all goals have been classsified as either unreachable or have been reached.

4.3.4. Externally Used TCL Procedures

This section describes TCL procedures contained in hvRecipe.tcl which are intended to be called by the UI process directly. In addition to calling these TCL procedures, the UI calls many native hv commands (e.g. hvino_create_hnl_design)

4.3.4.1. hv_formal_setup Procedure

The hv_setup_formal TCL procedure performs various setup function needed to start a Slave process with intent to subsequently perform formal reachability. After initiating the Slave process, this procedure returns without waiting for the Slave process to complete setting up. Slave progress is tracked via engine messages handled in the various message handler routines.

Currently supported formal engines are either SAT or Symbolic Simulation. The procedure prototype is the following:

```
hv_setup_formal -design <desName> -type <rchType> \
    -dir <wdPath> -log <logName>
```

This procedure starts the hv program in a Slave process, running in the directory specified by <wdPath>. If –log is specified, all commands issued to the Slave process will be logged in <logName>. The caller must specify the design name to be analyzed, and the type of reachability engine to be used: either "SAT" or "SYMSIM".

After the new channel is opened and a command stack created for it, the Dut and Goal Engines are started for that channel. The Sat or SymSim Engine is also started.

The hv_dut_setup procedure is called to setup the Dut Engine. The hv_load_goals procedure is pushed on the command stack to be called when a message is received from the Slave saying that the HvDsg has been created.

If the Symbolic-Simulator is being setup, the hv_start_symsim_mgr command is pushed on the stack to be executed after goals are loaded.

TCL knobs used by this procedure are the following: hvPath, goalFile, covVarsFile, workDir (if –dir not specified), and verbMode.

4.3.4.2. hv_start_vcs_session Procedure

This procedure is called after all formal reachability engines have been started to start the VCS explicit state simulator. This procedure will start performing random simulation in the MODE_INIT phase described earlier. After random simulation starts, this procedure returns. Procedure prototype is the following

```
hv_start_vcs_session -exe <vcsExe> \
    -map <mapFile> -root <rootModule> \
    -dir <wdPath> -log <logName>
```

This procedure starts a new channel, attaches a command stack to it, then executes the compiled VCS simulator in it (given by the path <vcsExe>). Depending on knob settings and use of the –log switch, VCS may be started using a number of switches to that program itself.

<rootModule> is required and is the verilog module which is being analyzed in the formal engines. <mapFile> is required and specifies verilog reg's which are mapped to SEQ elements in the HNL, nets in verilog which are derived clocks in HNL (and therefore have corresponding edge detectors ), and the net that is the System Clock in HNL. All names in <mapFile> are valid HNL SEQ icell or inet names.

After VCS starts, it performs one reset, it stops and waits for commands (described in a later section of this document). This procedure sends a $startHV PLI command to be processed. The hv_vcs_init_run procedure is pushed on the command stack to be called when $startHV finishes. After these events are initiated, hv_start_vcs_session returns without waiting for anything to complete.

hv_vcs_init_run is popped from the command stack when VCS has invoked, run a reset sequence and stops. This is detected by a VCS_STOP message from VCS, when the VCS engine is in the "initing" state.

TCL knobs used by this procedure are the following: goalFile, workDir (if –dir is not specified), vcsTestFile, outputVcsRchStates.

4.3.4.3. hv_terminate_vcs_session Procedure

This procedure may be called to terminate a test creation session prior to classification of all goals. By default, the test creation initiated by calling the hv_start_vcs_session procedure will continue until all goals have been classified. In some cases this takes a long time and the user may wish to terminate the process cleanly and save a testcase which reaches only a portion of all goals. This procedure is used for that eventuality. Procedure prototype is:

```
hv_terminate_vcs_session -force <forceLevel>
```

This procedure sends a command to VCS to stop simulating, write out the testcase requested (when hv_start_vcs_session was called), and wait before exiting the VCS process. By default, VCS will wait until an in-process formal reach attempt has finished. If <forceLevel> ==1 is specified, VCS will terminate immediately without waiting.

4.3.4.4. hv_print_ctg_knobs Procedure

This procedure is implemented in infoFile.tcl where all TCL knobs are defined. This function prints out all current knobs settings. Procedure prototype is:

```
hv_print_ctg_knobs -doc <docRqst>
```

If <docRqst> is non-0, then a 1-line description of knob usage will be printed for each knob.

4.3.5. Key Internal TCL Procedures

This section describes in some detail TCL procedures which are used to carry out a CTG session initiated by the earlier externally used procedures. In general, these procedures are not called by the UI.

4.3.5.1. hv_dut_setup Procedure

This procedure sets up the DUT Engine in a newly-created Slave process running the hv program in Slave mode. Procedure prototype is the fiollowing:

```
hv_dut_setup -chnl <chnlId> -design <dsgName>
```

The state of the dut Engine associated with <chnlId> is set to load_hnl. The "design" TCLvariable is set to <dsgName> in the child process and the "hvino_create_hnl_design" command is issued in the child process. This procedure returns without waiting for the HNL to be loaded.

Completion of hv_dut_setup is detected via a DUT_DSG_DONE message when the flattened HvDsg is done being created. When completion occurs, the next command is popped off the command stack.

TCL knobs used by this procedure are the following: verbMode.

4.3.5.2. hv_load_goals Procedure

This procedure is called to load goals into a newly-created Slave process running the hv program in Slave mode. This procedure runs after hv_dut_setup has processed the design. Procedure prototype is:

```
hv_load_goals -chnl <chnlId> -gfile <goalFile> \
        -var <varsFile> -style <mchStyle>
```

This procedure creates a HvMch, HvSth manager, and HvOrd manager in the Slave associated with <chnlId>. Goals are created by sourcing <goalFile> in that Slave.

As part of HvMch creation, <varsFile> is sourced and expected to create an InetSet named "CovVars" which contains all coverage variables used in any goals. <mchStyle> is one of "COVVAR", "OUTPUTS", "CUTSET", or "MEM" and defines how that HvMch should be created in the Slave process.

- "OUTPUTS" – Create the default HvMch, which prunes the machine against all Primary Outputs of the underlying HNL. This machine is typically used for SAT.

- "COVVAR" – Create the HvMch using the InetSet named "CovVars" to prune the machine against. This machine is typically used for Symbolic Simulation.

- "CUTSET"– Create an HvMch using the InetSet names "CovVars" as the machine outputs, and an InetSet determined by hvcic_compute_inet_cut_set as the inputs to the machine. A cover (HvCic) is created using hvcic_create_cover_from_inet_set using the same cutset InetSet. This machine and cover are typically used for the Image Computation engine.

- "MEM" – Create necessary HvMch's for optimal Symbolic Simulation of a design with embedded memories. A file specified by the memInfoFile knob is sourced in the child process and defines the design-specific memory arrays which will be optimized.

CTG detects that goals are done being loaded by receiving a HVGOL_ENGINE_WORKING message from the goal engine. Data is "DONE" and the goal engine must be in the "load_goalfile" state.

This procedure uses the TCL knobs: verbMode, goalFile, cicMaxLimit, cicBlkSize, and memInfoFile.

4.3.5.3. hv_do_lmbm_unreach Procedure

Thos procedure initiates unreachability analysis using LMBM-style fixed point computation. Note that the underlying design may be a partition over the whole machine (true LMBM) or simply a single block which is a subset of the whole machine (not true LMBM). Procedure prototype is:

```
hv_do_lmbm_unreach -init <initFile> -state <vecName>\
        -design <desName> -gfile <goalFile> \
        -gset <goalSet> -dir <wdPath> -log <logName>
```

This procedure opens a new Channel and runs the hv program in Slave mode. The new program is running in directory <wdPath>. A new Command Stack is attached to the Channel, and Dut, Goal, and Image Engines are started for the Channel. The new channel uses <logName> if specified. <goalSet> specifies the name of the GoalSet created by sourcing <goalFile> which is to be checked for unreachable goals. <vecName> is the name of a StateVector created by sourcing <initFile>; this StateVector contains the starting state for fixed point computation.

The following procedures are executed in order for the Channel; this is carried out by pushing the commands onto the Command Stack in reverse order. When each task subsequently finishes, the various message handlers pop the next command off the stack and execute it.

- hv_dut_setup – This procedure loads HNL and creates HvDsg in the Slave process.

- hv_load_goals – This procedure causes goals to be loaded into the Slave process.

- hv_start_lmbm – This procedure initiates the fixed point computation in the Slave process.

- hv_finish_lmbm_unreach – This procedure is called when the fixed point computation completes and uses the fixed point to determine which goals are provably unreachable.

- hv_update_goals – Causes unreachable goals to be communicated from the Slave process to the Master process. The Master subsequently communicates the info to other Slave engines which care.

The hv_dut_setup procedure is directly executed and this procedure returns without waiting for anything to finish. TCL knobs used by this procedure are: hvPath, goalFile (if –gfile not used), covVarsFile, workDir (if –dir not used), verbMode.

4.3.5.4. hv_start_lmbm Procedure

This procedure is called to initiate pseudo-LMBM style fixed point computation using symbolic state traversal techniques. This fixed point is subsequently used to prove unreachable goals. This procedure is called after the DUT and Goals have been properly setup in the Slave process. Procedure prototype is:

```
hv_start_lmbm -chnl <chnlId> -init <initFile> \
        -state <vecName>
```

<chnlId> is the Channel which has had DUT created and Goals loaded properly (as described by previous sections). <vecName> is the name of a StateVector created by sourcing <initFile>; this StateVector contains the starting state for fixed point computation.

Note that current usage does not really do LMBM type fixed point computation because the underlying machine is not partitioned into submachines. If the underlying machine and HvCic were partitioned, the state traversal would be true LMBM. This procedure issues the following commands to the Slave process without waiting for any of them to finish:

- hvflc_create_cover

- hvfml_create_lib

- hvfac_create_rpb_from_hbv_state – The starting state <vecName> is converted to an RPB for use by the Image Computation algorithms.

- hvfmm_compute_lmbm – This procedure actually computes the fixed point. The Image Engine is set to the state "run_lmbm". The resultant fixed point name is "lmbm_fpoint".

The completion of this procedure is detected by receiving a IMG_ENG_LMBM_DONE message from the Image computation engine. A command is popped from the stack when this message is received.

This procedure uses the TCL knobs: verbMode.

4.3.5.5. hv_finish_lmbm_unreach Procedure

This procedure is called after fixed point computation has finished.. The procedure prototype is:

```
hv_finish_lmbm_unreach -chnl <chnlId> \
        -lmbm <lmbmName> -gset <goalSet>
```

The Master process sends commands to the Slave of Channel <chnlId> to cause unreachability computation to occur for the goals in <goalSet> using the fixed point <lmbmName>.

The following commands are sent to the Slave process of <chnlId>:

- hvfac_print_rpb – This is RPB-specific information about the fixed point RPB named "lmbm_fpoint".

- hvfac_count_minterms_in_rpb – This command projects lmbm_fpoint onto the coverage variables contained in InetSet CovVars, then prints some statistics.

- hvgol_report_unreachable – This command makes the fixed point known to the appropriate GoalSet. The number of Reachable, Unreachable, and Unknown goals are printed in a message for consumption by the Master process.

At the completion of this procedure (more specifically, the resultant message from the hvgol_report_unreachable command), the Master process knows how many goals are unreachable, but not which ones. The hv_update_goals procedure describes how this task is completed.

The completion of this procedure is detected by receiving a HVGOL_CMD_POP message with data value "report_unreach". A command is popped from the stack when this message is received.

This procedure uses TCL knobs: verbMode.

4.3.5.6. hv_update_goals Procedure

This procedure is called after a Slave process has determined unreachable goal information. The goals of the Master process must be updated and this procedure initiates the update. Procedure prototype is:

```
hv_update_goals -chnl <chnlId> -gset <goalSet>
```

This procedure sends a hvgol_write_update_info command to the Slave process of Channel <chnlId>. The Goal Engine for that Channel is set to the "update_goal" state and the procedure returns.

The completion of the hvgol_write_update_info command is detected by receiving a HVGOL_GOALSET_WRITE_UPD message. When this message is received, the update file is sourced in the Master process so that goals in the Master are correct. A command is then popped from the command stack and executed.

This procedure uses TCL knobs: verbMode.

4.3.5.7. hv_vcs_initial_run Procedure

This procedure is called when VCS has finished invoking and running its first reset sequence. The procedure prototype is:

```
hv_vcs_initial_run -chnl <chnlId> -gfile <goalFile>
```

This procedure is given the VCS Channel via <chnlId>. <goalFile> is a sequence of calls to the PLI routines $createSignalSetHV, $addToSignalSetHV, and $defineFsmCoverHV which cause creation of goalsets which are compatible with the goalsets created in the formal engines.

The following commands are sent to VCS:

- source <goalFile> – This causes the necessary goals to be created in VCS

- If requested, pre-reached coverage states may be loaded into VCS by calling the $readCoverInfoHV PLI routine. These pre-reached goals are identified by use of the inputVcsRchStates TCL knob.

- The $configStopPointHV PLI routine is called to setup stop conditions for VCS.

- The hv_vcs_stopped command is pushed onto the Command Stack for the VCS Channel. The VCS Engine of the Channel is set to the "running" state.

- A run command is sent to VCS. This is the famous "." command.

The procedure then returns without waiting for completion of the run command. Completion of the initial run is detected by a receiving a VCS_STOP message when vcs is in the "initing" state. Completion of non initial runs is detected by a VCS_STOP message while in the "stop_pending" state.

This procedure uses TCL knobs: verbMode, goalFile, inputVcsRchStates, initCycles, initRunsCnt.

4.3.5.8. hv_vcs_stopped Procedure

This procedure is called when VCS has stopped after running biased random simulation. This procedure examines various pieces of information to determine what should be done next. Procedure prototype is:

```
hv_vcs_stopped -chnl <chnlId>
```

VCS has stopped running on <chnlId>. The following decision process takes place, depending on CTG analysis phase:

- MODE_INIT – This is the mode where CTG is reaching as many goals as reasonably possible from the reset state using VCS. If the number of VCS runs from the reset states is less than initRunsMax, or if formal reachability is inhibited (using inhibitFormalReach), then 1) tell VCS to perform a reset, 2) push hv_vcs_stopped onto the VCS command stack, 3) initiate a VCS run, 4) return.

If the number of initial random runs is greater than initRunsMax then a formal search is initiated from the reset state. CTG analysis phase is set to MODE_INIT_SAT (if satCycMax is > 0), else phase is set to MODE_INIT_SYM). Following this phase adjustment, the following steps are taken: 1) tell VCS to perform a reset then stop in the reset state, 2) push hv_run_formal onto the VCS command stack, 3) tell VCS to run, 4) tell VCS to write state to a file using $reportDutStateHV, 5) tell VCS to write newly-reached goals to file using $reportNewCoverDataHV, 6) return.

An additional decision process in this mode is to choose when unreachability analysis is initiated. Unreachability is launched and runs concurrently with reachability. Unreachability is launched from the same reset state as the first formal search, or earlier if unreachInitCnt is non-0. This knob requests that the unreachInitCnt-th reset state will be used to launch unreachability. If unreachability is launched, then the hv_do_lmbm_unreach procedure is called and VCS is told to write state into the file 'lmbmInit.tcl' using the $reportDutStateHV PLI routine. The VCS engine state is set to 'reach_lmbm_after_reset' in order for the message handler to track what is going on.

- MODE_INIT_SAT, MODE_INIT_SYM – This is the phase where CTG is reaching as many goals as possible using SAT/SymbolicSim from the reset state. VCS has stopped at some non-reset state and a formal search is to be setup and kicked off from the reset state. The following actions are taken: 1) tell VCS to perform a reset then stop in reset state, 2) push hv_run_formal onto the VCS command stack, 3) tell VCS to run, 4) tell VCS to write state to a file using $reportDutStateHV, 5) tell VCS to write newly-reached goals to file using $reportNewCoverDataHV, 6) return.

- MODE_SAT, MODE_SYMSIM_SAT, MODE_SYMSIM – In these phases, CTG is using formal searches from deep states reached using VCS. At this point, VCS has stopped at one of these deep states and this routine will either kick off a formal search, or reset VCS and try to reach more interesting deep states. The following actions are taken (in pseudo-code form):

```
If ((stopped due to cycleLimit) &&
    (cycleLimitMax <= cycleLimitStopCnt))
    push hv_vcs_stopped onto the vcs command stack
    tell VCS to reset
    tell VCS to run
else
    if (phase is MODE_SAT)
         push hv_run_formal -type SAT on VCS stack
    else if (phase is MODE_SYMSIM)
         push hv_run_formal -type SYM on VCS stack
    else
         if (last formal was SAT)
              push hv_run_formal -type SYM
         else
              push hv_run_formal -type SAT
         endif
    endif
    tell VCS to dump state ($reportDutStateHV)
    tell VCS to dump new goals ($reportNewCoverDataHV)
endif
```

- MODE_DONE – VCS has reached all requested goals, and CTG needs to update the goals in the Master process then halt cleanly. The following actions are taken: 1) push hv_run_formal onto the VCS command stack, 2) tell VCS to dump state using $reportDutStateHV, tell VCS to dump all recently reached goals using $reportNewCoverDataHV.

When the $reportNewCoverDataHV PLI routine is issued, completion is detected by receipt of a VCS_NEW_WRITTEN message from VCS. A command is popped from the stack in response to this message.

This procedure uses TCL knobs: verbMode, initRunsMax, inhibitFormalReach, updateFile, stateFile, resetConstFile, runConstFile, satCycMax, unreach, stateVector, goalFile, workDir, design, goalSetNames, cycleLimitMissMax.

4.3.5.9. hv_vcs_replay_done Procedure

This procedure is called when VCS has completed replaying a trace generated from a formal search engine. Procedure prototype is:

```
hv_vcs_replay_done -chnl <chnlId> -action <actType>
```

<actType> specifies which action the initiator of the replay thought might be appropriate; must be "RUN" or "BACK2BACK".

- RUN – VCS is to run for a period of time using biased random simulation. The hv_vcs_stopped procedure is pushed onto the VCS command stack, and VCS is then told to run.

- BACK2BACK – This action is to use "Back-to-Back" formal searches. In this case, random simulation is not allowed to run immediately after a formal search has succeeded in hitting a new goal. hv_run_formal is pushed onto the VCS command stack. VCS is told to 1) write its state to file by $reportDutStateHV, then 2) write recently reached goals to file by calling $reportNewCoverDataHV This procedure uses the TCL knobs: verbMode, updateFile, stateFile, resetConstFile.

4.3.5.10. hv_start_symsim_mgr Procedure

This procedure is called to setup the Symbolic Simulation manager prior to performing any searches using that engine. This procedure is called once at the beginning of a session, after goal and dut engines are properly set up, Ord, Sth, and Mch are already built, etc. Typically called from hv_setup_formal. Prototype is:

```
hv_start_symsim_mgr -chnl <chnlId>
```

<chnlId> is the channel that should have a Symbolic Simulation manager built. The hvprm_sim_manager create command is called in the child process. It is expected that hvmch_$design, hvflc_$design, and hvord_$design are valid Mch, Flc, and Ord objects, respectively.

Completion of this sequence is detected by receipt of HVSYM_MGR_SETUP message. A command is popped from the command stack in response to this message.

4.3.5.11. hv_run_formal Procedure

This procedure is called to initiate a formal search on a properly opened and set up Channel. Function prototype is:

```
hv_run_formal -chnl <chnlId> -sfile <startFile> \
        -update <updateFile> -const <constFile>
        -type <rchType>
```

<rchType> must be "SAT" or "SYMSIM", depending on which engine should be used for the formal search. <startFile> is a TCL file to be sourced in the Slave process to create a StateVector; this StateVector defines the starting state for the search engine. <updateFile> is a TCL file to be sourced in the Slave and Master processes to update the GoalMgr with states reached by VCS since the last <updateFile> was generated. <constFile> is a TCL file to be sourced in the Slave process to cause the search engine to see certain primary inputs as of a constant value. Note: This <constFile> is expected to be obsoleted when HNL-based environmental modeling can specify the same data.

Actions carried out in this procedure are:

1. Issue commands to all Slave processes running symsim or sat engines to "source <updateFile>". This causes all processes to have full knowledge of what goals have been reached by VCS.

2. Push hv_formal_stopped onto the Command Stack of the channel to perform the formal search.

3. If we are initiating back-to-back searches, adjust resource limits accordingly. If <rchType> is "SAT, iteration limit is set to satB2BCycMax or satCycMax. If <rchType> is "SYMSIM", iteration limit is set to symsimB2BCycMax or symsimCycMax.

4. If <rchType> is SYMSIM, source <constFile> in the child process, then source $SYNOPSYS/auxx/ctg/tcl/runPrm.tcl in the Slave. If <rchType> is SAT, then call the hvcnf_sat command in the child process.

5. The procedure then returns.

Completion of the formal search is detected by receipt of either HVSYM_SIM_DONE or HVSAT_REACH_DONE messages. A command is popped from the command stack in response to either of these messages.

This procedure uses the following TCL knobs: symsimCpuMax, symsimCycMax, symsimB2BCycMax, satCpuMax, satCycMax, satB2BCycMax, goalSetNames,

4.3.5.12. hv_formal_stopped Procedure

This procedure is called when a formal search engine has terminated a search. The search may have terminated after finding one or more goals, or it may have terminated after exceeding some user-provided resource limits. Procedure prototype is:

```
hv_formal_stopped -chnl <chnlId> -type <rchType>
```

<rchType> is either "SAT" or "SYMSIM" and is the type of search engine which was initiated on the Channel of <chnlId>.

Note that when the search engine completed, it reported how many goals were found; this data recorded in either satHandler.tcl or symsimHandler.tcl.

The decision process of this routine is outlined by the following pseudo-code.

```
If (phase is MODE_INIT_SYM)
    If (search found 0 goals)
        If (satCycMax>0)
            Set phase to MODE_SAT
        Else
            Set phase to MODE_SYMSIM
        Endif
        Set non-init-phase VCS stop conditions \
            & freshness using $configStopPointHV
        push hv_vcs_stopped on VCS cmd stack
        set VCS engine state to "running"
        tell VCS to run
    Else
        Push hv_vcs_replay_done on VCS cmd stack
        Tell VCS to bias weights
```

```
                    Tell VCS to replay a trace
                    Set VCS engine state to "running"
                    Tell VCS to run (do the replay)
            Endif
    Elseif (phase is MODE_INIT_SAT)
            If (search found 0 goals)
                    If (symsimCycMax>0)
                            set phase MODE_INIT_SYM
                    Else
                            set phase MODE_SAT
                    Endif
                    If (phase is MODE_INIT_SYM)
                            Call hv_run_formal
                    Else
                    Set non-init-phase VCS stop conditions \
                            & freshness using $configStopPointHV
                    push hv_vcs_stopped on VCS cmd stack
                    set VCS engine state to "running"
                    tell VCS to run
            Else
                    Push hv_vcs_replay_done on VCS cmd stack
                    Tell VCS to bias weights
                    Tell VCS to replay a trace
                    Set VCS engine state to "running"
                    Tell VCS to run (do the replay)
            Endif
    Elseif (phase is MODE_SAT, MODE_SYMSIM_SAT, MODE_SYMSIM)
            If (search found 0 goals)
                    If (phase is MODE_SAT)
                            If (symsimCycMax>0)
                                    set phase MODE_SYMSIM_SAT
                            Endif
                    Elseif (phase is MODE_SYMSIM_SAT)
                            If (lastFormalEng was SAT)
                                    Set phase to MODE_SYMSIM
                    Endif
                    If (#consecMisses > formalMissThresh)
                            Push hv_vcs_stopped on VCS stack
                            Set #consecMisses to 0
                            Tell VCS to reset
                    Elseif (lastFormalEng was SYMSIM)
                            Push hv_vcs_replay_done on VCS stack
                            Tell VCS not to bias weights
                            Tell VCS to replay a trace
                    Else
                            Push hv_vcs_stopped on VCS stack
                    Endif
            Else
                    If (#consecHits > formalClearThresh)
                            Tell VCS to clear bias weights
                    Endif
                    If (back2back enabled)
                            Push hv_vcs_replay_done on VCS stack \
                                    (with BACK2BACK action)
                    Else
                            Push hv_vcs_replay_done on VCS stack \
```

```
                         (with RUN action)
            Endif
            Tell VCS to bias weights
            Tell VCS to replay
        Endif
        Set VCS engine state to "running"
        Tell VCS to run
Endif
```

This procedure uses the following TCL knobs: verbMode, satCycMax, symsimCycMax, freshStartFrac, freshSampFrac, rsimCycles, freshSuppress, updateFile, stateFile, resetConstFile, formalMissThresh, formalClearThresh, backToBackEnabled.

4.3.5.13. hv_update_cover_metric Procedure

This procedure computes the actual cover metric used to determine progress made in the overall coverage session. This is a function of all goals/goalsets currently defined. Sets the covMetric TCL variable. Procedure prototype is:

```
hv_update_cover_metric
```

This procedure takes no arguments.

4.3.6. TCL Knobs and Variables

The CTG control mechanisms, heuristics, and decision algorithms are largely implemented in TCL code running in the Master process. This TCL code allows for many user-specifiable configuration settings; these are called TCL "knobs". This control TCL code also needs to keep track of session progress and status; this makes use of TCL "variables" which change as the session progresses.

The TCL language is limited in variable scope and data types. Variables are visible either globally or local to a single procedure. Global variables used in a procedure must be declared in that procedure as 'global' before use in the procedure. TCL variables must be of type string or array; array variables are indexed by strings and are one-dimensional.

All TCL knobs and variables are organized as elements of a single global array variable named "ctgInfo". The previously mentioned knob "satCycMax", for example, is actually referenced as "ctgInfo(satCycMax)". When a TCL knob or global variable is added to the ctgInfo array, a documentation entry is also entered in a corresponding array "ctgInfoDoc". The documentation line for ctgInfo(satCycMax) is thus contained in ctgInfoDoc(satCycMax) and its value is: "Maximum SAT cycles allowed per search". A TCL procedure hv_print_ctg_knobs is provided to print knob values and documentation; this procedure was described earlier.

This remainder of this section documents knobs and variables in use at the time of writing this document.

4.3.6.1. TCL Knobs

The following knobs are used to configure the CTG TCL control code. In each case, the knob name is provided without the "ctgInfo()" for clarity. Knob default values are also provided, where relevant.

- workDir "." - Directory that child process are started in, by default.

- stateFile "stateFile.tcl" - Name of temporary file VCS uses to write current design state into. When sourced, a StateVector is created then each state element is set to the current value (0/1) in the VCS simulation session.

- stateVector "StateVec" - Name of State Vector that updateFile.tcl saves state in when it is sourced

- updateFile "updateFile.tcl" - Name of temporary file VCS uses to store reached states in when this info is shared with other processes. When sourced, all goals and goalsets are updated with goals which have been reached since the last time VCS was asked to report newly reached states.

- runConstFile "<no_consts>" - Name of file which can be sourced to set certain signals to constant values suring symbolic simulation. This file consists of a series of hvprm_input_set_to_constant commands

- resetConstFile "<no_consts>" - Set certain signals to constant values for Symbolic Simulation from the reset state. Similar to runConstFile, except used only when simulating from reset state.

- goalFile "goalFile" - Basename of files used to create goals in hv and VCS child processes. It is expected that <goalFile>.vlog can be sourced in VCS, and <goalFile>.tcl can be sourced in hv.

- goalSetNames "<no_goalsets>" - Space-delimited list of GoalSet names which are created by sourcing the above <goalFile>.

- goalNames "<no_goals>" - Space-delimited list of Goal names which are created by sourcing the above <goalFile>.

- covVarsFile "covVars.tcl" - Name of file to source in hv which creates an InetSet named 'CovVars'. This InetSet contains all coverage variables used in all goals and goalsets analyzed in this session.

- unreach "UNREACH_NONE" - Knob which specifies style of unreachability analysis to perform. Valid values are:

- UNREACH_NONE: No unreachability used

- UNREACH_LMBM: Use lmbm-type fixed point computation

- unreachInitCnt 3 - Specify which reset state should be used to initiate unreachability from. In practice, not all verilog registers in a design are set to a specific value by the reset sequence. Thus, sometimes X logic values may take many simulation cycles and/or resets to flush from the system. In these cases, the first reset state generated may not be a good start-point for unreachability analysis. This knob specifies that the i-th reset state should be used for unreachability computations. Unreachability will start no later than when the first formal search is initiated. I.E. when MODE_INIT is exited.

- inhibitFormalReach 0 - If this knob is non-0, then formal search mechanisms are not used. CTG stays in MODE_INIT forever.

- verbMode 1 - Specifies verbosity mode to use in TCL control code running in the Master process. Set to one of:

- ctgInfo(verbUSER): Not much verbosity

- ctgInfo(verbAPPLICATION): a little more

- ctgInfo(verbDEVELOPMENT): still more

- ctgInfoDoc(verbPANIC): so much we get lost

- freshMode "START_FRESH_OFF" - This knob specifies when freshness detection should start to be used. Valid values are:

- START_FRESH_OFF: dont use freshness.

- START_FRESH_DYNAMIC: use freshness after the first miss

- START_FRESH_ALWAYS: freshness on from the very start

- freshSuppress 3000 - Number of cycles to suppress freshness detection at the beginning of a random simulation run

- freshSampFrac 1000 - Sample fraction, in 1/1000 percent units, to use for freshness detection. If a given state has been seen less than this percentage, then that state is said to be "fresh".

- freshStartFrac 10000 - Start fraction used for freshness detection. When VCS is asked to save current state to a file, this is taken to be a start point for a formal search. If a given state has been used as start point less than this percentage of all times a start has been initiated, then the state is said to be fresh.

- cicBlkSize 50 - The size of blocks to use for HvCic object used for unreachability analysis.

- cicMaxLimit 3000 - The maximum number of latches to use in the HvCic object used for unreachability analysis.

- rsimCycles 10000 - The number of clock cycles VCS will perform random simulation before stopping for direction. VCS runs this many clock cycles past the time the last new state (i.e. goal) was reached. The TCL control code in the Master process then determines if the current state should be used for formal search, if a reset should occur, etc.

- initCycles 2000 - The number of clock cycles of random simulation to perform after a reset sequence. VCS will run this many cycles past the last new state (i.e. goal) seen

- initRunsMax 2 - How many sequences of Reset+RandomSim will be performed before CTG exits MODE_INIT

- dynamicBiasCycles 1000 - How many cycles of dynamically biased random simulation will be run after a successful formal search to hit a new goal. After this many cycles, user-biased random simulation will be used.

- satCpuMax 600 - Maximum number of CPU seconds which is allowed for a formal search using SAT.

- satCycMax 50 - Maximum number of simulation steps (i.e. clocks) which are allowed for a SAT formal seach

- satB2BCycMax 10 - Maximum number of simulation steps allowed for a SAT search when used as the second search in a BackToBack search. Generally this number is less than satCycMax.

- symsimCpuMax 600 - Maximum number of CPU seconds which is allowed for a formal search using Symbolic Simulation.

- symsimCycMax 50 - Maximum number of simulation steps (i.e. clocks) which are allowed for a Symbolic Simulation formal seach

- symsimB2BCycMax 25 - Maximum number of simulation steps allowed for a Symbolic Simulation search when used as the second search in a BackToBack search. Generally this number is less than symsimCycMax.

- formalReplayFile "prm_sequence" - Name of temporary file used by formal search engines to save replay traces in. This file is then read by VCS to replay the trace

- cycleLimitMissMax 2 - This knob specifies how many times a formal search may be initiated from a non-fresh state when a miss occurs. The idea is that often a search from non-fresh state has no hope of succeeding. Note that these seaches occur when rsimCycles of simulation have occurred in VCS since that last goal was hit.

- backToBackEnabled "OFF" - This knob specifies if BackToBack should be enabled or not. Values of OFF and ON are allowed. BackToBack causes a formal search to be performed immediately after a formal search has succeeded in hitting a new goal. The default behavior is to perform dynamically biased random simulation from these points.

- formalMissThresh 2 - Number of consecutive formal searches which may fail before VCS is instructed to perform a reset.

- formalClearThresh 3 - Number of consecutive formal searches which may succeed before dynamic biasing weights are cleared in VCS.

- vcsTestFile "<no_testfile>" - Name of file which the generated test is to be saved in. This test may be used later as a stand-alone regression test in VCS. Two files are saved:

- <testFile>.ctg contains the control program to reproduce the input stimulus.

- <testFile>.vgol specifies the goals and goalsets used for the test.

- inputVcsRchStates "<no_inputfile>" - This file specifies goals which are considered to have been previously reached. These goals are classified as "reached" at the beginning of the CTG session, and no attempt is made to generate a trace to these goals.

- outputVcsRchStates "" - This file specifies a file to record goals which are reached during this analysis session. This file format is suitable as input to later CTG sessions.

4.3.6.2. Variable Usage

This section lists glaobal variables used by multiple TCL procedures in the TCL control code running in the Master process.

- ctgMode - This variable contains which phase CTG is currently in. One of MODE_INIT, MODE_INIT_SAT, MODE_INIT_SYM, MODE_SAT, MODE_SYMSIM_SAT, MODE_SYMSIM, or MODE_DONE

- unreachStarted - Variable that says unreachability has been started (if non-0)

- initRunsCnt - Number of MODE_INIT simulation runs which have been performed from the reset state.

- covMetric - This variable is the number of goals left to be classified

- formalMissCnt - Number of consecutive formal search misses seen.

- formalHitCnt - Number of consecutive formal search hits seen.

- formalTraceCnt - How many goals the last formal search found

- lastReachType - Which type formal search engine was used last

- back2BackInProcess - A BackToBack search is in progress

- lastVcsStopReason "<no_reason>" - Reason that the lst VCS simulation stopped. One of VCS_STOP_UNKNOWN, VCS_STOP_DONE, VCS_STOP_CYCLE_LIMIT, VCS_STOP_FRESH, VCS_STOP_END_REPLAY

- cycleLimitMissCnt - How many formal search misses have when seen when at cycle limit stop point.

- hvPath "/vobs/propver/src/hv/bin-gccsparcOS5/hv-g" - Pathname to where hv executable lives

4.3.6.3. ctgVcsCoverObjs Variable

When a coverage object is created in VCS(e.g. creating a GoalSet by using the $defineFsmCoverHV PLI routine), it is given a unique "handle". This handle is then used as input to other PLI routines during the CTG session. The same coverage object is known by name in the Master process and other hv Slave process. The ctgVcsCoverObjs variable is an array that maps a coverage object name (e.g. the GoalSet name) to its corresponding handle in the VCS process. For example: ctgVcsCoverObjs(GoalSet1) = 1.

4.3.6.4. ctgVcsCoverStatus Variable

The ctgVcsCoverStatus variable is an array which records current classification counts for the goals which correspond to a coverage object in VCS. Index into the array is the VCS handle of the object. Data value is a string of 3 space-delimited numbers: ctgVcsCoverStatus(1) = "#unknown #unreachable #reached".

5. Goal Creation and Usage

The creation, maintenance, and use of goals is central to the CTG methodology. Goals are, after all, what are being "covered", "reached", "proven", "classified", etc. The hv program provides a number of goal-related TCL commands which are documented in this section. In addition, the PLI code linked into VCS provides certain goal-related capabilities which are discussed.

5.1. Introduction

In general, each of the Slave processes in use in the CTG system will need some or all of the goal information collected by the other Slave processes. The TCL control code running in the Master process is responsible for updating the necessary goal information in a Slave process before asking for an analysis by that Slave.

Note that in many cases a Slave does not need all accumulated goal information before carrying out its portion of the CTG session. For example, unreachability analysis performed by LMBM fixed point computation has no need to know that some goals have already been reached.

At all times, the Master process is the central keeper of the union of all goal results determined by all child processes. The Master process TCL code is responsible for propagating all generated results from Slaves to the Master, and from the Master to Slaves that need the information.

5.2. HvGol Package TCL Commands

The HvGol package provides the following TCL commands which are used to manage goal information within the CTG system. Note that not all hvgol_* commands are used currently by CTG. Only those commands in use or otherwise of interest are mentioned here.

- hvgol_create_goal - This command creates a goal from a single signal or an HbvStateVector. The goal is given a name at creation time.

- hvgol_create_goalset - This command creates a goalset given an InetSet which contains the coverage variables of interest. Given N coverage signals which may take binary logic value B={0,1}, then 2N goals are implied by the GoalSet and have all logic values given as BN.

- hvgol_goalset_add_info – This command is used to incrementally specify reached/unreachable state information for an existing GoalSet. Unreachable states must be represented as either fixed point HvRpb or as a HvHbv StateVector. Reached states are specified as HvHbv StateVector .

- hvgol_goalset_relations - This command copies out some or all of the HvSth_Relation_t's which are used internally to represent the Unknown, Unreachable, and Reached goals of the GoalSet. The user provides the names used to create named HvMgr instances of type HvSth_Relation_t.

- hvgol_write_update_info – This command writes into a file the HvSth_Relation_t objects which represent the unknown, unreachable, and reached relations for a given GoalSet. This information is suitable for reading in using the hvgol_read_update_info command.

- hvgol_read_update_info - This command reads goalset information written by one hv session, and used in another. The provided reached, unreachable, and unknown Relations from one goalset are used to update the same GoalSet with new information.

- hvgol_report_goal  - This command reports various information about a Goal.

- hvgol_report_goalset - This command reports various information about a GoalSet

- hvgol_report_unreachable – This command reports reached/unreachable state information to a goal or goalset. This command is somewhat misnamed, as the semantics are that the caller is reporting to the Goal, rather than vice-versa. Unreachable states are in RPB fixed point form. Unreachable states are specified as an HvHbv StateVector.

5.3. HvPli Services For VCS Usage

Certain goal capabilities are implemented in the VCS Slave process using standard PLI capabilities. VCS is invoked in interactive mode so that these PLI routines may be "called" by the Master process. The PLI routines provided for goal creation/maintenance are the following:

5.3.1. createSignalSetHV PLI Routine
```
$createSignalSetHV("<setName>")
```

This PLI routine is used to define a SignalSet in the VCS process. A SignalSet is entirely analogous to an InetSet in one of the hv proceses. The "setName" argument is a string that is expected to correspond to a InetSet in the Master process.

5.3.2. addToSignalSetHV PLI Routine
```
$addToSignalSetHV("<setName>", <signal>, "<addMode>")
```

This PLI routine is used to add a Verilog signal to the named SignalSet. <signal> may be either a net or register in verilog. <addMode> is a string that is either PRE or POST to indicate the signal should be prepended or appended to the SignalSet. The order of the signal in the SignalSet is expected to be the same as the order of signals in the corresponding InetSet.

5.3.3. reportSignalSetHV PLI Routine
```
$reportSignalSetHV("<setName>","<fileName>","<fmt>")
```

This PLI routine writes a SignalSet given by <setName> out to <fileName> in a specified <format>. <format> is a string that is either "HV" or "PLI". These formats are suitable to be sourced in either hv or VCS programs to reconstruct the SignalSet.

5.3.4. defineFsmCoverHV PLI Routine

```
$defineFsmCoverHV("<objName>", "<signalSetName>",\
        <sysClk>, <offSet>, <fsmHandle>)
```

This PLI routine creates an Fsm type coverage object named <objName>. The goals are defined as all [1,0] combinations of the signals contained in <signalSetName>. If there are N signals in SignalSet, then 2**N individual goals are defined with this command. These signals are sampled relative to the positive edge of the clock signal <sysClk>. <offSet> specifies a non-negative offset by which the sample time can be adjusted so that the sample happens a short time after the positive edge of <sysClk>. This routine allocates a unique positive integer handle for the coverage object; this is returned as <fsmHandle>.

5.3.5. defineBitToggleCoverHV PLI Routine

```
$defineBitToggleCoverHV("<objName>", "<signalSetName>",\
        <sysClk>, <offSet>, <fsmHandle>)
```

This PLI routine creates a Toggle coverage object named <objName>. Signals given by the <signalSetName> are to be toggled to both 1 and 0; these are the goals. If there are N signals in SignalSet, then 2*N individual goals are defined with this command. These signals are sampled relative to the positive edge of the clock signal <sysClk>. <offSet> specifies a non-negative offset by which the sample time can be adjusted so that the sample happens a short time after the positive edge of <sysClk>. This routine allocates a unique positive integer handle for the coverage object; this is returned as <fsmHandle>.

5.3.6. getCoverMetricHV PLI Routine

```
$getCoverMetricHV(<covHandle>, <covNumber>)
```

This routine determines how many goals remain unclassified in the coverage object identified with <covHandle>. If <covHandle> is -1, then all currently-defined coverage objects are used and the returned <covNmuber> is the summation of all unclassified goals.

5.3.7. reportNewCoverDataHV PLI Routine

```
$reportNewCoverDataHV(<covHandle>, "<fileName>")
```

This PLI routine writes to <fileName> all goals which have been covered since the last call to this routine. <fileName> must be writeable, and will be overwritten by this routine. The output file is expected to be sourced by the hv program to update the corresponding GoalSets in the hv process. File contents are the following:

- create a StateVector with the same name as the GoalSet (hvhbv_new_vector -init DC ...)

- Set each care bit in the StateVector using hvhbv_set_vector_bit

- Update the GoalSet using hvgol_goalset_add_info to present the properly loaded StateVector as a new reached state for the GoalSet.

5.3.8. informUnreachCountHV PLI Routine

```
$informUnreachCountHV(<covHandle>, <#unreach>)
```

This PLI routine is used to inform the PLI code that a certain number of states of the given coverage object have been proven unreachable. The effect of this routine is to adjust the coverage metric for the coverage object given by the handle <covHandle>. Note that this command is additive for a given coverage object; this allows for unreachable goals to be proven throughout an analysis session by different unreachability algorithms.

5.3.9. printCoverInfoHV PLI Routine

```
$printCoverInfoHV(<covHandle>,"<fileName>","<fmt>")
```

This PLI routine writes out reached state coverage information out to the file named <fileName>; this file must be writeable and will be overwritten. If <covHandle> is –1, then all current coverage objects are written, else the one specified by the handle <covHandle>. <format> is a string and is one of "COMPACT", "COMPACT_REACH", or "HUMAN". "COMPACT" and "COMPACT_REACH" formats are intended to be readable using the $readCoverInfoHV PLI routine. "COMPACT" simply writes out the cover object name and coverage signals. COMPACT_REACH writes cover object name, coverage signals, and reached states. "HUMAN" writes information out in a human-readable form.

5.3.10. readCoverInfoHV PLI Routine

```
$readCoverInfoHV("<fileName>", <use_rch>)
```

This PLI routine reads coverage object definitions from the file given by <fileName>. <use_rch> is an integer; if non-0, then any reached states contained in <fileName> are taken to be previously-reached states and are immediately considered as reached. The next call to $reportNewCoverDataHV will report these states as reached.

5.4. Usage Scenarios

When goals are determined to either be unreachable or reached, this information must be communicated to other parts of CTG which need this information. This section describes these system-level interactions.

5.4.1. Unreachable State Computation

When unreachability analysis has been completed by one of the Slave processes, the unreachable state data must be reported to the Master process, and conveyed to the VCS process so that the coverage metric can be adjusted properly. The Slave process is told to write unreachable states to file using the hvgol_write_update_info. The Master process then uses the hvgol_read_update_info command to update its central copy of the GoalSet information. The number of unreachable states is reported to the VCS Slave by calling the $informUnreachCountHV PLI routine.

If a SAT solver is active, then the unreachable states are also read into that process.

5.4.2. Reached State Information

The CTG system does not consider a Goal to have been reached until VCS has generated an input sequence that actually reaches a state which covers the Goal. When a Goal has been reached, then this information must be conveyed to the Master process, as well as any Slave processes which can take advantage of this information.

This update process occurs each time VCS stops simulation and waits for input directive from the Master process. The following actions then occur:

- VCS is told to write out newly reached goals using the $reportNewCoverDataHV PLI routine.

- The Master process updates its copy of the GoalSet by sourcing the file of update information. As previously described, this file creates a vector of Don't-Care bits then sets all care bits to the appropriate value. This StateVector is then used with the hvgol_goalset_add_info command.

- All Slaves used for reachability analysis are also told to source the update file.

6. UI Interface

The User Interface of Figure 2 interacts with the core CTG system via the Master process. As previously described, commands are issued to the Master process via a unix pipe which feeds stdin of the Master process. All native hv commands, as well as the externally usable TCL control routines in hvRecipe.tcl, are available for UI needs. This interface allows the UI to be written in either Graphic or Textual modes without any changes, from the Master process perspective. Refer to some other UI-specific document for detailed issues about User-level interactions with CTG.

7. VCS Interface

As indicated earlier, the explicit state simulation engine integrated into CTG is based on VCS. CTG capabilities are linked into VCS directly via PLI techniques for direct simulation access, and using VERA mechanisms for testbench control, constraints, and biasing.

For detailed descriptions of VERA coding and compilation issues for use with CTG, refer to appropriate CTG VERA documentation. This section describes the specific control & interface mechanisms for CTG interactions with VERA code.

For more detailed VCS and PLI descriptions, refer to appropriate product literature. This section document CTG interfacing and control mechanisms present in the VCS Slave process.

7.1. PLI Interfacing – hvPli

As part of a product deliverable, CTG provides PLI routines embodied in a precompiled hvPli.a archive library which is linked to the VCS compiled simulator. A hvPli.tab interface file is provided so that these PLI routines can be called from the user PLI code, as well as interactively from the VCS interactive command line.

PLI routines used in the CTG product are the following. Note that Goal-specific PLI routines were described earlier in this document and are not repeated here.

7.1.1. startHV PLI Routine
```
$startHV(<rootInst>, "<mode>", "<regMapFile>",\
    "<inGoalFile>","<outGoalFile>")
```

This PLI routine is called at the very start of a CTG session to properly setup and initialize the CTG PLI mechanisms. This routine is called either by the Master process when creating a testcase, or by the CoverBooster program when replaying a previously-created testcase.

<rootInst> is a module in the verilog netlist which is being formally analyzed.

<mode> specifies whether a test is being created ("SLAVE_CREATE") or a previously-created test is being replayed ("FREE_REPLAY").

<regMapFile> is a file which specifies the HNL name of sequential elements in the formally-analyzed design. These names are decoded, together with <rootInst>, to identify registers in the verilog which comprise "state" of the Design Under Test. This information is especially relevant to the $reportDutStateHV PLI routine. Only registers which are relevant to the HNL model (i.e. those verilog registers "inferenced" as sequential elements by the synthesis process) are reported as DUT state for use as start point of formal searches. <regMapFile> is required for mode "SLAVE_CREATE" and is not required for "FREE_REPLAY".

<goalFile> specifies SignalSet and coverage objects. This file may be omitted, but no coverage can be measured until cover objects are defined. As discussed earlier, other PLI routines are provided to define coverage objects after this point.

<outGoalFile> is optional and is used to specify a file which reached goals will be saved in upon VCS termination. This format is suitable to be used as input <goalFile> or as input to the $readCoverInfoHV routine.

7.1.2. reportDutStateHV PLI Routine

```
$reportDutStateHV("<outFile>", "<Xmode>");
```

This routine writes the current state of the DUT out to file <outFile>. The file format is intended to be sourced by the hv program; a HvHbv StateVector named "StateVec" is created for the machine named "hvmch_$design". Each bit of StateVec is assigned the current logic value of the corresponding verilog register. Only registers indicated by the <mapFile> of $startHV are assigned values. The <Xmode> parameter is a string which indicates what logic value should be used for registers which currently have the logic X value. If <Xmode> is "DC", then those X-ed registers have Don't Care value; if <Xmode> is "CONST", then those X-ed registers will be assigned logic 0 value.

When a register is encountered in the X state, a message is printed (maximum of one message). A comment is written at the end of <outFile> which documents how many registers were in the X state.

7.1.3. informSearchResultsHV PLI Routine

```
$informSearchResultsHV(<#reached_goals>)
```

This PLI routine is used to tell the VCS-resident hv code that the previous search was either successful or not. This information is used to determine applicability of a particular state for use as a future search start point. For example, if a particular state was used as the start state for a formal search, and that search failed after 2 hours, then the state might not be a good point to stop and search from in the future.

The <#reachedGoals> is how many goals were reached by a formal search engine from the state last used by the last call to $reportDutStateHV.

7.1.4. configStopPointHV PLI Routine

```
$configStopPointH(<trigReg>, <covHandle>, \
    <samplePercent>, <startPercent>, <cycCnt>, <suppCnt>)
```

This PLI routine is used to tell the VCS-resident HV a simulatiton run should pause and allow control decisions to be considered by the Master process.

<trigReg> is a verilog wire which will be toggled when a "good" stop point has been reached. If <trigReg> is null, then the PLI routine tf_dostop() is called.

<covHandle> specifies the coverage object to which this stop configuration applies. If <covHandle> is −1, then this information applies to all current coverage objects.

<samplePercent> is an integer, in 1/1000 percent units, which specifies an upper bound for how often a state can be "visited" and still be considered "fresh". For example, if a coverage object has been sampled 1000 times and has been in a given state S 10 of those 1000 times, then S has been visited 10/1000 or 1% of the total sample times. If <samplePercent> is greater than 10, then S is considered fresh and may cause a simulation stop to occur. Note that "state" consists of only the coverage variables used by the coverage object; not all registers of the design.

<startPercent> is an integer, in 1/1000 percent units, which specifies an upper bound for how often a state may be used as a "start state" for formal searches. Each state at the time $reportDutStateHV is called is considered a "start state" for a formal search.

Note: it is acknowledged that this is not quite always true. However, in the current system, this is very nearly a true statement.

As an example, if a state S has been used for start state 3 times, and 30 formal searches have been performed, then <startPercent> must be greater than 100 (10%) in order for S to be considered "fresh". A special case happens if a previous search from state S resulted in no goal reached; in this case, S will never be used again as a stop point.

<cycCnt> specifies a maximum number samples which are allowed to pass until a stop is called. This limit is relative to the last goal reached in the coverage object, or relative to the last reset sequence being executed. If <cycCnt> is 0, then a stop will only occur for fresh states.

<suppCnt> is a freshness "suppress" count. Freshness detection is suppressed for this many samples after a new goal is reached.

Note that if either percent is 0, then that metric is turned off for freshness detection. If both percentages are non-0, then a trigger (i.e. stop) condition is the AND of both percentages.

7.2. Verilog TestBench Top Module

The verilog testbench top file is generated by the vera synthesis tool. This "top.v" file instantiates the verilog module being verified, as well as VERA constraint and biasing mechanisms. Refer to appropriate documentation for more details on this process. This section discusses control and interface aspects contain in the top module.

Verilog Control and Status Variables

As outlined earlier in this document, the TCL control code running in the Master process needs to tell the VCS Slave to do a number of things. For example, "execute a reset sequence", "replay a generated trace", "clear dynamically-biased weights", etc. The mechanisms used to convey these commands are to 1) call various CTG-supplied PLI routines, or 2) set various control flags in the verilog testbench top. These control flags are periodically checked by the VERA VCS code which controls the VCS Slave process. This VERA control code is called "CoverBooster" and is described in a later section of this document.

Flags are defined as verilog "reg"s, and are set to 1 or 0 interactively by using the native VCS command "set". For example, given a statement:

```
reg foo;
```

Then the following interactive VCS command will set foo to 1.

```
cli_1> set foo=1
```

Control flags which are used in the top module of the verilog testbench are the following:

- hvResetFlag – This flag is used to tell CoverBooster to apply the reset sequence at the next possible time. This calls the reset() task in the design_interface implemented in VERA code. This flag is initialized to 1 so that a reset is performed as the very first action.

- hvReplayTraceFlag – This flag tells CoverBooster to replay a replay trace generated by one of the formal search engines. The filename used to contain the trace is defined historically as "prm_sequence". This flag is initialized to 0.

- hvClearWeightsFlag - This flag tells CoverBooster to clear dynamically-biased input wieghts. This calls the reset_weight() task in the dynamic_interface implemented in VERA code. This flag is initialized to 0.

- hvStopFlag – This flag causes CoverBooster to call the VCS $stop() routine. This flag is initialized to 1, so that CoverBooster stops after applying the first reset sequence; the Master process then calls $startHV and the actual CTG session can be started.

- hvQuitFlag – This flag causes CoverBooster to exit the main command loop and write out a repeatable test file. VCS then executes the $stop command and waits for further input. The CTG test generation process may not be continued from this point. This flag is initialized to 0.

- hvBiasWeightsFlag – This flag causes CoverBooster to use information in the next replayed trace to modify primary input weighting information. This flag is initialized to 0.

Vera-Accessible PLI Tasks

The CoverBooster program needs access to many of the PLI routines and verilog flags maintained in the verilog testbench top file. The mechanisms VERA uses for this is via verilog "tasks" which are implemented in top and declared external for CoverBooster in an include file. This section describes those VERA-accesible tasks:

- The startHV task calls the $startHV PLI routine and is used by CoverBooster when replaying a previously-generated testcase in stand-alone mode. More detail on this mode is given in a later section of this document. This task prototype is the following:

```
task startHV;
    input rootInstStr;
    input modeStr;
    input mapStr;
    input inFile;
    input outFile;
    reg [799:0] rootInstStr;
    reg [799:0] modeStr;
    reg [799:0] mapStr;
    reg [799:0] inFile;
    reg [799:0] outFile;
```

- The readFlagsHV task is used to read all control flags in the top module. Task prototype is the following:

```
task readFlagsHV;
    output  resetFlag;
    output  replayTraceFlag;
    output  clearWeightsFlag;
    output  stopFlag;
    output  quitFlag;
    output  biasWeightsFlag;
```

- The following tasks clear the indicated flags and take no arguments.

```
task clearClearWeightsFlagHV;
task clearResetFlagHV;
task clearReplayTraceFlagHV;
task clearStopFlagHV;
task clearQuitFlagHV;
task clearBiasWeightsFlagHV;
```

- The following two tasks make direct calls to the VCS routines $stop and $finish, respectively.

```
task stopVcsHV;
task finishVcsHV;
```

- The getCoverMetricHV task calls the $getCoverMetricHV PLI routine. Task prototype is

```
task getCoverMetricHV;
    input   covHandle;
    output  coverValue;
    integer covHandle;
    integer coverValue;
```

- The printCoverInfoHV task calls the $printCoverInfoHV PLI routine. If useRchFlag is non-0, then "COMPACT_REACH" is used, else "COMPACT". A value –1 is used for the input coverage handle. Task prototype is:

```
task printCoverInfoHV;
    input fileNameStr;
    input useRchFlag;
    reg [799:0] fileNameStr;
```

- The readCoverInfoHV task calls the $readCoverInfoHV PLI routine. Task prototype is:

```
task readCoverInfoHV;
    input fileNameStr;
    input useRchFlag;
    reg [799:0] fileNameStr;
```

- The reportDutStateHV task calls the $reportDutStateHV PLI routine. Task prototype is:

```
task reportDutStateHV;
    input fileStr;
    input modeStr;
    reg [799:0] fileStr;
    reg [799:0] modeStr;
```

7.3. Vera Interfacing - CoverBooster

The CoverBooster program is written in VERA and is designed to interface the VCS Slave process with the rest of the CTG system, and to interact with the design-specific VERA code which biases and constrains the random simulation process. This section outlines the design-independent control flow of CoverBooster. User-specified biasing and constraints, compilation methodology, etc are beyond the scope of this document.

Two aspects of CoverBooster are described here: the top-level control flow, and stimulus/sampling top-level clocking strategy.

7.3.1. CoverBooster Clocking Strategy

Clocking strategy in the CoverBooster context deals with when inputs are applied and coverage measured with respect to the SystemClock used with VERA. This is a separate issue from "clocking strategy" for the Design Under Test itself. The DUT clocking strategy might deal with clock dividers, positive/negative registers, edge detectors, etc.

It is expected that part of environmental specification is to synthesize the DUT clock generator in terms of a single SystemClock that CoverBooster knows about.

Given a SystemClock with period T, Figure 4 illustrates when inputs are applied to the DUT and when coverage is sampled.

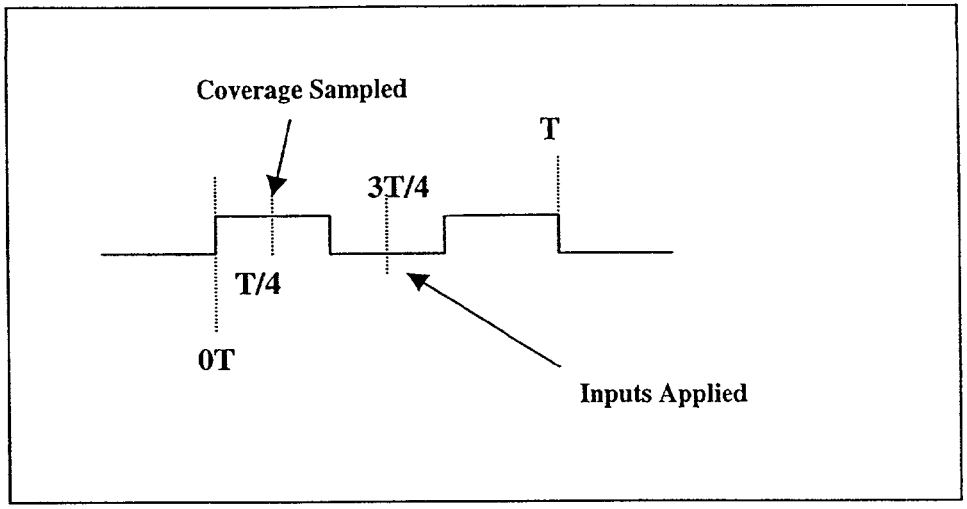

Figure 4. CoverBooster Clocking Strategy

As shown in Figure 4, all inputs are applied ¼ clock period before the positive clock edge. Coverage is measured ¼ cycle after the positive clock edge. Formal search engines are used ¼ cycle before the positive clock edge.

Note that sample points for individual coverage objects may be relative to different clocks in DUT (e.g. see the discussion for the $defineFsmCoverHV() PLI routine). Coverage is measured in CoverBooster to determine when all goals are reached, and to determine if a replayed trace was successful or not.

7.3.2. CoverBooster Control Flow

This section describes key control flow functions in the CoverBooster program.

7.3.2.1. Main CoverBooster Program

Top level control flow is illustrated by the following pseudocode.

```
Program Begin
      initialization and read plus args
      wait for first posedge clock
      wait for next negedge clock
      wait for ¼ more of the clock cycle
      if (testcase replay mode)
            testcaseReplay();
            $finish()
      Endif
      ForEver ()
            ReadControlFlags()
            If (resetFlag)
                  Call interface reset() task
                  ClearResetFlag()
            Elseif (biasWeightsFlag)
                  Remember biasing dynamic request
```

```
                ClearBiasWeightsFlag()
        Elseif (clearWeightsFlag)
                Call resetWeights() in dynamic interface
                ClearClearWeightsFlag()
        Elseif (replayTraceFlag)
                replaySequence()
                Report HIT/MISS to Master
                Setup for dynamic combinational biasing
                ClearReplayTraceFlag()
        Elseif (stopFlag)
                $stop()
                ClearStopFlag()
        Elseif (quitFlag)
                ClearQuitFlag()
                Break
        Else
                If (dynamic biasing)
                        DynamicBiasedDrive()
                Else
                        UserBiasedDrive()
                Endif
                Update coverage metric
                Increment clock counter
                Wait for negedge clock
                Wait for ¼ clock period
        Endif
        If (no goals left)
                Break
        Endif
    EndForEver
    If (generating test requested)
        Finish writing replay-able test
    Endif
    $stop()
Program End
```

7.3.2.2. replaySequence VERA Function

This function is called to replay a trace (sequence of inputs to apply over one or more clock cycles). This trace was generated by one of the formal search engines, and should result (usually) in a new goal being hit.

The file which contains the trace information contains all clocking and input assignment information. The replaySequence function simply reads the file and applies logic 1/0 to inputs and waits for clocks as instructed. File format is one token per line, and is the following:

- // - Comment lines begin with two forward slashes

- !begin! – This is the first token of the replay trace

- <portName> - This token is a primary input port to the Design Under Test.
  It is followed in the file by

- <logicValue> - This token is a '0' or '1' and is the logic value to drive on the port indicated by the previous token.

- !clock! – A clock token specifies that a single clock cycle is applied to the design. I.E. one clock period of simulation time advances.

- !end! – This token specifies the end of the replay trace.

If requested, dynamic biasing weights are accumulated as the input ports are driven; this information is used later for combinational dynamic biasing.

The following pseudocode illustrates control flow for this function:

```
Function Begin
      OldCover = getCoverageNumber()
      Open trace file
      Text = getNextLineFromFile();
      If (Text != "!begin!")
            Error
      Endif
      ForEver()
            Text = getNextLineFromFile();
            If (Text == "!end!")
                  If (biasingWeights)
                        accumulateWeights();
                  Endif
                  Wait for negedge clock
                  Wait for ¼ clock period
                  Break
            Endif
            If (Text == "!clock!")
                  If (biasingWeights)
                        accumulateWeights();
                  Endif
                  Wait for negedge clock
                  Wait for ¼ clock period
                  Continue
            Endif
            LogicValue = getNextLineFromFile();
            DriveDataOnPort(Text, LogicValue)
      EndForEver NewCover = getCoverageNumber()
      If (OldCover > NewCover)
            Report HIT
      Else
            Report MISS
      Endif
Function End
```

7.3.2.3. testcaseReplay VERA Function

This function is called when a complete testcase is to be replayed in stand-alone mode. The test file format is an extension of the trace file format. The test file format, in addition to the tokens described earlier for trace file, is the following:

- !test_begin! – This token indicates the begin of a testcase.

- !run! – a VCS run should be started. The next line in the file is:

- \<cycleCount\> - specifies the number of clock cycles that should be applied to the design.

- !reset! – a reset sequence is to be applied

- !bias_weights! – weights should be accumulated when the next trace is replayed.

- !replay! – a trace is to be replayed. This token is followed by the token sequence described earlier for trace replay file format.

- !clear! – dynamic bias weights should be cleared

- !test_end! – This token signifies the end of the testcase

Pseudocode for the testcaseReplay function is the following:

```
Function Begin
      Apply the first reset sequence
      ForEver()
            opCode = getNextLineFromFile();
            If (opCode == "!test_begin!")
                  ReadCoverInfo() // goal definitions
            ElseIf (opCode == "!reset!")
                  Call reset() function
            ElseIf (opCode == "!run!")
                  ClkCnt = getNextLineFromFile();
                  For (i=0;i<clkCnt;i++)
                        If (dynamic comb biasing)
                              Dynamic_biased_drive()
                        Else
                              Random_drive()
                        Endif
                        Wait for negedge clock
                        Wait for ¼ clock period
                  EndFor
            ElseIf (opCode == "!replay!")
                  ReplaySequence()
            ElseIf (opCode == "!clear!")
                  Reset_weights()
            ElseIf (opCode == "!bias_weights!")
                  Next replay biases weights
            ElseIf (opCode == "!test_end!")
                  break
            Else
                  Error
            EndIf
      EndForEver
Function End
```

7.4. Verilog Program Control – Usage Scenarios

There are at least three usage scenarios which the verilog-resident CTG code must support. Verilog "plus args" and PLI routines are used to communicate which mode analysis is intended.

Note: plus args are user-defined verilog invocation switches which are accessible from either PLI routines or from VERA code. Plus args which are defined for use by CTG are the following:

- +ctg_mode=<mode_str> - This plus arg is used to specify which mode VCS is being used for. Currently recognized values are "SLAVE_CREATE", "FREE_REPLAY", and "FREE_CREATE". These are described later in this section.

- +root_dut=<dut_module> - This plus arg specifies which module in verilog is the root for formal search methods.

- +ctg_testfile=<testfile> - In replay mode, this plus arg specifies a testcase file which contains control flow for replay of a previously-created testcase. In test generation mode, this file is written with the generated test.

- +ctg_ingoals=<input_goalfile> - This plus arg specifies an input file which defines coverage goals for the analysis session. This file optionally also contains goals which were covered in previous tests, and are therefore not considered in the current session.

- +ctg_outgoals=<output_goalfile> - This plus arg specifies a file to which reached goal information will be written upon process termination. This file format is suitable for use as <input_goalfile> in subsequent sessions.

The remainder of this section discusses key usage scenarios.

7.4.1. Testcase Creation

This is the classic CTG mode where formal search and explicit state simulation are interleaved to maximize coverage of user-defined goals. Assuming the previously-discussed hv_start_vcs_session TCL procedure is used, invocation of the compiled VCS simulator looks like the following:

```
vcs.exe -s -l vcs.log +ctg_testfile=TestOut \
   +ctg_mode=SLAVE_CREATE
```

This invocation may be slightly different depending on TCL knob settings, and argument used to the hv_start_vcs_session procedure.

The result of this command will be to write a testcase control file "TestOut.ctg", as well as reached goals file "TestOut.vgol" when VCS terminates.

7.4.2. Testcase Replay

Given a testcase created in a previous CTG session, that test may be replayed in stand-alone mode using the following simulator invocation.

```
vcs.exe -s -l vcs.log +ctg_testfile=<testfile> \
   +ctg_mode=FREE_REPLAY +root_dut=<dut_module>
```

Where <testfile> was the testcase filename used in testcase creation. <dut_module> is the verilog root module name for formal search engines during the creation session.

7.4.3. Leveraging User-Written Tests

A common usage for CTG is expected to be that of augmenting hand-written test coverage by use of CTG mechanisms. In this scenario, the hand-written test will cover some goals, and CTG will be used to classify those goals not reached by the hand-written tests. This section describes how this can happen To collect goals which are reached by the hand-written tests, the following actions are carried out:

1. The user, presumably with some UI help from CTG, defines which goals are of interest; these goals are written to a file in a format readable by the $startHV and $readCoverInfoHV PLI routine.

2. The customer links the CTG PLI library to their VCS simulation.

3. Upon invocation, the user must call the $startHV PLI routine to initiate a CTG collection session. This may either be done using the "–f" verilog switch, or by using VCS interactive mode. The <root_inst> parameter is required to be that which will later be formally searched. <mode> is "FREE_CREATE". <regMapFile> is "". <inGoalFile> is the goalfile created in step 1). <outGoalfile> is specified; <outGoalFile>.ctg and <outGoalFile>.vgol will be written as previously described.

4. If the user has previously reached goals from an earlier sesison, they may be removed from current consideration by calling the $readCoverInfoHV PLI routine.

When this session ends, <outGoalFile>.vgol will contain the goals which were reached in this session, and is suitable as input to a later CTG session.

Appendix 3

SMART SIMULATION USING COLLABORATIVE FORMAL AND SIMULATION ENGINES

----

Pei-Hsin Ho
Thomas Shiple
Kevin Harer
James Kukula
Robert Damiano
Valeria Bertacco
Jerry Taylor
Jiang Long Advanced Technology Group
Synopsys, Inc.

Smart Simulation
Using Collaborative Formal and Simulation Engines

*Pei-Hsin Ho, Thomas Shiple, Kevin Harer, James Kukula,
Robert Damiano, Valeria Bertacco, Jerry Taylor, Jiang Long*

{pho, shiple, kevinh, kukula, robertd, valeria, jerryt, long}@synopsys.com

Advanced Technology Group, Synopsys Inc.

Abstract

We present *Ketchum*, a tool that was developed to improve the productivity of simulation-based functional verification by providing two capabilities: (1) *automatic test generation* and (2) *unreachability analysis*. Given a set of "interesting" signals in the design under test (*DUT*), automatic test generation creates input stimuli that drive the DUT through as many different combinations (called *coverage states*) of these signals as possible to thoroughly exercise the DUT. Unreachability analysis identifies as many unreachable coverage states as possible.

Ketchum differs from the previous published results for several reasons. First, Ketchum provides 10x higher capacity than previous published results. The higher capacity is achieved by carefully orchestrating simulation and multiple formal methods including *symbolic simulation, SAT-based BMC, symbolic fixpoint computation* and *automatic abstraction*. Second, Ketchum performs not only automatic test generation but also unreachability analysis, which enables the test generation effort to be focused on coverage states that are not unreachable. Third, the backbone of Ketchum is an off-the-shelf commercial simulator. It enables Ketchum to reach deep states of the design quickly and supports simulation monitors through the standard API of the simulator during test generation.

We applied Ketchum to several industrial designs, including the picoJava microprocessor from SUN and the DW8051 microcontroller from Synopsys and obtained very promising results. The experiments show that Ketchum can (1) handle design blocks containing more than 4500 latches and 170K gates, (2) reach up to 6x more coverage states than random simulation and (3) identify a majority of the unreachable coverage states.

1. Introduction

*Functional verification* checks if the functionality of the hardware design meets the specification. A typical method for "bullet-proofing" the functionality of the design is random simulation [11]. Random simulation can leverage today's fast simulators and computer farms by using some sophisticated test harness. Verification engineers need to build a model of the environment in which the DUT operates. During random simulation, biased pseudo random generators drive the primary inputs of the environment model with random values and the environment model then drives the primary inputs of DUT with random but legal stimuli. The behavior of the DUT can be checked by simulation monitors during the simulation. We call the model that consists of the DUT and the environment model the *model under test (MUT)*.

To measure the quality of the verification effort, verification engineers apply *coverage metrics* to estimate how thoroughly the input stimuli have exercised the design. Coverage metrics directly based on the source code of the RTL design, such as line coverage, are too weak because they do not take the concurrency of hardware designs into consideration. Consider two finite state machines (FSMs) that control a buffer (see Figure 1).

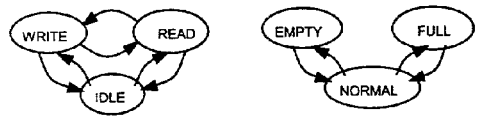

Figure 1. Two FSMs that control a buffer

The first FSM represents the operation that is being performed on the buffer, the second FSM the status of the buffer. It's possible to achieve 100% line coverage on the corresponding RTL description by exercising only 3 cross-states: idle/empty, write/normal, read/full. However, interesting corner cases such as read/empty (reading when the buffer is empty) and write/full (writing when the buffer is full) could be left unvisited.

*State coverage*, on the other hand, can distinguish different concurrent events. Given a set of interesting signals, which we call *coverage signals*, the state coverage measures how many different combinations of the values of the coverage signals have been reached during simulation. We call each combination a *coverage state*. For the above example, if we select the set of signals that encodes the states of the two FSMs as our coverage signals, 100% state coverage indicates that all nine cross states have been visited.

Coverage signals are usually selected from signals that constitute pipeline control, interacting FSMs, decoder outputs, status registers or other key control signals. By forcing the design into many different coverage states, the probability of detecting errors is increased. For the above example, a simulation monitor may detect that some valid data in the buffer is mistakenly over-written during a write to a full buffer. Therefore, verification engineers may want to construct input stimuli to maximize the state coverage; that is, to reach as many coverage states as possible. This task is known as *coverage-driven test generation*. Today it can be achieved by manually writing test sequences, or tweaking the biasing in random simulation. However, this approach is very expensive in terms of engineering resources.

Alternatively, formal methods like symbolic fixpoint computation and symbolic simulation can exhaustively search for an input sequence to hit a coverage state. Recently many formal and semi-formal (mixture of formal and simulation techniques) methods [1][7] have been proposed for this application. However, existing results in the literature suffer from a serious capacity limit, as they were only demonstrated on design blocks with less than 500 latches.

Our contribution is the development of a practical solution, Ketchum, to automate the test generation process for verifying real-world designs. Given (1) a synthesizable MUT and (2) a set of less than 64 coverage signals, Ketchum automatically (1) generates test sequences to reach as many coverage states as possible and (2) identifies as many unreachable coverage states as possible. The generated high-coverage tests can be replayed during regression tests. Simulation monitors written in arbitrary languages communicating to the standard API of the commercial simulator can be used during test generation for catching bugs.

The target capacity of Ketchum is to handle synthesizable MUT in the range of 100K gates and 5K latches. This range encompasses design blocks of integral functionality and many IP blocks, to which random simulation may be applied today.

Ketchum's unreachability analysis employs *symbolic fixpoint computation* [12] and robust *automatic abstraction techniques* to prove many coverage states unreachable. Its automatic test generation utilizes a combination of simulation and formal methods like *symbolic simulation* [1][4] and *SAT-based bounded model checking* (SAT-based BMC)[2], to generate input sequences to achieve high state coverage.

More specifically, random simulation and formal methods are interleaved to perform a deep and wide exploration of the state space. Starting from a given initial state, random simulation quickly hits several new coverage states but will eventually stops reaching new coverage states so quickly. Then one of the formal methods is used in an exhaustive search for a new coverage state. This search is narrowed to just those states not yet proven unreachable. The process then repeats, leveraging the ability of simulation to search deep, and the ability of formal methods to search wide.

We applied Ketchum to several industrial designs, including the picoJava microprocessor from SUN and the DW8051 microcontroller from Synopsys and obtained very promising results. The experiments show that Ketchum can (1) handle design blocks containing more than 4500 latches and 170K gates, (2) reach up to 6x more coverage states than random simulation and (3) identify a majority of the unreachable coverage states.

The remainder of the paper proceeds as follows. Section 2 describes our method for generating input sequences to reach coverage states, and Section 3 our algorithm for proving coverage states unreachable. Section 4 presents the experimental results. Having defined the problem and explained our approach in detail, Section 5 describes related work, and finally Section 6 concludes the paper.

2. Test Generation

We present a test generation algorithm that combines (1) random simulation, (2) symbolic simulation and (3) SAT-based bounded model checking to generate stimuli to reach coverage states. We will first provide a brief overview of these three search techniques.

A *state* (resp. *coverage state*) of a design is a valuation of all signals (resp. *coverage signals*) of the design. Given a starting state, random simulation automatically generates a trace of the MUT from the starting state by driving the primary inputs of the MUT with random values. During the random simulation, we observe the values of the coverage signals. If the values of the coverage signals indicate that a new coverage state has been reached, we store the new coverage state and mark it as reached. The advantage of random simulation is that it is extremely fast and it can generate traces that reach very deep states in the state space. The disadvantage is that it only searches along a single trace at a time. We perform random simulation using a commercial simulator. Note that off-the-shelf simulators usually perform much better in generating a single very long trace than a lot of short traces where the simulator needs to be injected with the same starting state over and over again. We use random simulation as our long range search engine to reach deep states.

Symbolic simulation drives each primary input of the MUT with a new symbolic variable at each simulation step [4]. It computes the symbolic formula for each signal according to the logic in its fanin. Notice that the DUT will be driven by legal symbolic formulas because of the environment model in the MUT. The symbolic formulas are stored as Binary Decision Diagrams (BDDs) [3]. Given a starting state, the $i$-th step of symbolic simulation can reach any new coverage state that is $i$ steps away from the starting state. We store the unclassified coverage states as a BDD, called *unclassified* BDD. During symbolic simulation, we check if a new coverage state has been reached by substituting the coverage signals in the unclassified BDD with the symbolic formulas of the coverage signals. If the result of the operation is not the empty set, a new coverage state has been reached by symbolic simulation. In that case, we update the unclassified BDD and generate a trace to be used in simulation, as discussed later. Otherwise we continue performing additional steps of symbolic simulation until a new coverage state is reached or some memory or time limit is reached.

Table 1. Comparison of Search Engines

| Engine | Effective Search Range | Strength | Limitation |
|---|---|---|---|
| Random simulation | Long | Deep states | Single trace |
| Symbolic simulation | Medium | Designs with fewer inputs | Time, memory, length of trace |
| SAT-based BMC | Short | Short hit traces | Time, length of trace |

Two important observations about symbolic simulation can be noted. First, the number of symbolic variables that have been used during simulation has more impact on the complexity of symbolic simulation than the number of latches in the MUT. The number of symbolic variables used in the symbolic simulation is the number of primary inputs times the number of simulation steps. Second, when the size of the BDD that represents the simulation values gets unwieldy, we can easily under-approximate the symbolic simulation values by setting some symbolic variables to Boolean constants [1][6]. As a result of these two observations, we can efficiently perform symbolic simulation on designs with thousands of latches and hundreds of primary inputs for 10 to 50 steps. Because of our first observation, symbolic simulation generally is not adequate to generate traces to reach coverage states that are more than a few tens of steps away from the initial state. Thus, we use symbolic simulation for middle-range exhaustive (or semi-exhaustive with underapproximation) search.

SAT-based BMC was introduced in [2]. Given a particular starting state, we can use a SAT solver to search for a trace up to a certain length $i$ to reach a new coverage state. The targeted coverage states can be restricted to coverage states that are not yet reached or proven unreachable by the unreachability engine. Within a certain time limit, a *complete* SAT solver [14] will: (1) find a trace to reach a new coverage state, or (2) prove that no new coverage states can be reached by traces up to length $i$, or (3) return no conclusions. If the outcome is (2) or (3), we apply the SAT solver to search for traces of length $i+1$, until some memory or time limit is reached. For designs with thousands of latches and hundreds of inputs, SAT-based BMC usually requires a lot less memory and is a lot faster than symbolic simulation for finding traces of length less than 10. Consequently, we use SAT-based BMC as our short-range exhaustive search engine.

Figure 2. Test generation algorithm

Knowing the advantages and disadvantages of each search engine (summarized in Table 1), we orchestrate the search engines to hide the disadvantages and exploit the advantages of individual engines. We want to perform a deep and wide search by randomly simulating to a deep state and, starting from that state, a short or middle range wide (exhaustive) search using SAT-BMC or symbolic simulation.

Figure 2 illustrates the test generation algorithm. The rectangular box represents the entire state space of the MUT and the stars represent the coverage states in the state space. The algorithm starts off by playing an initialization sequence provided by the user to reach the initial state of the MUT (a). Then, we perform random simulation (the generated trace is represented as the zig-zag line) and quickly reach easy-to-reach coverage states.

After most of the easy-to-reach coverage states have been reached, the rate of reaching new coverage states falls below a heuristic threshold (b). At this moment, we kick off our SAT-based BMC with the current state of random simulation as the starting state. If SAT-based BMC does not reach a coverage state within the search range, we kick off symbolic simulation after that. The search space of an exhaustive search engine is represented as nested circles in Figure 2. When, the exhaustive search engine finds a new coverage state, it generates a sequence of input assignments that is then replayed by the simulator (represented by the gray arrows). If both exhaustive search engines run out of time or memory limits without finding a new coverage state, we will return control to the random simulator. In either case, we start random simulation again and repeat this process until a desirable coverage number is reached. The final output of Ketchum will be a single long trace that traverses all the reached states, which is stored in a separate file for use during regression testing of the MUT. Since all the traces returned by the formal engines are replayed through the simulator, the simulation monitors will function correctly just as in ordinary random simulation.

We noticed that after an exhaustive engine reaches a new coverage state, the subsequent random simulation run could often reach a bunch of new coverage states quickly. We suspect that the reason is that among the set of coverage signals, some coverage signals are relatively easy to transition from one value to another and some coverage signals are relatively hard to transition. As a result, after an exhaustive engine manages to reach a new combination of the hard-to-transition coverage signals, random simulation will bump into different combinations of the easy-to-transition coverage signals, which combined with the new combination of the hard-to-reach signals become new coverage states.

3. Unreachability

Proving coverage states unreachable is a major aspect of coverage-driven test generation. Knowing the number of unreachable coverage states provides a more accurate measure of the quality of a simulation test bench. Moreover, knowing specifically which states are unreachable allows the reachability engine of Ketchum to focus on a much smaller set of states.

The goal of the unreachability engine of Ketchum is to provide fast and robust results without necessarily trying to detect all of the unreachable states. Simply put, we sacrifice exactness in favor of capacity and robustness. To this end, we have designed a straightforward algorithm that is conservative: it can prove states unreachable, but cannot prove states reachable. The basic idea of the algorithm is one that has been employed by many others before: perform exact analysis on a pruned model of the MUT. However, we introduce novel techniques in the way we select the latches and the combinational logic to include in this pruned model.

Specifically, we first select a small set of latches that includes the coverage signals; the remaining latches are treated as primary inputs. Next, a novel cutting procedure is used to reduce the fanin of the chosen latches, to further simplify the analysis. Then, exact reachability analysis is performed on the pruned model using BDDs. The computed set of reachable states is projected onto the coverage signals. Coverage states in the complement of this projection are provably unreachable, since the pruned model is an abstraction of the original. In the following we detail the latch selection and logic cutting procedures of the algorithm.

The latch selection process starts with the coverage signals. We then add latches incrementally in a breadth-first search (BFS) of the latch dependency graph of the MUT until we reach a user-specified limit on the number of latches. If all the latches of the last BFS level visited cannot be included within the limit, then an arbitrary subset from that level is used.

After a subset of latches has been selected, we employ a cutting algorithm to reduce the number of variables in the support of the transition functions. Experience has shown that even if only 50 or so latches are being analyzed, if the transitive fanin of the latch subset depends on many hundreds of primary inputs and non-selected latches, then later BDD computations will be intractable.

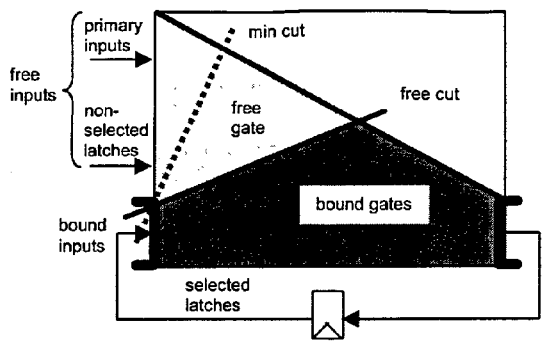

Figure 3. Definition of min-cut for cutting procedure

To explain the algorithm we define a few terms. Consider the transitive fanin of the selected latches (see Figure 3). The *bound inputs* are the outputs of the selected latches. The *free inputs* are the primary inputs and the outputs of the non-selected latches. A gate in the transitive fanin of the selected latches is *bound* if its transitive fanin contains a bound input, otherwise it is *free*. Now consider the free gates that directly feed bound gates; we call the collection of such signals the *free cut*. The signals on the free cut may be correlated, but they do not depend on the bound inputs. Hence, it would appear to be a good tradeoff to replace all the signals on the free cut with primary inputs, thus removing all the free gates from the BDD computations. But, we can do much better, for it is not the number of gates that we want to reduce, but the number of signals in the support of the transition functions.

To this end, we extract a directed network from the signal dependency graph (the graph whose set of nodes is the set of signals and set of directed edges is the fanin relation). The sources of this network are the free inputs, and the sinks are the signals on the free cut. We then compute a minimum cut of this network and replace the signals on the min-cut with primary inputs. The min-cut has the advantage of not only reducing the number of variables in the BDD computations, but also of maintaining more correlation relative to the free cut.

Experience shows that using the min-cut almost always produces the same set of unreachable coverage states as compared to no cutting at all. Furthermore, there are cases where the reachability fixed point computation only completes when using the min-cut. For instance, in the case of IU, one of the experimental results reported below, the cache miss signal originally had 1102 variables in its support, and reachability could not complete. The min-cut procedure reduces the support to 60 variables, and enables reachability to complete with a result that is superior to that of just leaving the cache miss signal out of the analysis entirely.

It is clear that the unreachability algorithm computes a lower bound on the number of unreachable coverage states of a MUT. In other words, every coverage state that was identified as unreachable is really unreachable, but an unreachable coverage state may be missed due to automatic abstraction.

4. Experimental Results

We implemented a prototype of Ketchum in C. We used a commercial Verilog simulator (VCS) as our random simulator and we developed in house all the other engines. Our symbolic simulator and unreachability engines rely on the CUDD package [18] for BDD computations. The SAT engine is an implementation of the GRASP algorithm [14].

We applied our prototype of Ketchum to some real-world designs. Table 2 summarizes the experimental results on the Integer Unit, Data Cache Unit and Stack Management Unit of the Sun picoJava microprocessor [16], the entire Synopsys DesignWare DW8051 microcontroller, and a commercial bus controller design "Bus". Each experiment was run on a Sun Solaris server of 4 processors and 4GB memory.

The first 3 columns show the characteristics of the five designs. The $2^{nd}$ column shows the number of latches in each design. The $3^{rd}$ column shows the number of coverage signals. Note that the number of coverage states is 2 to the number of coverage signals. In order to choose the coverage signals, we located the control FSMs in the source code of the designs. Then we chose the latches that encode these control FSMs as the coverage signals. For example, for the case of DCU, we identified the "cache-miss" FSM (6 latches), the "cache-fill" FSM (5 latches), the "write-back" FSM (8 latches) and the "zero-out" FSM (6 latches). Because all these FSMs are 1-hot encoded, there are at most 6x5x8x6=1440 reachable coverage states. Among those coverage states, Ketchum identified that only 111 are potentially reachable and it was actually able to generate tests that reach all of the 111 coverage states. Note that Ketchum was not told in advance about the FSM encoding.

The $4^{th}$ column shows the unreachability results: the number of coverage states that were NOT identified by Ketchum as unreachable (the number of potentially reachable coverage states) and the CPU time taken by the unreachability analysis. We can see that Ketchum can effectively identify the majority of the coverage states as unreachable. The number of latches that we include in the abstract model is 50 across all designs.

In the next 3 columns we compare two automatic test generation approaches, random simulation and Ketchum, in terms of the effectiveness of reaching coverage states. The 5th column shows the number of coverage states reached by random simulation and the time taken by random simulation (24 hours). The 6th column shows the corresponding results for Ketchum. The 7th column shows the percentage improvement in terms of the number of coverage states that Ketchum reached over random simulation. We can see that Ketchum uniformly outperforms random simulation by a large margin. The exception is the DCU unit of picoJava, on which random simulation reached almost as many coverage states as Ketchum but cost 700x more CPU time.

Table 2. Experimental Results

| DUT | Ltch | Cov sig. | Cov state aftr Kchm unreach | Reach cover states Rndm | Reach cover states Kchm | Imp (%) |
|---|---|---|---|---|---|---|
| IU | 4558 | 17 | 230 445sec | 9 24hr | 40 24hr | 344 |
| 8051 | 784 | 11 | 896 299sec | 317 24hr | 597 24hr | 88 |
| DCU | 385 | 25 | 111 259sec | 109 24hr | 111 2min | 2 |
| SMU | 217 | 16 | 132 1423sec | 104 24hr | 132 45min | 30 |
| Bus | 155 | 16 | 342 60sec | 44 24hr | 342 75min | 677 |

During the experiments, we provided minimum environment models for the designs. We set some exception signals (like the test signals that control the scan chain) to constants and assigned very small probabilities for asserting some reset signals during random simulation. The same setting and biasing were applied to both random simulation and Ketchum. So we believe that it is a fair comparison.

Since Ketchum needs to analyze the MUT that consists of both the DUT and the environment model for test generation, the size of the DUT that Ketchum can effectively handle decreases as the size of the environment model increases. In our experience, since the environment model only needs to model the interface behavior of the DUT, a reasonable environment model of the DUT is usually much simpler than the DUT itself, especially if the DUT is an integral functional block of the design.

5. Related Work

Unreachability Analysis

Symbolic fixpoint computation [12] is the common basis for unreachability analysis. Different methods that over-approximate the reachable state space have been proposed in [1][5][8][13]. However, these methods were designed for approximating reachable "states", not reachable "coverage states", so they do not utilize the fact that the logic that is closer to the coverage signals has more impact on the behavior of the coverage signals than the logic that is farther away. The algorithms presented in [15] perform unreachability analysis on the pruned model where all latches except the coverage signals of the original DUT are treated as primary inputs. However, this may leave too many primary inputs to perform symbolic fixpoint computation. In [9], a heuristic is introduced to reduce the number of primary inputs. Our algorithm, on the other hand, finds the optimal cut to minimize the number of primary inputs.

Test Generation

Algorithms that perform some form of over-approximated symbolic image computation to guide simulation for reaching coverage goals have been proposed in [1][8][17]. However, these solutions have been ineffective so far in attacking designs with thousands of latches, on which even the first image computation may not terminate. In [1] under-approximated symbolic simulation was introduced to mitigate BDD blowup. But according to our experimental results, the under-approximation technique presented in the paper is too drastic in the sense that it often misses coverage states.

Our test generation algorithm is similar to the SIVA system described in [7] in the sense that both methods interleave simulation and formal engines to reach coverage goals. However, the following are the major differences. First, SIVA uses ATPG and symbolic image computation while Ketchum uses symbolic simulation and SAT-based BMC. We believe that using symbolic image computation for test generation is not practical. On the simulation side, SIVA computes a search tree rather than a linear trace, which prevents it from taking advantage of the speed and the deep states offered by commercial simulators. In addition, with the commercial simulator, Ketchum can utilize arbitrary simulation checkers. In terms of coverage goals, SIVA was designed for maximizing toggle coverage rather than state coverage. But in practice, toggle coverage goals in the DUT are often relatively easy to reach, so the edge of SIVA over random simulation is slim. At last, it was reported that SIVA was only tested on examples with around 400 latches whereas we successfully applied Ketchum on real-world designs with 10x the number of latches.

6. Conclusion and Future Work

We have presented Ketchum, a tool that automates the problem of coverage-driven test generation. This novel technology combines multiple formal verification techniques and random simulation to classify most of the unreachable coverage states and reach up to 6x more coverage states than random simulation alone. At the same time, it can handle designs of more than 4500 latches, an order of magnitude more complex than published formal or semi-formal verification results.

Through the use of a robust abstraction algorithm, Ketchum is able to quickly prove most coverage states as unreachable. Central to this algorithm is a cutting procedure that reduces the variable support of the transition functions of the abstract model, enabling unreachability analysis to complete on big designs. On the reachability side, Ketchum employs a novel interleaving of simulation and formal verification techniques that exploits hard-to-reach coverage states. The combination of these approaches greatly improves the mobility of the search in the state space, thus leading to better coverage results.

There are multiple directions to extend and improve Ketchum. For coverage metrics, we want to extend Ketchum to handle transition coverage. For unreachability, foremost is an enhanced algorithm for selecting a subset of latches that takes more factors into account beyond BFS level, such as the number of fanins from, and fanouts to, the coverage signals. For test generation, we want to improve the underapproximation capabilities of the formal techniques, as well as integrate additional engines, such as sequential ATPG.

7. References

[1] J. Bergmann and M. Horowitz. Improving coverage analysis and test generation for large designs. In Proceedings of ICCAD, 1999.

[1] V. Bertacco, M. Damiani and S. Quer. Cycle-based symbolic simulation of gate-level synchronous circuits. In Proceedings of DAC, pp. 391-396, 1999.

[2] A. Biere, A. Cimatti, E. Clarke, M. Fujita and Y. Zhu. Symbolic model checking using SAT procedures. In Proceedings of DAC, 1999

[3] R.E. Bryant. Graph-based algorithms for boolean function manipulation. IEEE Transactions on Computers, C-35(8), pp 677-691, 1986.

[4] R.E. Bryant. Symbolic simulation--techniques and applications. In DAC, pp. 517-521, 1990.

[5] H. Cho, G. Hatchel, E. Macii, M. Poncino, and F. Somenzi. Automatic state space decomposition for approximate FSM traversal based on circuit analysis. IEEE TCAD, 15(12), pp. 1451-1464, 1996.

[6] D.L. Dill. Embedded tutorial: formal verification meets simulation. In Proceedings of ICCAD, 1999.

[7] M.K. Ganai, A. Aziz and A. Kuehlmann. Enhancing simulation with BDDs and ATPG. In Proceedings of DAC, pp. 385-390, 1999.

[8] S.G. Govindaraju, D.L. Dill, A.J. Hu, and M.A. Horowitz. Approximate reachability with BDDs using overlapping projections. In Proceedings of DAC, pp. 451-455, 1998.

[9] P.-H. Ho, A. Isles and T. Kam. Formal verification of pipeline control using controlled token nets and abstract interpretation. In ICCAD, 1998.

[10] R.C. Ho and M. Horowitz. Validation coverage analysis for complex digital designs. In ICCAD, 1996.

[11] M. Kantrowitz and L. Noack. I'm Done Simulating: Now what? verification coverage analysis and correctness checking of the DEC chip 21164 Alpha microprocessor. In DAC, pp. 325-330, 1996.

[12] K.L. McMillan. Symbolic model checking. Kluwer Academic Publishers, 1994.

[13] I.-H. Moon, J. Kukula, T. Shiple and F. Somenzi. Least fixpoint approximation for reachability analysis. In Proceedings of ICCAD, pp. 41-44, 1999.

[14] J.P. Marques-Silva and K.A. Sakallah. GRASP: a search algorithm for propositional satisfiability. In IEEE Transaction on Computers, pp. 506-521, May 1999.

[15] D. Moundanos, J.A. Abraham and Y.V. Hoskote. Abstraction techniques for validation coverage analysis and test generation. In IEEE Transactions on Computers, January 1998.

[16] Sun Microsystems. PicoJava technology. http://www.sun.com/microelectronics/communitys ource/picojava.

[17] C.H. Yang and D.L. Dill. Validation with guided search of the state space. In DAC, pp. 599-604, 1998.

[18] F. Somenzi. CUDD: CU Decision Diagram Package. ftp://vlsi.colorado.edu/pub/.

What is claimed is:

1. A method of verifying a design for a microcircuit, the method comprising:

beginning random simulation of a sequence of states of a microcircuit design by inputting a sequence of random input vectors to a random simulation model to obtain a sequence of random simulation states;

monitoring a simulation coverage progress metric to determine on a basis of said sequence of random simulation states a preference for beginning formal simulation of a sequence of states of said microcircuit design;

beginning formal simulation of a sequence of states of said microcircuit design by using formal simulation methods to simulate a sequence of formal simulation states in a formal simulation model of said microcircuit design;

monitoring a formal coverage progress metric to determine on a basis of said sequence of formal simulation states a preference for resuming random simulation of states of said microcircuit design;

resuming generation of random input vector sequences for said random simulation model of a microcircuit design and said simulating of a sequence of random simulation states of said microcircuit design caused by inputting said random input vector sequence to said random simulation model;

testing for whether a goal state has been reached; and recording an indication that a goal state has been reached, that can be used by a user, if a goal state has been found.

2. The method of claim 1, wherein said random simulation model and said formal simulation model are the same.

3. The method of claim 1, wherein said simulating a sequence of formal simulation states comprises the use of symbolic simulation.

4. The method of claim 1, wherein said simulating a sequence of formal simulation states comprises the use of satisfiability techniques.

5. The method of claim 1, wherein said simulating a sequence of formal simulation states comprises the use of symbolic simulation and satisfiability techniques.

6. The method of claim 1, wherein said beginning of formal simulation is initiated by simulating in said formal simulation model a state of said microcircuit design previously simulated by inputting at least a portion of said random input vector sequence to said random simulation model.

7. The method of claim 1, further comprising proving at least one of a set of previously-defined goal states of said microcircuit design unreachable.

8. The method of claim 1, wherein said process of monitoring said simulation coverage progress metric, beginning formal simulation, monitoring said formal coverage progress metric, and resuming said random simulation is continued until a previously-defined set of goal states of said microcircuit design are simulated or proved not reachable.

9. A method of verifying a design for a microcircuit, the method performed by a data processing system and comprising:

beginning random simulation of a sequence of states of a microcircuit design by inputting a sequence of random input vectors to a random simulation model to obtain a sequence of random simulation states;

monitoring a simulation coverage progress metric to determine on a basis of said sequence of random simulation states a preference for beginning formal simulation of a sequence of states of said microcircuit design;

beginning formal simulation of a sequence of states of said microcircuit design by using formal simulation methods to simulate a sequence of formal simulation states in a formal simulation model of said microcircuit design;

monitoring a formal coverage progress metric to determine on a basis of said sequence of formal simulation states a preference for resuming random simulation of states of said microcircuit design;

resuming generation of random input vector sequences for said random simulation model of a microcircuit design and said simulating of a sequence of random simulation states of said microcircuit design caused by inputting said random input vector sequence to said random simulation model;

testing for whether a goal state has been reached; and recording an indication that a goal state has been reached, that can be used by a user, if a coal state has been found.

10. The method of claim 9, wherein said random simulation model and said formal simulation model are the same.

11. The method of claim 9, wherein said simulating a sequence of formal simulation states comprises the use of symbolic simulation.

12. The method of claim 9, wherein said simulating a sequence of formal simulation states comprises the use of satisfiability techniques.

13. The method of claim 9, wherein said simulating a sequence of formal simulation states comprises the use of symbolic simulation and satisfiability techniques.

14. The method of claim 9, wherein said beginning of formal simulation is initiated by simulating in said formal simulation model a state of said microcircuit design previously simulated by inputting at least a portion of said random input vector sequence to said random simulation model.

15. The method of claim 9, further comprising proving at least one of a set of previously-defined goal states of said microcircuit design unreachable.

16. The method of claim 9, wherein said process of monitoring said simulation coverage progress metric, beginning formal simulation, monitoring said formal coverage progress metric, and resuming said random simulation is continued until a previously-defined set of goal states of said microcircuit design are simulated or proved not reachable.

17. A data processing system for verifying a design for a microcircuit, the system comprising:

a circuit configured for random simulation of a sequence of states of a microcircuit design by inputting a sequence of random input vectors to a random simulation model to obtain a sequence of random simulation states;

a circuit configured for monitoring a simulation coverage progress metric to determine on a basis of said sequence of random simulation states a preference for beginning formal simulation of a sequence of states of said microcircuit design;

a circuit configured for beginning formal simulation of a sequence of states of said microcircuit design by using formal simulation methods to simulate a sequence of formal simulation states in a formal simulation model of said microcircuit design;

a circuit configured for monitoring a formal coverage progress metric to determine on a basis of said sequence of formal simulation states a preference for resuming random simulation of states of said microcircuit design;

a circuit configured for resuming generation of random input vector sequences for said random simulation model of a microcircuit design and said simulating of a sequence of random simulation states of said microcircuit design caused by inputting said random input vector sequence to said random simulation model;

a circuit configured for testing for whether a goal state has been reached; and a circuit configured for recording an indication that a goal state has been reached, that can be used by a user, if a goal state has been found.

18. The system of claim 17, wherein said random simulation model and said formal simulation model are the same.

19. The system of claim 17, wherein said simulating a sequence of formal simulation states comprises the use of symbolic simulation.

20. The system of claim 17, wherein said simulating a sequence of formal simulation states comprises the use of satisfiability techniques.

21. The system of claim 17, wherein said simulating a sequence of formal simulation states comprises the use of symbolic simulation and satisfiability techniques.

22. The system of claim 17, wherein said beginning of formal simulation is initiated by simulating in said formal simulation model a state of said microcircuit design previously simulated by inputting at least a portion of said random input vector sequence to said random simulation model.

23. The system of claim 17, further comprising a circuit configured for proving at least one of a set of previously-defined goal states of said microcircuit design unreachable.

24. The system of claim 17, wherein said circuits are configured such that said process of monitoring said simulation coverage progress metric, beginning formal simulation, monitoring said formal coverage progress metric, and resuming said random simulation is continued until a previously-defined set of goal states of said microcircuit design are simulated or proved not reachable.

25. A computer program product comprising a computer usable medium having computer readable code embodied therein for verifying a design for a microcircuit, the computer program product comprising:

computer readable program code devices configured to cause a computer to effect random simulation of a sequence of states of a microcircuit design by inputting a sequence of random input vectors to a random simulation model to obtain a sequence of random simulation states;

computer readable program code devices configured to cause a computer to effect monitoring of a simulation coverage progress metric to determine on a basis of said sequence of random simulation states a preference for beginning formal simulation of a sequence of states of said microcircuit design;

computer readable program code devices configured to cause a computer to effect beginning formal simulation of a sequence of states of said microcircuit design by using formal simulation methods to simulate a sequence of formal simulation states in a formal simulation model of said microcircuit design;

computer readable program code devices configured to cause a computer to effect monitoring a formal coverage progress metric to determine on a basis of said sequence of formal simulation states a preference for resuming random simulation of states of said microcircuit design;

computer readable program code devices configured to cause a computer to effect resuming generation of random input vector sequences for said random simulation model of a microcircuit design and said simulating of a sequence of random simulation states of said microcircuit design caused by inputting said random input vector sequence to said random simulation model;

computer readable program code devices configured to cause a computer to effect testing for whether a goal state has been reached; and computer readable program code devices configured to cause a computer to effect recording an indication that a goal state has been reached, that can be used by a user, if a goal state has been found.

26. The product of claim 25, wherein said random simulation model and said formal simulation model are the same.

27. The product of claim 25, wherein said simulating a sequence of formal simulation states comprises the use of symbolic simulation.

28. The product of claim 25, wherein said simulating a sequence of formal simulation states comprises the use of satisfiability techniques.

29. The product of claim 25, wherein said simulating a sequence of formal simulation states comprises the use of symbolic simulation and satisfiability techniques.

30. The product of claim 25, wherein said beginning of formal simulation is initiated by simulating in said formal simulation model a state of said microcircuit design previously simulated by inputting at least a portion of said random input vector sequence to said random simulation model.

31. The product of claim 25, further comprising proving at least one of a set of previously-defined goal states of said microcircuit design unreachable.

32. The product of claim 25, wherein said process of monitoring said simulation coverage progress metric, beginning formal simulation, monitoring said formal coverage progress metric, and resuming said random simulation is continued until a previously-defined set of goal states of said microcircuit design are simulated or proved unreachable.

33. The method of claim 1, wherein:

said beginning of said formal simulation of a sequence of states is initiated from a start state;

said formal simulation of a sequence of states of said microcircuit design comprises simulating a state defined as a goal state; and resuming generation of random input vector sequences for said random simulation model of a microcircuit design and said simulating of a sequence of random simulation states of said microcircuit design comprises simulating in said random simulation model a sequence of states simulated in said formal simulation model, starting with said start state and comprising said goal state.

34. The method of claim 9, wherein:

said beginning of said formal simulation of a sequence of states is initiated from a start state;

said formal simulation of a sequence of states of said microcircuit design comprises simulating a state defined as a goal state; and resuming generation of random input vector sequences for said random simulation model of a microcircuit design and said simulating of a sequence of random simulation states of said microcircuit design comprises simulating in said random simulation model a sequence of states simulated in said formal simulation model, starting with said start state and comprising said goal state.

35. The system of claim 17, wherein:

said beginning of said formal simulation of a sequence of states is initiated from a start state;

said formal simulation of a sequence of states of said microcircuit design comprises simulating a state defined as a goal state; and resuming generation of random input vector sequences for said random simulation model of a microcircuit design and said simulating of a sequence of random simulation states of said microcircuit design comprises simulating in said random simulation model a sequence of states simulated in said formal simulation model, starting with said start state and comprising said goal state.

36. The product of claim 25, wherein:

said beginning of said formal simulation of a sequence of states is initiated from a start state;

said formal simulation of a sequence of states of said microcircuit design comprises simulating a state defined as a goal state; and resuming generation of random input vector sequences for said random simulation model of a microcircuit design and said simulating of a sequence of random simulation states of said microcircuit design comprises simulating in said random simulation model a sequence of states simulated in said formal simulation model, starting with said start state and comprising said goal state.

* * * * *

UNITED STATES PATENT AND TRADEMARK OFFICE
CERTIFICATE OF CORRECTION

| | | |
|---|---|---|
| PATENT NO. | : 7,130,783 B1 | Page 1 of 1 |
| APPLICATION NO. | : 09/760063 | |
| DATED | : October 31, 2006 | |
| INVENTOR(S) | : Kevin M. Harer | |

It is certified that error appears in the above-identified patent and that said Letters Patent is hereby corrected as shown below:

In claim 9 (at column 138, line 21), please delete the word, "coal" and replace with the word --goal--.

Signed and Sealed this

Fifteenth Day of May, 2007

JON W. DUDAS
*Director of the United States Patent and Trademark Office*